US012812934B2

(12) United States Patent
Yoo

(10) Patent No.: US 12,812,934 B2
(45) Date of Patent: Nov. 24, 2026

(54) SEMICONDUCTOR DEVICE AND METHOD FOR FABRICATING THE SAME

(71) Applicant: Samsung Electronics Co., Ltd., Suwon-si (KR)

(72) Inventor: Jong Ryeol Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 508 days.

(21) Appl. No.: 18/478,280

(22) Filed: Sep. 29, 2023

(65) Prior Publication Data

US 2024/0339498 A1 Oct. 10, 2024

(30) Foreign Application Priority Data

Apr. 5, 2023 (KR) ........................ 10-2023-0044642

(51) Int. Cl.

*H10D 62/10* (2025.01)
*H10D 30/43* (2025.01)
*H10D 30/67* (2025.01)
*H10D 64/66* (2025.01)
*H10D 84/85* (2025.01)

(52) U.S. Cl.

CPC ........... *H10D 62/121* (2025.01); *H10D 30/43* (2025.01); *H10D 30/6729* (2025.01); *H10D 30/6735* (2025.01); *H10D 30/6757* (2025.01); *H10D 64/668* (2025.01); *H10D 84/85* (2025.01)

(58) Field of Classification Search

CPC ............... H10D 30/43; H10D 30/6729; H10D 30/6735; H10D 62/121; H10D 64/668; H10D 84/85

See application file for complete search history.

(56) References Cited

U.S. PATENT DOCUMENTS

| | | | | |
|---|---|---|---|---|
| 7,504,336 B2 | 3/2009 | Purtell et al. | | |
| 2021/0098473 A1* | 4/2021 | Lin | ...................... | H10B 10/125 |

(Continued)

FOREIGN PATENT DOCUMENTS

| | | | |
|---|---|---|---|
| KR | 10-2020-0111997 A | 10/2020 | |

OTHER PUBLICATIONS

Korean Office Action for corresponding Korean Application No. 10-2023-0044642 dated Jun. 9, 2026.

*Primary Examiner* — Brigitte A Paterson

(74) *Attorney, Agent, or Firm* — Harness, Dickey & Pierce, P.L.C.

(57) ABSTRACT

A semiconductor device may include a first epitaxial pattern connected to first bridge patterns sequentially stacked on a first region and penetrating through a first gate structure, the first epitaxial layer on a side of the first gate structure and including a first conductivity type impurity, a first silicide pattern on the first epitaxial pattern and overlapping the first bridge patterns in the first direction, a second epitaxial pattern connected to second bridge patterns sequentially stacked on a second region and penetrating through a second gate structure, the second epitaxial layer on a side of the second gate structure and including a second conductivity type impurity different from the first conductivity type impurity, and a second silicide pattern on the second epitaxial pattern and overlapping the second bridge patterns in the third direction, wherein the first silicide pattern and the second silicide pattern have stress properties different from each other.

19 Claims, 37 Drawing Sheets

(56) References Cited

U.S. PATENT DOCUMENTS

| | | | | |
|---|---|---|---|---|
| 2021/0313452 | A1 | 10/2021 | Cheng et al. | |
| 2021/0376093 | A1 | 12/2021 | Chu et al. | |
| 2021/0384306 | A1 | 12/2021 | Xie et al. | |
| 2022/0181250 | A1 | 6/2022 | Yu et al. | |
| 2022/0310806 | A1 | 9/2022 | Yang | |
| 2022/0359208 | A1* | 11/2022 | Lin | H10D 64/0112 |
| 2023/0178621 | A1* | 6/2023 | Xie | H10D 64/256<br>257/288 |
| 2023/0290862 | A1* | 9/2023 | Hall | H10D 30/6757 |
| 2023/0402459 | A1* | 12/2023 | Jeong | H10D 62/121 |
| 2024/0145578 | A1* | 5/2024 | Vega | H10D 30/6735 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2023-0044642 filed on Apr. 5, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices and/or methods for fabricating the same. More specifically, the present disclosure relates to semiconductor devices including multi-bridge channels and/or methods for fabricating the same.

2. Description of the Related Art

As one of scaling technologies for increasing a density of an integrated circuit device, a multi-gate transistor, in which a silicon body having a fin or nanowire shape is formed on a substrate and a gate is formed on a surface of the silicon body, has been proposed.

Since such a multi-gate transistor utilizes a three-dimensional channel, scaling is easily performed. Further, even if a gate length of the multi-gate transistor is not increased, the current control capability may be improved. Furthermore, a short channel effect (SCE) in which potential of a channel region is influenced by a drain voltage may be effectively suppressed.

SUMMARY

Some example embodiments of the present disclosure provide semiconductor devices having improved performance.

Some example embodiments of the present disclosure provide methods for fabricating the semiconductor device capable for fabricating a semiconductor device having improved performance.

According to an example embodiment of the present disclosure, a semiconductor device includes a substrate including a first region and a second region, a plurality of first bridge patterns sequentially stacked on the first region and spaced apart from each other, the plurality of first bridge patterns extending in a first direction, a first gate structure extending in a second direction intersecting the first direction, the plurality of first bridge patterns penetrating through the first gate structure, a first epitaxial pattern connected to the plurality of first bridge patterns and on a side surface of the first gate structure, the first epitaxial pattern including a first impurity having a first conductivity type, a first silicide pattern on the first epitaxial pattern and overlapping the plurality of first bridge patterns in the first direction, a plurality of second bridge patterns sequentially stacked on the second region, and spaced apart from each other, the plurality of second bridge patterns extending in a third direction, a second gate structure extending in a fourth direction intersecting the third direction, the plurality of second bridge patterns penetrating through the second gate structure, a second epitaxial pattern connected to the plurality of second bridge patterns and on a side surface of the second gate structure, the second epitaxial pattern including a second impurity having a second conductivity type different from the first conductivity type, and a second silicide pattern on the second epitaxial pattern and overlapping the plurality of second bridge patterns in the third direction, wherein the first silicide pattern and the second silicide pattern have stress properties different from each other.

According to an example embodiment of the present disclosure, a semiconductor device includes a substrate including a first region and a second region, a plurality of first bridge patterns sequentially stacked on the first region and spaced apart from each other, the plurality of first bridge patterns extending in a first direction, a first gate structure extending in a second direction intersecting the first direction, the plurality of first bridge patterns penetrating through the first gate structure, a first epitaxial pattern connected to the plurality of first bridge patterns and on a side surface of the first gate structure, the first epitaxial pattern including a first impurity having a first conductivity type, a first silicide pattern surrounding the first epitaxial pattern, a plurality of second bridge patterns sequentially stacked on the second region and spaced apart from each other, the plurality of second bridge patterns extending in a third direction, a second gate structure extending in a fourth direction intersecting the third direction, the plurality of second bridge patterns penetrating through the second gate structure, a second epitaxial pattern connected to the plurality of second bridge patterns and on a side surface of the second gate structure, the second epitaxial pattern including a second impurity having a second conductivity type different from the first conductivity type, and a second silicide pattern surrounding the second epitaxial pattern, wherein the first epitaxial pattern includes a first epitaxial trench overlapping the plurality of first bridge patterns in the first direction, the first silicide pattern completely fills the first epitaxial trench, the second epitaxial pattern includes a second epitaxial trench overlapping the plurality of second bridge patterns in the third direction, the second silicide pattern completely fills the second epitaxial trench, and the first silicide pattern and the second silicide pattern have stress properties different from each other.

According to an example embodiment of the present disclosure, a semiconductor device includes a substrate including a p-type field effect transistor (PFET) region and an n-type field effect transistor (NFET) region, a plurality of first bridge patterns sequentially stacked on the PFET region and spaced apart from each other, the plurality of first bridge patterns extending in a first direction, a first gate structure extending in a second direction intersecting the first direction, the plurality of first bridge patterns penetrating the first gate structure, a first epitaxial pattern connected to the plurality of first bridge patterns and on a side surface of the first gate structure, the first epitaxial pattern including a p-type impurity, a first silicide pattern on the first epitaxial pattern and overlapping the plurality of first bridge patterns in the first direction, a plurality of second bridge patterns sequentially stacked on the NFET region and spaced apart from each other, the plurality of second bridge patterns extending in a third direction, a second gate structure extending in a fourth direction intersecting the third direction, the plurality of second bridge patterns penetrating the second gate structure, a second epitaxial pattern connected to the plurality of second bridge patterns and on a side surface of the second gate structure, the second epitaxial pattern including a n-type impurity, and a second silicide pattern on the second epitaxial pattern and overlapping the plurality of second bridge patterns in the third direction, wherein the second silicide pattern has greater tensile stress properties than the first silicide pattern, a concentration of the p-type impurity of the first epitaxial pattern decreases as a distance from the first silicide pattern increases, and a concentration of the n-type impurity of the second epitaxial pattern decreases as a distance from the second silicide pattern increases.

However, example embodiments of the present disclosure are not restricted to the example embodiments set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Although terms such as "first" and "second" are used to describe various elements or components in the present specification, it goes without saying that these elements or components are not limited by these terms. These terms are only used to distinguish a single element or component from other elements or components. Therefore, it goes without saying that a first element or component referred to below may be a second element or component within the technical idea of the present disclosure.

Also, in this specification, the term "same" means not only exactly the same thing, but also includes minute differences that may occur due to process margins and the like. In other words, while the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

A semiconductor device according to some example embodiments will be described below with reference to FIGS. 1 to 14.

Figure 1:
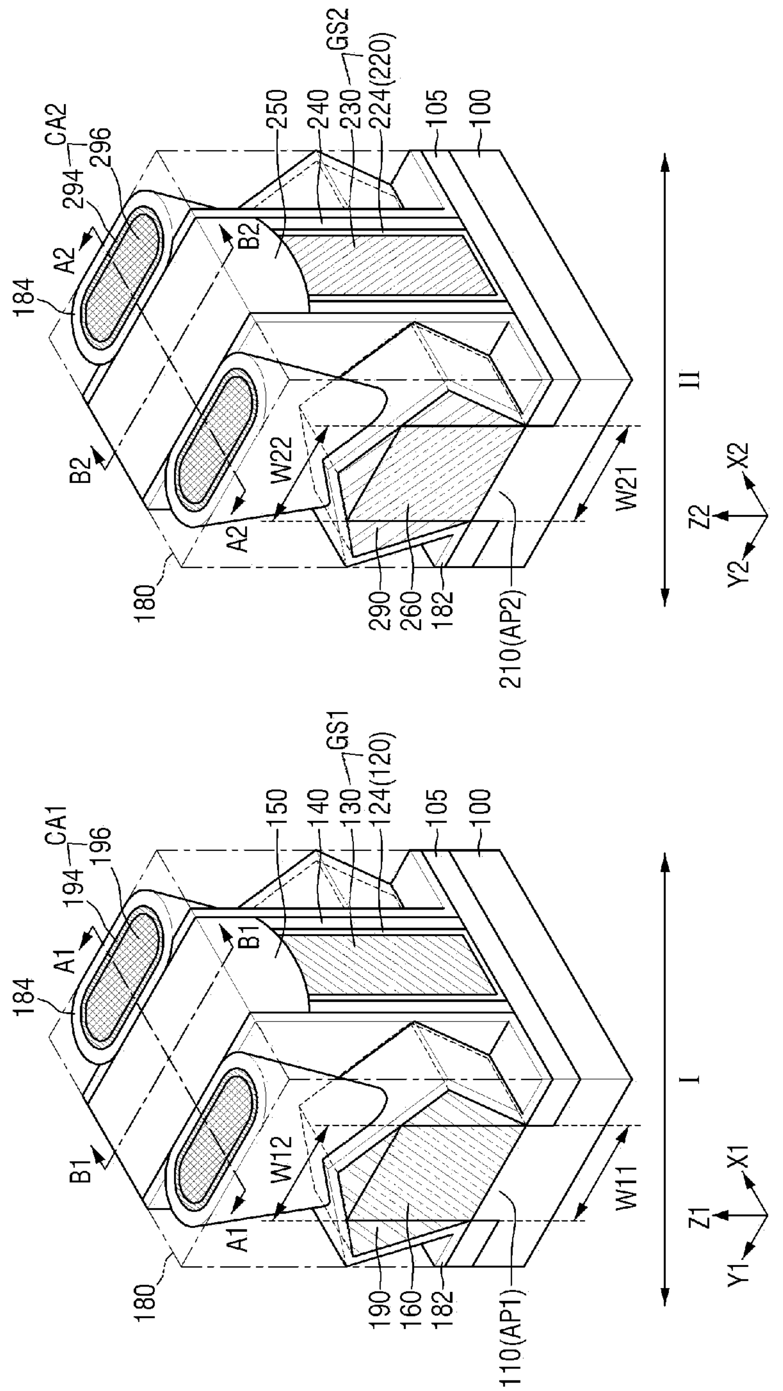
FIG. 1 is a perspective view for explaining the semiconductor device according to an example embodiment.
Figure 2:
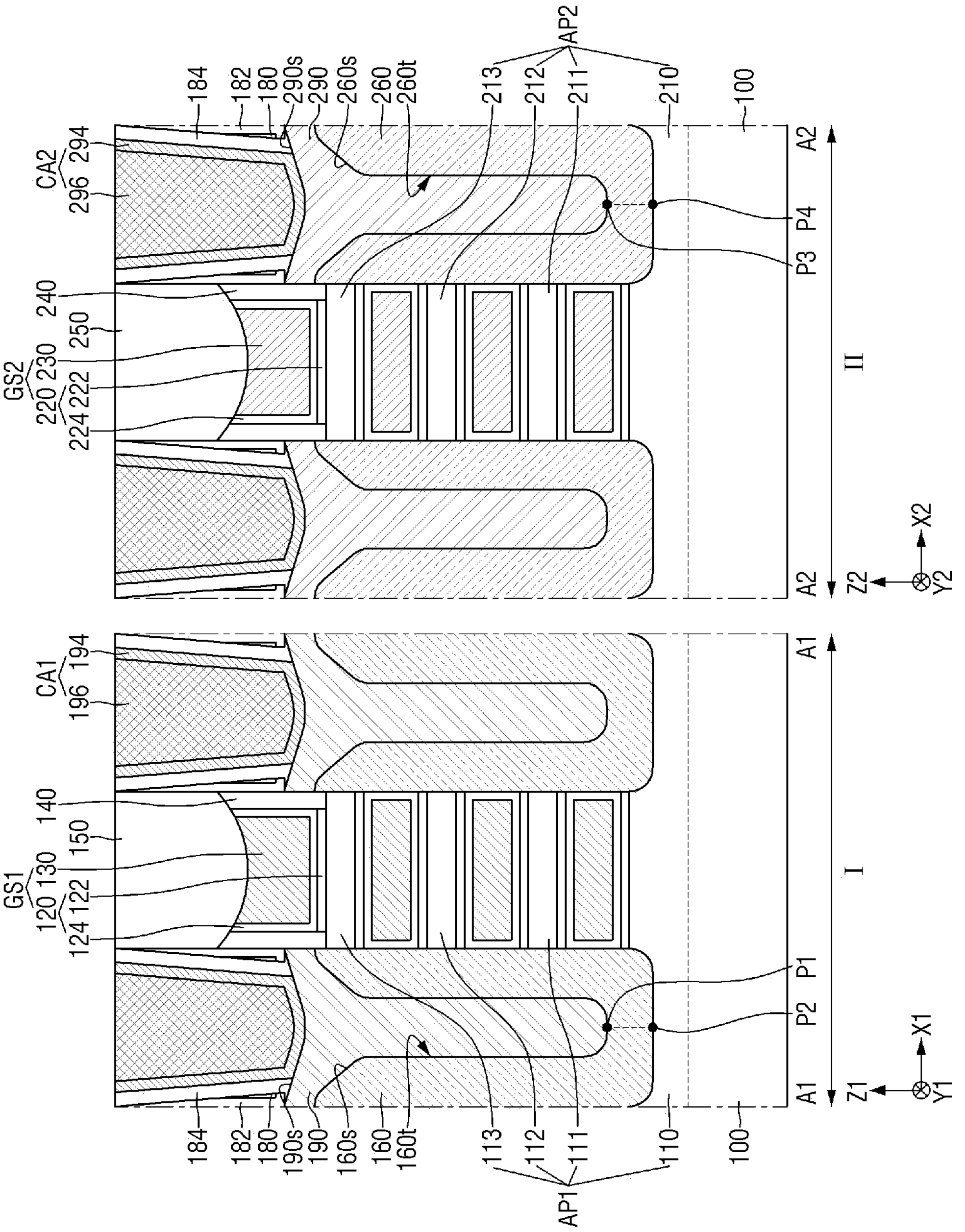
FIG. 2 is a cross-sectional view taken along A1-A1 and A2-A2 of FIG. 1.
Figure 3A:
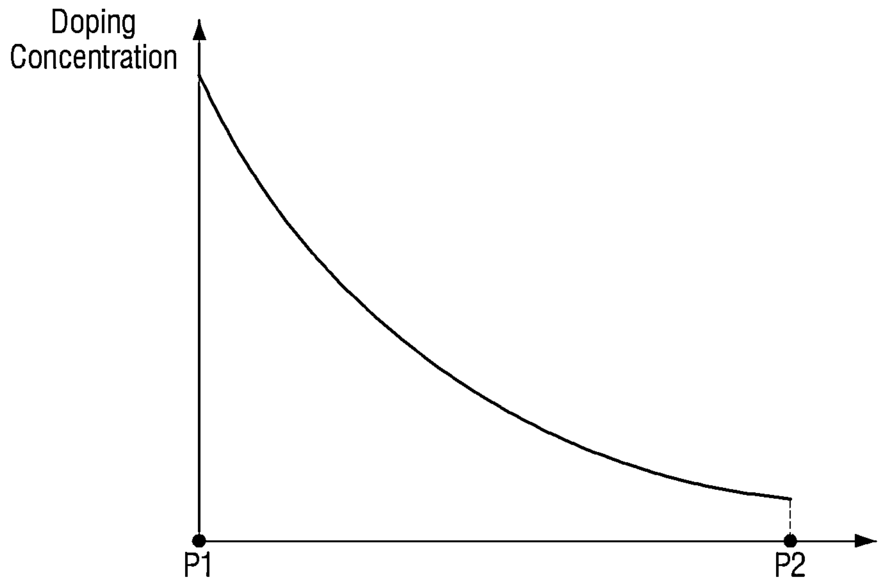
FIG. 3*a* is a graph for explaining a doping concentration of a first epitaxial pattern of FIGS. 1 and 2.
Figure 3B:
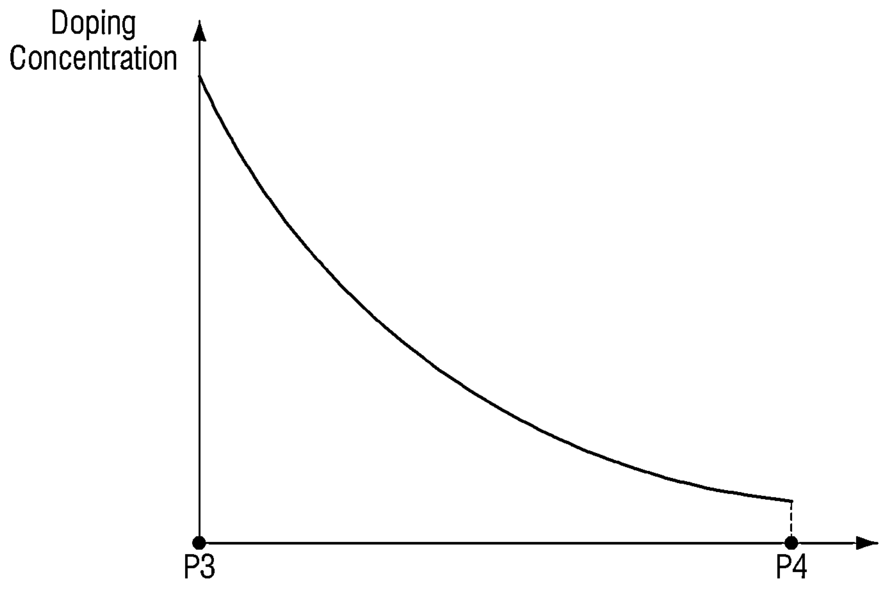
FIG. 3*b* is a graph for explaining a doping concentration of a second epitaxial pattern of FIGS. 1 and 2.
Figure 4:
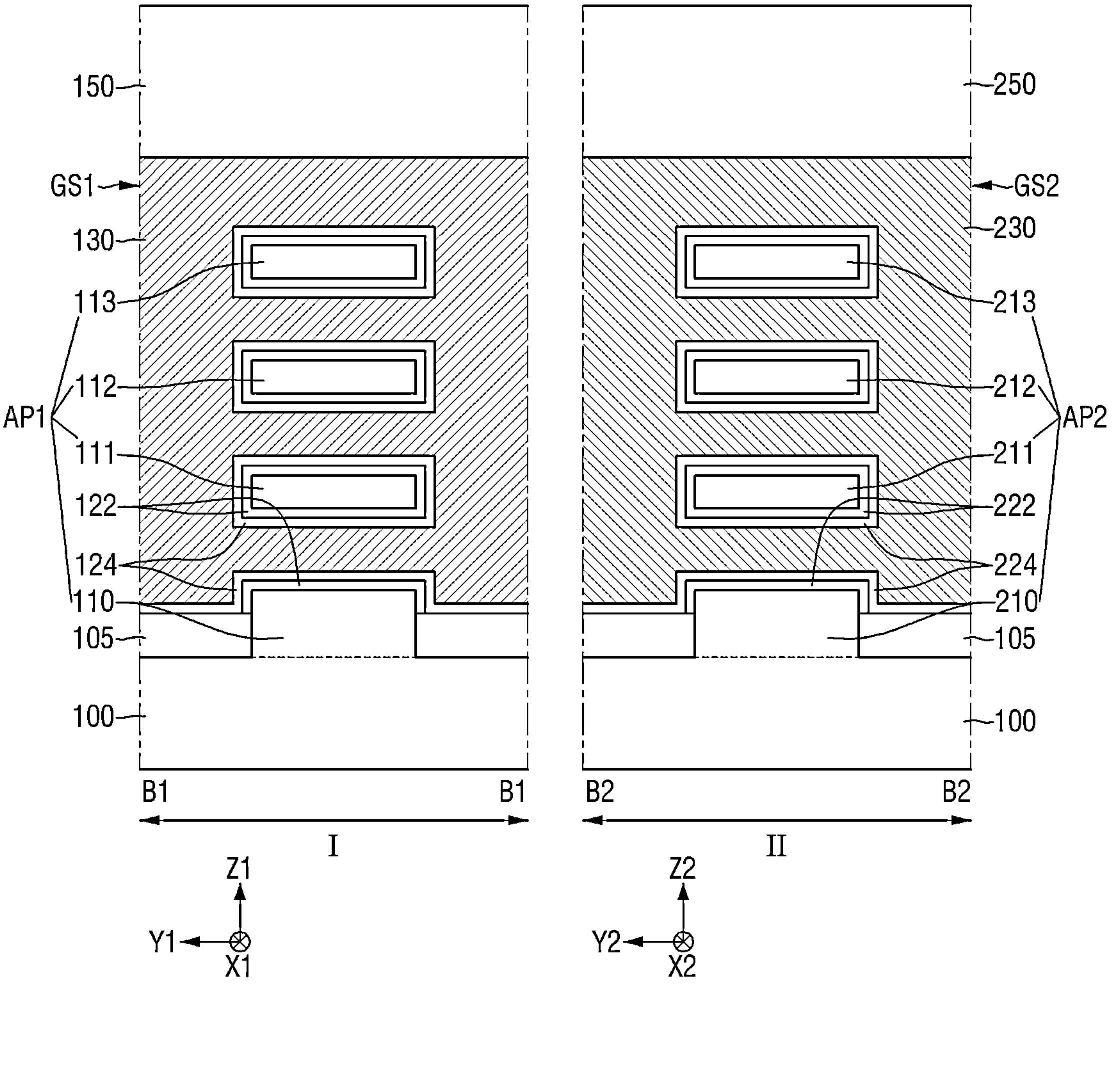
FIG. 4 is a cross-sectional view taken along B1-B1 and B2-B2 of FIG. 1.

FIG. 1 is a perspective view for explaining the semiconductor device according to an example embodiment. FIG. 2 is a cross-sectional view taken along A1-A1 and A2-A2 of FIG. 1. FIG. 3*a* is a graph for explaining a doping concentration of a first epitaxial pattern of FIGS. 1 and 2. FIG. 3*b* is a graph for explaining a doping concentration of a second epitaxial pattern of FIGS. 1 and 2. FIG. 4 is a cross-sectional view taken along B1-B1 and B2-B2 of FIG. 1.

Referring to FIGS. 1 to 4, the semiconductor device according to some example embodiments includes a substrate 100, a field insulating film 105, a first active pattern AP1, a second active pattern AP2, a first gate structure GS1, a second gate structure GS2, a first gate spacer 140, a second gate spacer 240, a first gate capping pattern 150, a second gate capping pattern 250, a first epitaxial pattern 160, a second epitaxial pattern 260, a first silicide pattern 190, a second silicide pattern 290, an interlayer insulating film 180, a first source/drain contact CA1, and a second source/drain contact CA2.

The substrate 100 may be bulk silicon or silicon-on-insulator (SOI). In contrast, the substrate 100 may be a silicon substrate, or may include, but is not limited to, other materials, for example, silicon germanium, silicon germanium on insulator (SGOI), indium antimonide, lead tellurium compounds, indium arsenide, indium phosphide, gallium arsenide or gallium antimonide. In some example embodiments, the substrate 100 may be an epitaxial layer formed on a base substrate. For convenience of explanation, hereinafter, the substrate 100 will be described as a silicon substrate.

The substrate 100 may include a first region I and a second region II. The first region I and the second region II may be regions connected to each other or regions spaced apart from each other. Transistors of different conductivity types from each other may be formed in the first region I and the second region II, respectively. In the following description, the first region I will be described as a P-type field effect transistor (PFET) region, and the second region II will be described as a N-type field effect transistor (NFET) region.

In some example embodiments, an upper side of the substrate 100 may include a {100} crystal plane. For example, the upper side of the substrate 100 may be one of a (−1 0 0) plane, a (0 1 0) plane, a (0 −1 0) plane, and a (0 0 −1) plane.

A first active pattern AP1 may be formed on the first region I of the substrate 100. The first active pattern AP1 may extend in a first direction X1 parallel to the upper side of the substrate 100. The first active pattern AP1 may include a plurality of bridge patterns (e.g., first to third bridge patterns 111 to 113) which are sequentially stacked on the upper side of the substrate 100, spaced apart from each other, and each extend in the first direction X1. Such a first active pattern AP1 may be used as a channel region of an MBCFET® including a multi-bridge channel. The number of bridge patterns included in the first active pattern AP1 is merely an example and is not limited to the shown example.

In some example embodiments, the first active pattern AP1 may further include a first fin pattern 110. The first fin pattern 110 may protrude from the upper side of the substrate 100 and extend in the first direction X1. The first fin pattern 110 may be formed by etching a part of the substrate 100, or may be an epitaxial layer grown from the substrate 100. The first to third bridge patterns 111 to 113 may be sequentially stacked on the upper side of the first fin pattern 110.

Although a width (W11 of FIG. 1) of the first active pattern AP1 is only shown as being constant in a height direction (e.g., a third direction Z1), this is merely exemplary. Depending on properties of an etching process (or a patterning process) for forming the first active pattern AP1, a width (W11 of FIG. 1) of the first active pattern AP1 may decrease, as it goes away from the substrate 100. For example, unlike the shown example, the width of the first bridge pattern 111 may be smaller than the width of the first fin pattern 110, the width of the second bridge pattern 112 may be smaller than the width of the first bridge pattern 111, and the width of the third bridge pattern 113 may be smaller than the width of the second bridge pattern 112.

A second active pattern AP2 may be formed on the second region II of the substrate 100. The second active pattern AP2 may extend in a fourth direction X2 parallel to the upper side of the substrate 100. The second active pattern AP2 may include a plurality of bridge patterns (for example, fourth to sixth bridge patterns 211 to 213) which are sequentially stacked on the upper side of the substrate 100, spaced apart from each other and each extend in the fourth direction X2. Such a second active pattern AP2 may be used as a channel region of a Multi-Bridge-Channel FET (MBCFET®) including a multi-bridge channel. The number of bridge patterns included in the second active pattern AP2 is merely an example, and is not limited to the shown example.

In some example embodiments, the second active pattern AP2 may further include a second fin pattern 210. The second fin pattern 210 may protrude from the upper side of the substrate 100 and extend in the fourth direction X2. The second fin pattern 210 may be formed by etching a part of the substrate 100, or may be an epitaxial layer grown from the substrate 100. The fourth to sixth bridge patterns 211 to 213 may be sequentially stacked on the upper side of the second fin pattern 210.

Although a width (W21 of FIG. 1) of the second active pattern AP2 is shown as being constant in the height direction (e.g., the third direction Z1), this is merely an example. Depending on the properties of the etching process (or patterning process) for forming the second active pattern AP2, the width (W21 of FIG. 1) of the second active pattern AP2 may decrease, as it goes away from the substrate 100. For example, unlike the shown example, the width of the fourth bridge pattern 211 may be smaller than the width of the second fin pattern 210, the width of the fifth bridge pattern 212 may be smaller than the width of the fourth bridge pattern 211, and the width of the sixth bridge pattern 213 may be smaller than the width of the fifth bridge pattern 212.

The first active pattern AP1 and the second active pattern AP2 may each include silicon (Si) or germanium (Ge), which is an elemental semiconductor material. In some example embodiments, each of first active pattern AP1 and the second active pattern AP2 may include a compound semiconductor, for example, a group IV-IV compound semiconductor or a group III-V compound semiconductor. The group IV-IV compound semiconductor may include, for example, a binary compound or a ternary compound including at least two or more of carbon (C), silicon (Si), germanium (Ge) and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element. As an example, in the following description, each of the first active pattern AP1 and the second active pattern AP2 will be described as being a silicon (Si) pattern.

In some example embodiments, the first active pattern AP1 and the second active pattern AP2 may be disposed at the same level. Here, the expression "disposed at the same level" means the placement at the same height on the basis of the upper side of the substrate 100. As an example, as shown in FIGS. 2 and 4, the first to third bridge patterns 111 to 113 and corresponding ones of the fourth to sixth bridge patterns 211 to 213 may be disposed at same heights with each other.

A field insulating film 105 may be formed on the substrate 100. The field insulating film 105 may include, for example, but is not limited to, at least one of silicon oxide, silicon nitride, silicon oxynitride, and combinations thereof.

In some example embodiments, the field insulating film 105 may cover at least a part of the side surface of the first fin pattern 110 and at least a part of the side surface of the second fin pattern 210. Although an upper part of the first fin pattern 110 and an upper part of the second fin pattern 210 are only shown to protrude from the upper surface of the field insulating film 105, this is merely an example. As another example, the upper surface of the field insulating film 105 may be coplanar with the upper surface of the first fin pattern 110 and the upper surface of the second fin pattern 210.

The first gate structure GS1 may be formed on the first region I of the substrate 100 and the field insulating film 105. The first gate structure GS1 may intersect the first active pattern AP1. For example, the first gate structure GS1 may extend in a second direction Y1 parallel to the upper side of the substrate 100 and intersecting the first direction X1. The first to third bridge patterns 111 to 113 each extend in the first direction X1 and may pass through the first gate structure GS1. That is, the first gate structure GS1 may surround each of the first to third bridge patterns 111 to 113.

The second gate structure GS2 may be formed on the second region II of the substrate 100 and the field insulating film 105. The second gate structure GS2 may intersect the second active pattern AP2. For example, the second gate structure GS2 may extend in a fifth direction Y2 that is parallel to the upper side of the substrate 100 and intersects the fourth direction X2. The fourth to sixth bridge patterns 211 to 213 each extend in the fourth direction X2 and may pass through the second gate structure GS2. That is, the second gate structure GS2 may surround peripheries of each of the fourth to sixth bridge patterns 211 to 213.

The first gate structure GS1 may include a first gate dielectric film 120 and a first gate electrode 130, and the second gate structure GS2 may include a second gate dielectric film 220 and a second gate electrode 230.

The first gate dielectric film 120 may be stacked on the first active pattern AP1. The first gate dielectric film 120 may surround the periphery of the first active pattern AP1. Further, the first gate dielectric film 120 may extend along the upper surface of the field insulating film 105 and the surface of the first fin pattern 110 protruding from the field insulating film 105.

The second gate dielectric film 220 may be stacked on the second active pattern AP2. The second gate dielectric film 220 may surround the periphery of the second active pattern AP2. Further, the second gate dielectric film 220 may extend along the upper surface of the field insulating film 105 and the surface of the second fin pattern 210 protruding from the field insulating film 105.

The first gate dielectric film 120 and the second gate dielectric film 220 may each include at least one of silicon oxide, silicon oxynitride, silicon nitride or a high dielectric constant material having a dielectric constant greater than that of silicon oxide. The high dielectric constant material may include, for example, but is not limited to, at least one of hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), and combinations thereof.

In some example embodiments, the first gate dielectric film 120 may include a first interfacial film 122 and a first high dielectric film 124 sequentially stacked on the first active pattern AP1. In some example embodiments, the second gate dielectric film 220 may include a second interfacial film 222 and a second high dielectric film 224 that are sequentially stacked on the second active pattern AP2.

The first interfacial film 122 may conformally extend along the peripheries of each of the first to third bridge patterns 111 to 113. The second interfacial film 222 may conformally extend around peripheries of each of the fourth to sixth bridge patterns 211 to 213. The first interfacial film 122 and the second interfacial film 222 may each include, for example, at least one of silicon oxide, silicon oxynitride or silicon nitride. In some example embodiments, the first interfacial film 122 may include an oxide of the first active pattern AP1, and the second interfacial film 222 may include an oxide of the second active pattern AP2.

The first high dielectric film 124 may conformally extend along the periphery of the first interfacial film 122. The second high dielectric film 224 may conformally extend along the periphery of the second interfacial film 222. The first high dielectric film 124 and the second high dielectric film 224 may each include, for example, a high dielectric constant material.

The semiconductor device according to some example embodiments may include a Negative Capacitance (NC) FET that uses a negative capacitor. For example, the first gate dielectric film 120 and/or the second gate dielectric film 220 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance values, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 at % to 10 at % silicon. When the dopant is yttrium (Y), the ferroelectric material film may include 2 at % to 10 at % yttrium. When the dopant is gadolinium (Gd), the ferroelectric material film may include 1 at % to 7 at % gadolinium. When the dopant is zirconium (Zr), the ferroelectric material film may include 50 at % to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Because a critical thickness that exhibits the ferroelectric properties may differ for each ferroelectric material, the thickness of the ferroelectric material film may vary depending on the ferroelectric material.

As an example, the first gate dielectric film 120 and/or the second gate dielectric film 220 may include one ferroelectric material film. As another example, the first gate dielectric film 120 and/or the second gate dielectric film 220 may include a plurality of ferroelectric material films spaced apart from one another. The first gate dielectric film 120 and/or the second gate dielectric film 220 may have a stacked film structure in which a plurality of ferroelectric material films and a plurality of paraelectric material films are alternately stacked.

The first gate electrode 130 may be formed on the substrate 100 and the field insulating film 105. Further, the first gate electrode 130 may be stacked on the first gate dielectric film 120. That is, the first gate dielectric film 120 may be interposed between the first active pattern AP1 and the first gate electrode. Further, the first gate dielectric film 120 may be interposed between the first fin pattern 110 and the first gate electrode 130. The first gate electrode 130 may be formed by, for example, but is not limited to, a replacement process.

The second gate electrode 230 may be formed on the substrate 100 and the field insulating film 105. Also, the second gate electrode 230 may be stacked on the second gate dielectric film 220. That is, the second gate dielectric film 220 may be interposed between the second active pattern AP2 and the second gate electrode 230. Also, the second gate dielectric film 220 may be interposed between the second fin pattern 210 and the second gate electrode 230. The second gate electrode 230 may be formed by, for example, but is not limited to, a replacement process.

Although each of the first gate electrode 130 and the second gate electrode 230 is only shown as being a single film, this is merely an example, and each of the first gate electrode 130 and the second gate electrode 230 may of course be formed by stacking a plurality of conductive layers. For example, each of the first gate electrode 130 and the second gate electrode 230 may include a work function adjusting film that adjusts a work function, and a filling conductive film that fills a space formed by the work function adjusting film. The work function adjusting film may include, for example, but is not limited to, at least one of TiN, TaN, TiC, TaC, TiAlC, and combinations thereof. The filling conductive film may include, for example, but is not limited to, W or Al.

The first gate spacer 140 may be formed on the first substrate 100 and the field insulating film 105. The first gate spacer may extend along the side surface of the first gate electrode 130. In some example embodiments, a part of the first gate dielectric film 120 may be interposed between the first gate electrode 130 and the first gate spacer 140. For example, the first gate dielectric film 120 may further extend along the inner side surface of the first gate spacer 140. Such a first gate dielectric film 120 may be formed by, but is not limited to, a replacement process.

The second gate spacer 240 may be formed on the substrate 100 and the field insulating film 105. The second gate spacer 240 may extend along the side surface of the second gate structure GS2. In some example embodiments, a part of the second gate dielectric film 220 may be interposed between the second gate electrode 230 and the second gate spacer 240. For example, the second gate dielectric film 220 may further extend along at least a part of the inner side surface of the second gate spacer 240. The second gate dielectric film 220 may be formed by, but is not limited to, a replacement process.

The first gate spacer 140 and the second gate spacer 240 may each include, for example, at least one of silicon nitride, silicon oxynitride, silicon oxycarbide, silicon boron nitride, silicon boron carbonitride, silicon oxycarbonitride, and combinations thereof.

The first gate capping pattern 150 may extend along the upper surface of the first gate structure GS1. In some example embodiments, the first gate capping pattern 150 may cover the upper surface of the first gate structure GS1 and the upper surface of the first gate spacer 140. In some example embodiments, the upper surface of the first gate structure GS1 and the upper surface of the first gate spacer 140 may include a concave surface that is recessed upward.

The second gate capping pattern 250 may extend along the upper surface of the second gate structure GS2. In some example embodiments, the second gate capping pattern 250 may cover the upper surface of the second gate structure GS2 and the upper surface of the second gate spacers 240. In some example embodiments, the upper surface of the second gate structure GS2 and the upper surface of the second gate spacer 240 may include a concave surface that is recessed downward.

The first gate capping pattern 150 and the second gate capping pattern 250 may each include, for example, but is not limited to, at least one of silicon nitride, silicon oxynitride, silicon oxycarbide, silicon boron nitride, silicon boron carbonitride, silicon oxycarbonitride, and combinations thereof.

The first epitaxial pattern 160 may be formed on the upper side of the substrate 100 and at least one side surface (e.g., both side faces) of the first gate structure GS1. Further, the first epitaxial pattern 160 may be connected to the first active pattern AP1. For example, each of the first to third bridge patterns 111 to 113 may penetrate the first gate structure GS1 and the first gate spacers 140, and be connected to the first epitaxial pattern 160. The first epitaxial pattern 160 may be electrically isolated from the first gate electrode 130 by the first gate dielectric film 120 and/or the first gate spacer 140. The first epitaxial pattern 160 may include an epitaxial layer. For example, the first epitaxial pattern 160 may be formed from the first active pattern AP1 by an epitaxial growth method. Such a first epitaxial pattern 160 may be provided as a source/drain region of a transistor (e.g., PFET) formed on the first region I.

Although a width of the first epitaxial pattern 160 in the first direction X1 is only shown as being constant in the height direction (e.g., the third direction Z1), this is merely an example. The width of the first epitaxial pattern 160 in the first direction X1 may decrease toward the substrate 100, depending on the properties of the etching process (or a recess process) performed on the first active pattern AP1 to form the first epitaxial pattern 160, unlike the shown example.

The first epitaxial pattern 160 may include a first epitaxial trench **160*t* therein. For example, as shown in FIG. 2, the first epitaxial trench 160*t* may be defined by at least a part of the upper surface of the first epitaxial pattern 160. The first epitaxial trench 160*t* may extend in the second direction Y1. For example, the first epitaxial pattern 160 may have a 'U' shape in a cross-section intersecting the second direction Y1. In some example embodiments, the first epitaxial trench 160*t* may be a deep trench that overlaps the first to third bridge patterns 111 to 113 in the first direction X1. For example, the lower surface (e.g., the bottom) of the first epitaxial trench 160*t* may be lower than the upper surface of the first bridge pattern 111, and the upper surface (e.g., the top) of the first epitaxial trench 160*t* may be lower than the lower surface of the third bridge pattern 113**.

In some example embodiments, the upper surface of the first epitaxial pattern 160 may include a first sloped surface **160*s*. The first sloped surface 160*s* may be adjacent to the first gate structure GS1. Further, a height of the first sloped surface 160*s* may decrease as it goes away from the first gate structure GS1. In some example embodiments, the first sloped surface 160*s* may include a {111} crystal plane. For example, the first sloped surface 160*s* may be one of a (1 1 1) plane, a (1 1 −1) plane, a (1 −1 1) plane, a (1 −1 −1) plane, a (−1 1 1) plane, a (−1 1 −1) plane, a (−1 −1 1) plane, and a (−1 −1 −1) plane. In some example embodiments, the first sloped surface 160*s* may extend from a position higher than the upper surface of the uppermost bridge pattern (e.g., the third bridge pattern 113). For example, the upper part of the first epitaxial pattern 160 may be in contact with the outer surface of the first gate spacer 160 disposed on the upper surface of the uppermost bridge pattern (e.g., the third bridge pattern 113**).

In some example embodiments, the first epitaxial trench **160*t* may extend downward from the first sloped surface 160*s* toward the substrate 100. Although the width of the first epitaxial trench 160*t* in the first direction X1 is shown as being constant in the height direction (e.g., the third direction Z1), this is merely an example. Unlike the shown example, when the width of the first epitaxial pattern 160 in the first direction X1 decreases toward the substrate 100, the width of the first epitaxial trench 160*t* in the first direction X1 may also decrease toward the substrate 100**.

In some example embodiments, the width (W12 of FIG. 1) of the first epitaxial pattern 160 in the second direction Y1 may be the same as the width (W11 of FIG. 1) of the first active pattern AP1. Although the width (W12 of FIG. 1) of the first epitaxial pattern 160 in the second direction Y1 is shown as being constant in the height direction (e.g., in the third direction Z1), this is merely an example. Unlike the shown example, when the width of the first active pattern AP1 (W11 of FIG. 1) decreases as it goes away from the substrate 100, the width of the first epitaxial pattern 160 in the second direction Y1 may also decrease as it goes away from the substrate 100.

The first epitaxial pattern 160 may include first impurity having a first conductivity type. For example, when the first region I is a PFET region, the first epitaxial pattern 160 may include p-type impurity or impurity for blocking or preventing diffusion of the p-type impurity. The p-type impurity may include, for example, at least one of boron (B), indium (In), gallium (Ga), aluminum (Al), and combinations thereof.

In some example embodiments, the first epitaxial pattern 160 may further include a compressive stress material. As an example, when the first active pattern AP1 is a silicon pattern, the first epitaxial pattern 160 may include a material (e.g., silicon germanium (SiGe)) having a lattice constant greater than silicon (Si). The compressive stress material may improve carrier mobility of the channel region, by applying a compressive stress to the first active pattern AP1.

The second epitaxial pattern 260 may be formed on the upper side of the substrate 100 and at least one side surface (e.g., both side faces) of the second gate structure GS2. Further, the second epitaxial pattern 260 may be connected to the second active pattern AP2. For example, each of the fourth to sixth bridge patterns 211 to 213 may penetrate the second gate structure GS2 and the second gate spacer 240, and be connected to the second epitaxial pattern 260. The second epitaxial pattern 260 may be electrically isolated from the second gate electrode 230 by the second gate dielectric film 220 and/or the second gate spacer 240. The second epitaxial pattern 260 may include an epitaxial layer. For example, the second epitaxial pattern 260 may be formed from the second active pattern AP2 by an epitaxial growth method. Such a second epitaxial pattern 260 may be provided as a source/drain region of a transistor (e.g., NFET) formed on the second region II.

Although a width of the second epitaxial pattern 260 in the fourth direction X2 is only shown as being constant in the height direction (e.g., a sixth direction Z2), this is merely an example. The width of the second epitaxial pattern 260 in the fourth direction X2 may decrease toward the substrate 100, unlike the shown example, depending on the properties of the etching process (or a recess process) performed on the second active pattern AP2 to form the second epitaxial pattern 260.

The second epitaxial pattern 260 may include a second epitaxial trench **260*t* therein. For example, as shown in FIG. 2, the second epitaxial trench 260*t* may be defined by at least a part of the upper surface of the second epitaxial pattern 260. The second epitaxial trench 260*t* may extend in the fifth direction Y2. For example, the second epitaxial pattern 260 may have a 'U' shape in a cross-section intersecting the fifth direction Y2. In some example embodiments, the second epitaxial trench 260*t* may be a deep trench that overlaps the fourth to sixth bridge patterns 211 to 213 in the fourth direction X2. For example, the lower surface (e.g., the bottom) of the second epitaxial trench 260*t* may be lower than the upper surface of the fourth bridge pattern 211, and the upper surface (e.g., the top) of the second epitaxial trench 260*t* may be lower than the lower surface of the sixth bridge pattern 213**.

In some example embodiments, the upper surface of the second epitaxial pattern 260 may include a second sloped surface **260*s*. The second sloped surface 260*s* may be adjacent to the second gate structure GS2. In addition, the height of the second slope 260*s* may decrease, as it goes away from the second gate structure GS2. In some example embodiments, the second sloped surface 260*s* may include a {111} crystal plane. For example, the second sloped surface 260*s* may be one of a (1 1 1) plane, a (1 1 −1) plane, a (1 −1 1) plane, a (1-1 −1) plane, a (−1 1 1) plane, a (−1 1 −1) plane, a (−1 −1 1) plane, and a (−1 −1 −1) plane. In some example embodiments, the second sloped surface 260*s* may extend from a position higher than the upper surface of the uppermost bridge pattern (e.g., a sixth bridge pattern 213**).

For example, the upper part of the second epitaxial pattern 260 may be in contact with the outer surface of the second gate spacer 260 disposed on the upper surface of the uppermost bridge pattern (e.g., the sixth bridge pattern 213).

In some example embodiments, the second epitaxial trench 260*t* may extend downward from the second sloped surface 260*s* toward the substrate 100. Although the width of the second epitaxial trench 260*t* in the fourth direction X2 is only shown as being constant in the height direction (e.g., the sixth direction Z2), this is merely an example. Unlike the shown example, when the width of the second epitaxial pattern 260 in the fourth direction X2 decreases toward the substrate 100, the width of the second epitaxial trench 260*t* in the fourth direction X2 may also decrease toward the substrate 100.

In some example embodiments, the width (W22 of FIG. 1) of the second epitaxial pattern 260 in the fifth direction Y2 may be the same as the width (W21 of FIG. 1) of the second active pattern AP2. Although the width (W22 of FIG. 1) of the second epitaxial pattern 260 in the fifth direction Y2 is only shown as being constant in the height direction (e.g., the sixth direction Z2), this is merely an example. Unlike the shown example, when the width (W21 of FIG. 1) of the second active pattern AP2 decreases as it goes away from the substrate 100, the width of the second epitaxial pattern 260 in the fifth direction Y2 may also decrease as it goes away from the substrate 100.

The second epitaxial pattern 260 may include second impurity having a second conductivity type different from the first conductivity type. For example, if the second region II is an NFET region, the second epitaxial pattern 260 may include n-type impurity or impurity for preventing diffusion of the n-type impurity. The n-type impurities may include, for example, at least one of phosphorus (P), arsenic (As), antimony (Sb), and combinations thereof.

In some example embodiments, the second epitaxial pattern 260 may further include a tensile stress material. As an example, if the second active pattern AP2 is a silicon pattern, the second epitaxial pattern 260 may include a material (e.g., silicon carbide (SiC)) having a smaller lattice constant than silicon (Si). The tensile stress material may improve carrier mobility of the channel region by applying a tensile stress to the second active pattern AP2.

The first silicide pattern 190 may be formed on the first epitaxial pattern 160. The first silicide pattern 190 may be connected to the first epitaxial pattern 160. The first silicide pattern 190 may surround an outer circumferential surface of the first epitaxial pattern 160. For example, as shown in FIG. 1, the first silicide pattern 190 may cover the side surface and upper surface of the first epitaxial pattern 160. Further, as shown in FIG. 2, the first silicide pattern 190 may fill at least a part of the first epitaxial trench 160*t*. Accordingly, a contact area between the first epitaxial pattern 160 and the first silicide pattern 190 is enhanced, and the contact resistance with respect to the first epitaxial pattern 160 may be improved.

In some example embodiments, the first silicide pattern 190 may completely fill the first epitaxial trench 160*t* of the first epitaxial pattern 160. For example, on the basis of the upper side of the substrate 100, the height of the upper surface of the first silicide pattern 190 may be higher than the height of the upper part of the first epitaxial trench 160*t*.

In some example embodiments, the concentration of the first impurity (e.g., boron (B), indium (In), gallium (Ga) and/or aluminum (Al)) of the first epitaxial pattern 160 may decrease, as it goes away from the first silicide pattern 190. That is, the concentration of the first impurity of the first epitaxial pattern 160 may be highest at an interface with the first silicide pattern 190. For example, a first point P1 may be defined on the interface between the first epitaxial pattern 160 and the first silicide pattern 190, and a second point P2 may be defined on the interface between the first epitaxial pattern 160 and the first fin pattern 110. As shown in FIG. 3*a*, the doping concentration of the first epitaxial pattern 160 may gradually decrease in the direction from the first point P1 to the second point P2.

In some example embodiments, the first silicide pattern 190 may include a third sloped surface 190*s*. A height of the third sloped surface 190*s* may decrease, as it goes away from the first gate structure GS1.

A second silicide pattern 290 may be formed on the second epitaxial pattern 260. The second silicide pattern 290 may be connected to the second epitaxial pattern 260. The second silicide pattern 290 may surround the outer circumferential surface of the second epitaxial pattern 260. For example, as shown in FIG. 1, the second silicide pattern 290 may cover the side surface and upper surface of the second epitaxial pattern 260. Further, as shown in FIG. 2, the second silicide pattern 290 may fill at least a part of the second epitaxial trench 260*t*. Accordingly, a contact area between the second epitaxial pattern 260 and the second silicide pattern 290 is enhanced, and a contact resistance with respect to the second epitaxial pattern 260 may be improved.

In some example embodiments, the second silicide pattern 290 may completely fill the second epitaxial trench 260*t* of the second epitaxial pattern 260. For example, on the basis of the upper side of the substrate 100, the height of the upper surface of the second silicide pattern 290 may be higher than the height of the upper part of the second epitaxial trench 260*t*.

In some example embodiments, the concentration of the second impurity (e.g., phosphorus (P), arsenic (As) and/or antimony (Sb)) of the second epitaxial pattern 260 may decrease, as it goes away from the second silicide pattern 290. That is, the concentration of the second impurity of the second epitaxial pattern 260 may be highest at the interface with the second silicide pattern 290. For example, a third point P3 may be defined on the interface between the second epitaxial pattern 260 and the second silicide pattern 290, and a fourth point P4 may be defined on the interface between the second epitaxial pattern 260 and the second fin pattern 210. As shown in FIG. 3*b*, the doping concentration of the second epitaxial pattern 260 may gradually decrease, in the direction from the third point P3 to the fourth point P4.

In some example embodiments, the second silicide pattern 290 may include a fourth sloped surface 290*s*. A height of the fourth sloped surface 290*s* may decrease as it goes away from the second gate structure GS2.

The first silicide pattern 190 and the second silicide pattern 290 may have different stress properties from each other. For example, if the first region I is the PFET region and the second region II is the NFET region, the second silicide pattern 290 may have a tensile stress greater than that of the first silicide pattern 190.

As an example, the first silicide pattern 190 may include a metal silicide having a relatively low tensile stress property, such as nickel silicide (NiSi) or molybdenum silicide ($MoSi_2$), or having compressive stress properties. The first silicide pattern 190 may improve carrier mobility of the channel region by applying a compressive stress to the first epitaxial pattern 160 and the first active pattern AP1.

Further, as an example, the second silicide pattern 290 may include a metal silicide having a relatively high tensile stress, such as titanium silicide ($TiSi_2$) or cobalt silicide ($CoSi_2$). The second silicide pattern 290 may improve carrier mobility of the channel region by applying a tensile stress to the second epitaxial pattern 260 and the second active pattern AP2.

The interlayer insulating film 180 may be formed on the substrate 100 and the field insulating film 105. The interlayer insulating film 180 may fill the space on the outer surface of the first gate spacer 140 and the space on the outer surface of the second gate spacer 240. For example, the interlayer insulating film 180 may cover the field insulating film 105, the first epitaxial pattern 160 and the second epitaxial pattern 260. Although the interlayer insulating film 180 is only shown to expose the upper surface of the first gate capping pattern 150 and the upper surface of the second gate capping pattern 250, this is merely an example. As another example, the interlayer insulating film 180 may cover the upper surface of the first gate capping pattern 150 and the upper surface of the second gate capping pattern 250.

The interlayer insulating film 180 may include, for example, but is not limited to, at least one of silicon oxide, silicon nitride, silicon oxynitride, silicon oxycarbide, silicon boron nitride, silicon boron carbonitride, silicon oxycarbonitride, and a low dielectric constant material having a lower dielectric constant than silicon oxide. The low dielectric constant material may include, for example, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

In some example embodiments, a first liner film 182 that covers the first silicide pattern 190 and the second silicide pattern 290 may be formed. The first liner film 182 may conformally extend along the profiles of the surface of the first silicide pattern 190 and the surface of the second silicide pattern 290. The first liner film 182 may further extend along the upper surface of the field insulating film 105, the side surface of the first gate spacer 140, and the side surface of the second gate spacer 240. The interlayer insulating film 180 may be formed on the first liner film 182.

The first liner film 182 may include a material having an etch selectivity with respect to the interlayer insulating film 180. As an example, when the interlayer insulating film 180 includes silicon oxide, the first liner film 182 may include at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and combinations thereof. The first liner film 182 may be provided as an etch stop layer in an etching process on the interlayer insulating film 180.

A first source/drain contact CA1 may be connected to the first silicide pattern 190. For example, the first source/drain contact CA1 may extend in the third direction Z1 to penetrate the interlayer insulating film 180 and the first liner film 182, and may be connected to the upper surface of the first silicide pattern 190.

A second source/drain contact CA2 may be connected to the second silicide pattern 290. For example, the second source/drain contact CA2 may extend in the sixth direction Z2 to penetrate the interlayer insulating film 180 and the first liner film 182, and may be connected to the upper surface of the second silicide pattern 290.

In some example embodiments, a second liner film 184 may be further formed on the interlayer insulating film 180 and the first liner film 182. The second liner film 184 may conformally extend along the profiles of the side surface of the first source/drain contact CA1 and the side surface of the second source/drain contact CA2. The first source/drain contact CA1 and the second source/drain contact CA2 may each penetrate the second liner film 184, and be connected to the first silicide pattern 190 and the second silicide pattern 290, respectively.

The second liner film 184 may include, for example, at least one of silicon oxide, silicon nitride, silicon oxynitride, silicon oxycarbide, silicon boron nitride, silicon boron carbonitride, silicon oxycarbonitride or a low-dielectric constant material having a lower dielectric constant than silicon oxide.

In some example embodiments, the first source/drain contact CA1 may include a first barrier metal film 194 and a first metal film 196 that are sequentially stacked on the first silicide pattern 190. In some example embodiments, the second source/drain contact CA2 may include a second barrier metal film 294 and a second metal film 296 that are sequentially stacked on the second silicide pattern 290.

The first barrier metal film 194 may be formed on the first silicide pattern 190. The first barrier metal film 194 may conformally extend along the upper surface of the first silicide pattern 190 and the profile of the second liner film 184. The second barrier metal film 294 may be formed on the second silicide pattern 290. The second barrier metal film 294 may conformally extend along the upper surface of the second silicide pattern 290 and the profile of the second liner film 184. The first barrier metal film 194 and the second barrier metal film 294 may each include, but are not limited to, conductive metal nitrides such as titanium nitride, tantalum nitride or tungsten nitride. As an example, the first barrier metal film 194 and the second barrier metal film 294 may each include titanium nitride (TiN).

The first metal film 196 may be formed on the first barrier metal film 194. The first metal film 196 may fill a region that remains after the first barrier metal film 194 is filled on the first silicide pattern 190. The second metal film 296 may be formed on the second barrier metal film 294. The second metal film 296 may fill a region that mains after the second barrier metal film 294 is filled on the second silicide pattern 290. The first metal film 196 and the second metal film 296 may each include, for example, but are not limited to, a metal material such as cobalt (Co), titanium (Ti), tantalum (Ta), ruthenium (Ru), tungsten (W) or cobalt tungsten phosphorus (CoWP). As an example, the first metal film 196 and the second metal film 296 may each include cobalt (Co).

An epitaxial pattern including a deep trench (e.g., the first epitaxial trench 160*t* or the second epitaxial trench 260*t*) may be utilized to reduce a contact resistance between the source/drain region and the source/drain contact. However, the stress caused by the epitaxial pattern is reduced due to the formation of a deep trench, and the channel resistance may increase. For example, if the channel of the PFET is a silicon pattern, a silicon germanium (SiGe) pattern, which has a lattice constant greater than silicon (Si), may be used as the source/drain region of the PFET. However, when the deep trench is formed in the silicon germanium pattern, the volume of the silicon germanium pattern decreases, thereby reducing a compressive stress applied to the channel region (silicon pattern).

In the semiconductor device according to some example embodiments, by utilizing the first epitaxial pattern 160 and the second epitaxial pattern 260 having each deep trench, and by utilizing the first silicide pattern 190 and the second silicide pattern 290 having stress properties different from each other, the performance of the semiconductor device can be improved.

Specifically, as described above, the first epitaxial pattern 160 provided as the source/drain region of the PFET may include a first epitaxial trench **160*t* that is a deep trench, and the first silicide pattern 190 may fill at least a part of the first epitaxial trench 160*t*. At this time, because the first silicide pattern 190 may have a relatively small tensile stress or compressive stress properties, it is possible to compensate for volume reduction of the first epitaxial pattern 160 due to the first epitaxial trench 160*t*, thereby improving the channel resistance. In particular, when the first silicide pattern 190 completely fills the first epitaxial trench 160*t*, the stress properties are maximized and the channel resistance can be further improved. Accordingly, not only the contact resistance to the first epitaxial pattern 160 but also the channel resistance of the first active pattern AP1** are improved. Thus, a semiconductor device having improved performance can be provided.

Also, as explained above, in the semiconductor device according to some example embodiments, the second epitaxial pattern 260 provided as the source/drain region of the NFET may include a second epitaxial trench **260*t* that is a deep trench, and the second silicide pattern 290 may fill at least a part of the second epitaxial trench 260*t*. At this time, since the second silicide pattern 290 may have relatively large tensile stress properties, it is possible to compensate for the volume reduction of the second epitaxial pattern 260 due to the second epitaxial trench 260*t* and improve the channel resistance. In particular, when the second silicide pattern 290 completely fills the second epitaxial trench 260*t*, the stress properties are maximized and the channel resistance can be further improved. Accordingly, not only the contact resistance to the second epitaxial pattern 260 but also the channel resistance of the second active pattern AP2** are improved. Thus, a semiconductor device having further improved performance can be provided.

Figure 5:
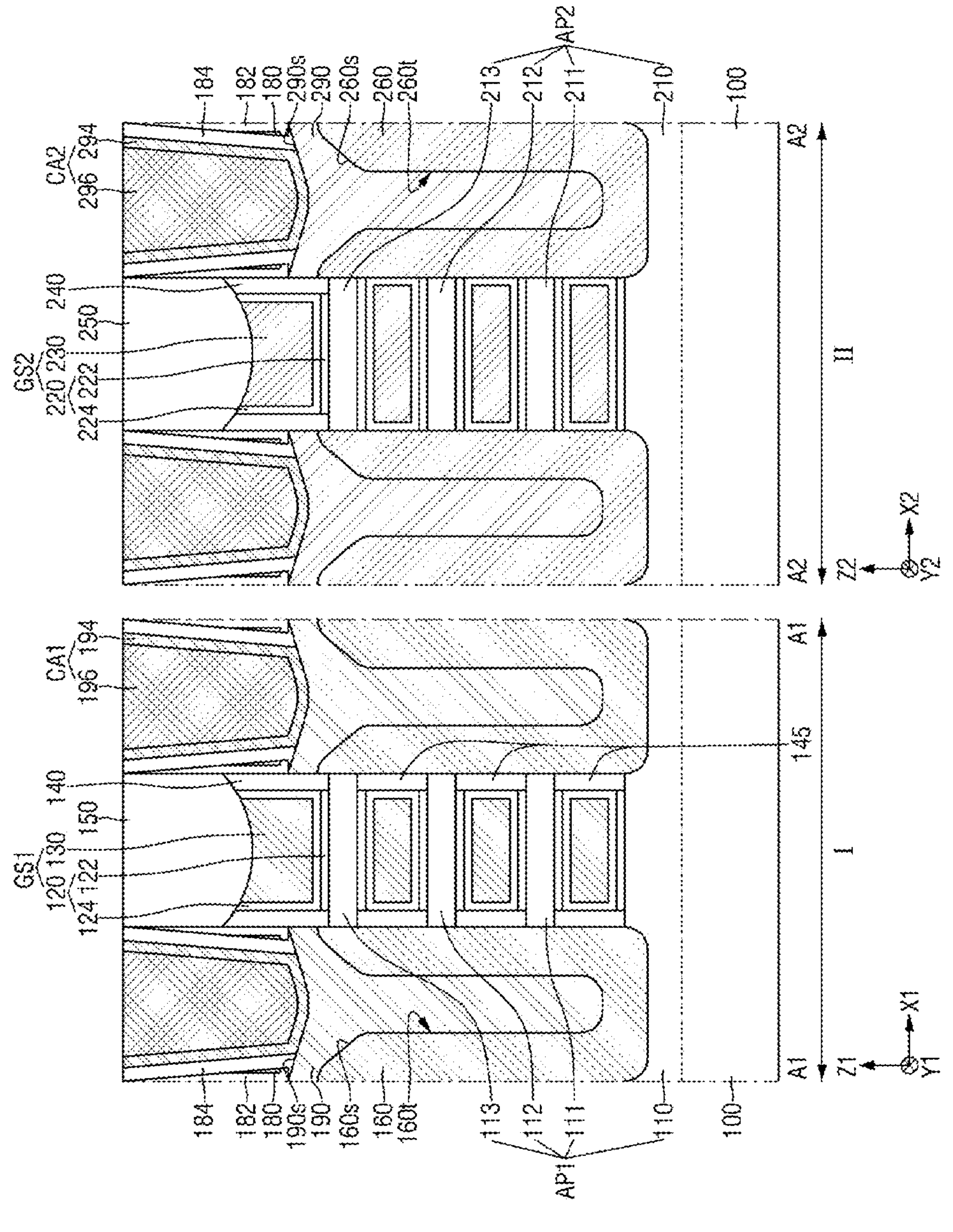
FIGS. 5 and 6 are other various cross-sectional views taken along A1-A1 and A2-A2 of FIG. 1.
Figure 6:
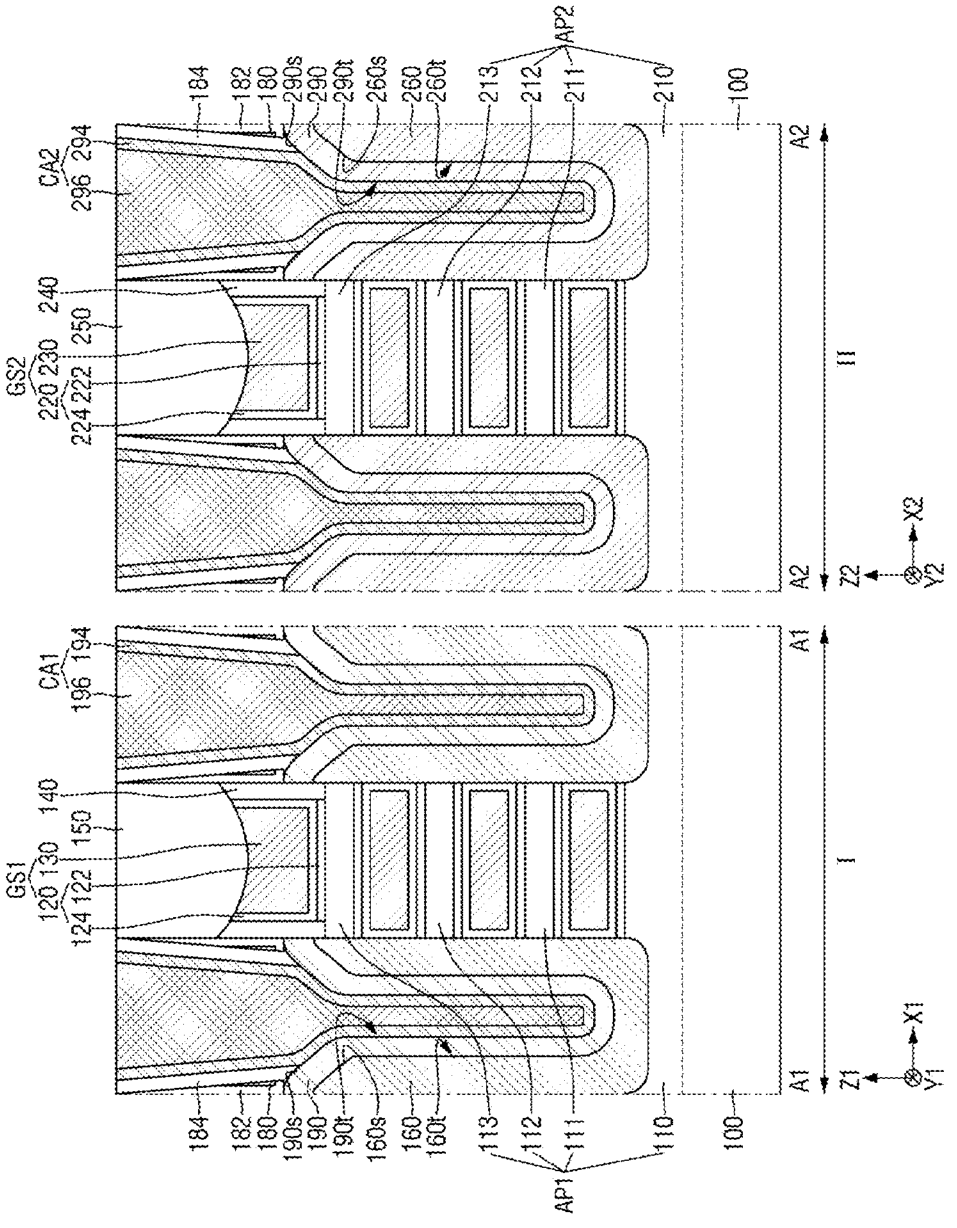

FIGS. 5 and 6 are other various cross-sectional views taken along A1-A1 and A2-A2 of FIG. 1. For convenience of explanation, repeated parts of those explained using FIGS. 1 to 4 will be briefly explained or omitted.

Referring to FIG. 5, the semiconductor device according to an example embodiment further includes an internal spacer 145.

The internal spacer 145 may be formed on side surface of the first gate electrode 130 between the first to third bridge patterns 111 to 113. Further, the internal spacer 145 may also be formed on the side surface of the first gate electrode 130 between the first fin pattern 110 and the first bridge pattern 111. The first gate electrode 130 between the first to third bridge patterns 111 to 113 may be electrically isolated from the first epitaxial pattern 160 by the first gate dielectric film 120 and/or the internal spacers 145.

The internal spacer 145 may include, for example, but is not limited to, at least one of silicon nitride, silicon oxynitride, silicon oxycarbide, silicon boron nitride, silicon boron carbonitride, silicon oxycarbonitride, and combinations thereof. The internal spacers 145 may include the same material as the first gate spacer 140 or may include a material different from that of the first gate spacer 140. Although the thickness of the internal spacer 145 is only shown as being the same as the thickness of the first gate spacer 140, this is merely an example.

Although the internal spacer 145 is only shown as being formed on the first region I, this is merely an example, and the internal spacer 145 may be formed on both the first region I and the second region II.

Referring to FIG. 6, in the semiconductor device according to an example embodiment, the first silicide pattern 190 and/or the second silicide pattern 290 include a deep trench.

For example, the thickness of the first silicide pattern 190 may be formed so as not to completely fill the first epitaxial trench **160*t*. Such a first silicide pattern 190 may include the first silicide trench 190*t* therein. The first silicide trench 190*t* may be defined by at least a part of the upper surface of the first silicide pattern 190. The first silicide trench 190*t* may extend in the second direction Y1. For example, the first silicide pattern 190 may have a 'U' shape in a cross-section intersecting the second direction Y1. In some example embodiments, the first silicide trench 190*t* may be a deep trench that overlaps the first to third bridge patterns 111 to 113 in the first direction X1**.

Further, the thickness of the second silicide pattern 290 may be formed so as not to completely fill the second epitaxial trench **260*t*. Such a second silicide pattern 290 may include a second silicide trench 290*t* therein. The second silicide trench 290*t* may be defined by at least a part of the upper surface of the second silicide pattern 290. The second silicide trench 290*t* may extend in the fifth direction Y2. For example, the second silicide pattern 290 may have a 'U' shape in a cross-section intersecting the fifth direction Y2. In some example embodiments, the second silicide trenches 290*t* may be a deep trench that overlaps the fourth to sixth bridge patterns 211 to 213 in the fourth direction X2**.

The first source/drain contact CA1 may fill the first silicide trench **190*t*. A lower part of the first source/drain contact CA1 may overlap the first to third bridge patterns 111 to 113 in the first direction X1. The second source/drain contact CA2 may fill the second silicide trench 290*t*. A lower part of the second source/drain contact CA2 may overlap the fourth to sixth bridge patterns 211 to 213 in the fourth direction X2**.

Although both the first silicide pattern 190 and the second silicide pattern 290 are only shown to include a deep trench, this is merely an example, and only one of the first silicide pattern 190 and the second silicide pattern 290 may include the deep trench. As an example, the first silicide pattern 190 may include the first silicide trench **190*t*, and the second silicide pattern 290 may completely fill the second epitaxial trench 260*t*. As another example, the first silicide pattern 190 may completely fill the first epitaxial trench 160*t*, and the second silicide pattern 290 may include the second silicide trench 290*t***.

Figure 7:
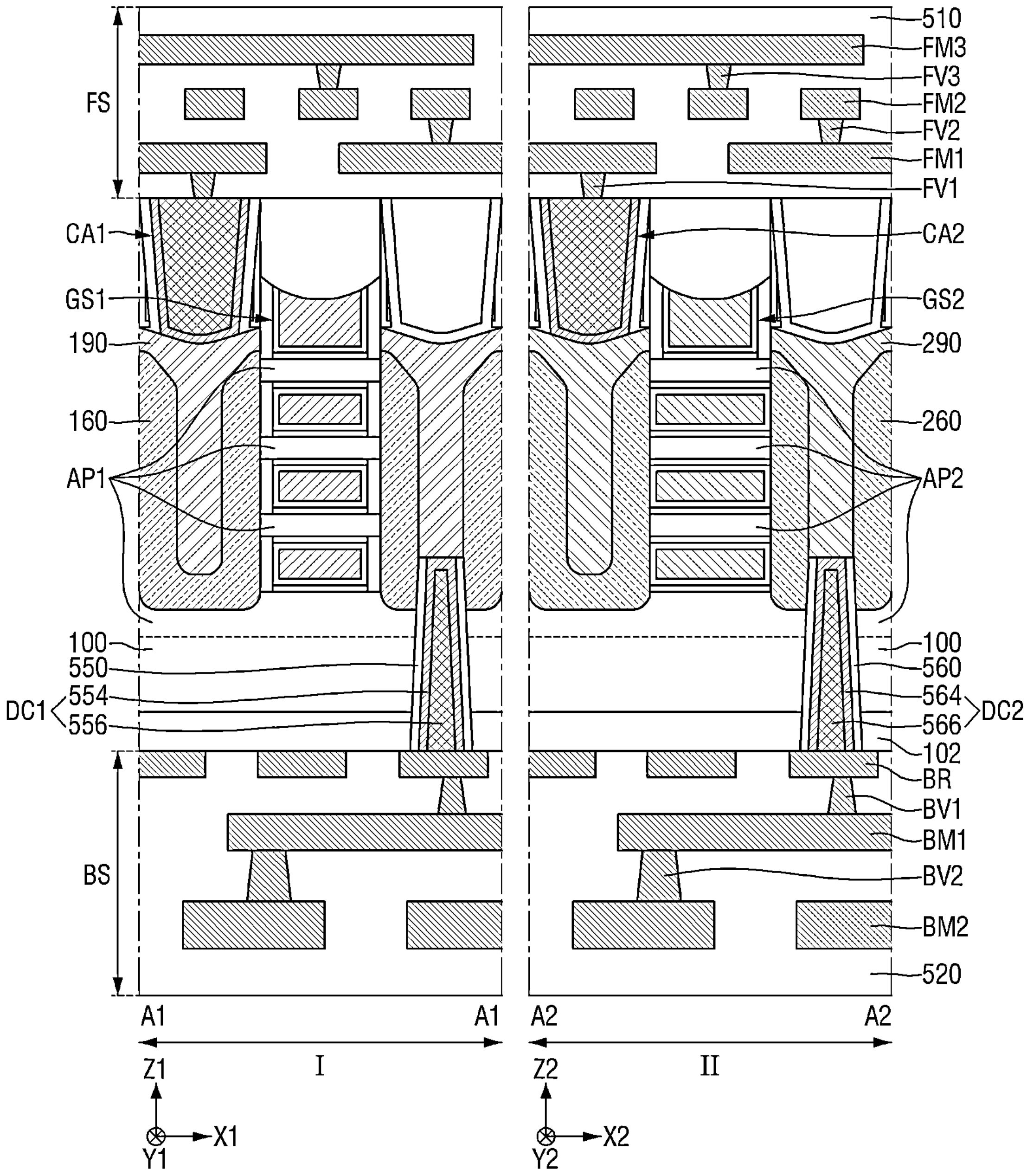
FIGS. 7 and 8 are various cross-sectional views for explaining a semiconductor device according to some example embodiments.
Figure 8:
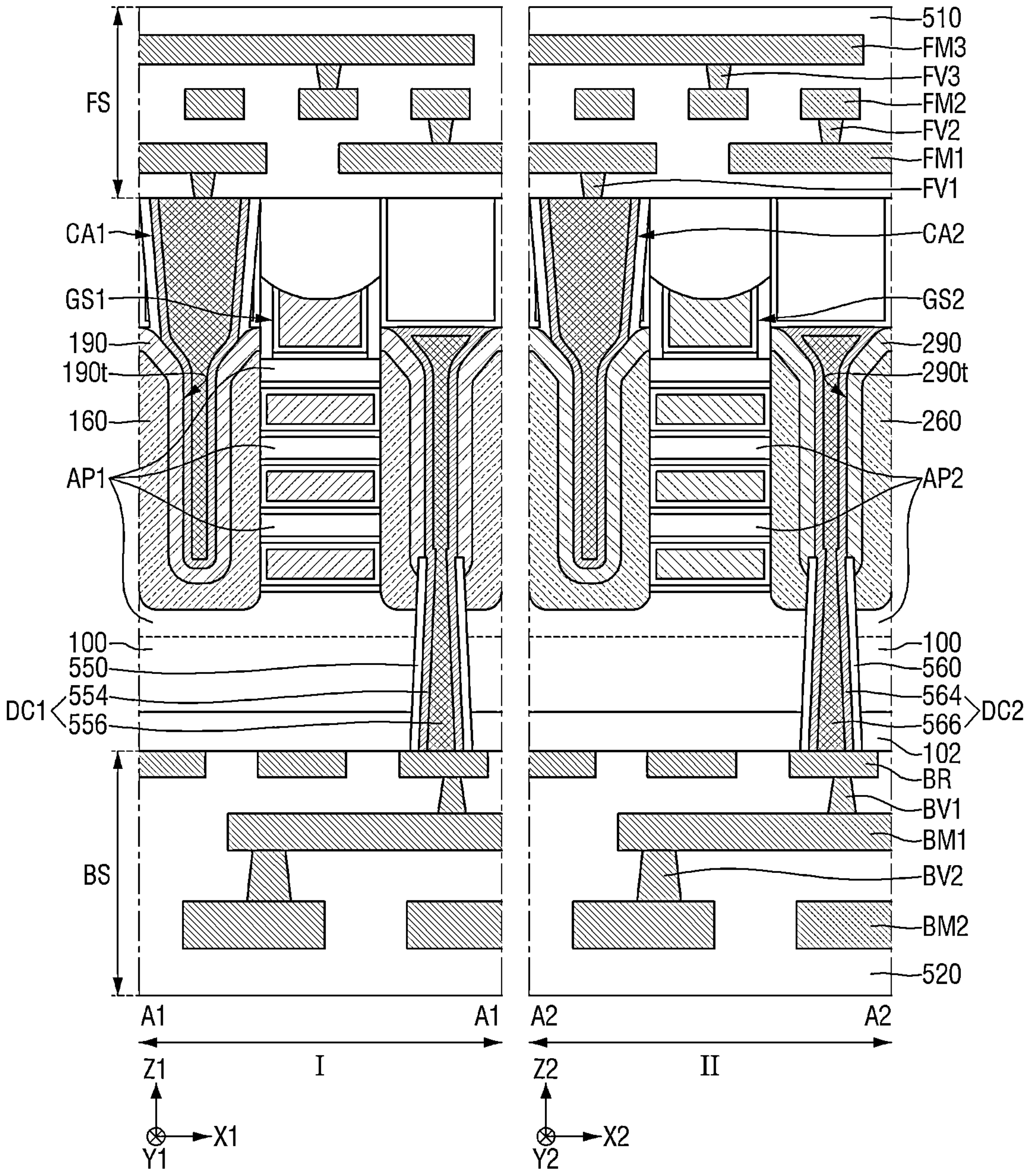

FIGS. 7 and 8 are various cross-sectional views for explaining a semiconductor device according to some example embodiments. For convenience of explanation, repeated parts of contents explained above using FIGS. 1 to 6 will be briefly explained or omitted.

Referring to FIGS. 7 and 8, the semiconductor device according to some example embodiments further includes a front wiring structure FS and a back wiring structure BS.

The front wiring structure FS may be disposed on a front side of the substrate 100 on which the first active pattern AP1 and the second active pattern AP2 are formed. For example, the front wiring structure FS may be formed on the interlayer insulating film 180. The back wiring structure BS may be disposed on a back side of the substrate 100 opposite to the front side of the substrate 100.

The front wiring structure FS may include a front inter-wiring insulating film 510, a plurality of front wiring patterns FM1 to FM3, and a plurality of front via patterns FV1 to FV3. The front wiring patterns FM1 to FM3 may be sequentially stacked on the interlayer insulating film 180. The front via patterns FV1 to FV3 may interconnect the front wiring patterns FM1 to FM3. The front wiring patterns FM1 to FM3 and the front via patterns FV1 to FV3 may be insulated from each other by the front inter-wiring insulating films 510, respectively. The number of layers, number, placement, and the like of the front inter-wiring insulating film 510, the front wiring patterns FM1 to FM3, and the front via patterns FV1 to FV3 are merely exemplary, and are not limited to those shown in the drawings.

The front wiring structure FS may provide a signal line and/or a power source line for various electronic elements formed on the substrate 100 (e.g., PFET on the first region I and/or NFET on the second region II). As an example, the first front via pattern FV1 of the front wiring structure FS may be connected to the first source/drain contact CA1 and/or the second source/drain contact CA2.

Although it is not specifically shown, the front wiring patterns FM1 to FM3 and the front via patterns FV1 to FV3 may each include a barrier conductive film and a filling conductive film. The barrier conductive film may include a metal or metal nitride for preventing diffusion of the filling conductive film. The barrier conductive film may include, for example, but is not limited to, at least one of titanium (Ti), tantalum (Ta), tungsten (W), nickel (Ni), cobalt (Co), platinum (Pt), alloys thereof, and nitrides thereof. The filling conductive film may include, for example, but is not limited to, at least one of aluminum (Al), (Mo), cobalt (Co), ruthenium (Ru), and alloys copper (Cu), tungsten (W), molybdenum thereof.

The back wiring structure BS may include a back inter-wiring insulating film 520, a plurality of back wiring patterns BM1 and BM2, and a plurality of back via patterns BV1 and BV2. The back wiring patterns BM1 and BM2 may be sequentially stacked on the back side of the substrate 100. The back via patterns BV1 and BV2 may interconnect the back wiring patterns BM1 and BM2. The back wiring patterns BM1 and BM2 and the back via patterns BV1 and BV2 may be insulated from each other by the back inter-wiring insulating film 520. The number of layers, number, placement, and the like of the back inter-wiring insulating film 520, the back wiring patterns BM1 and BM2, and the back via patterns BV1 and BV2 are merely examples, and are not limited to those shown in the drawings.

In some example embodiments, the back wiring structure BS may provide a power delivery network (PDN) for various electronic elements (e.g., PFET on the first region I and/or NFET on the second region II) formed on the substrate 100. For example, a power supply voltage (e.g., a source voltage $V_{SS}$ or a drain voltage $V_{DD}$) supplied from the outside may be provided to the first epitaxial pattern 160 and/or the second epitaxial pattern through the back wiring structure BS.

Although it is not specifically shown, the back wiring patterns BM1 and BM2 and the back via patterns BV1 and BV2 may each include a barrier conductive film and a filling conductive film. The barrier conductive film may include a metal or metal nitride for preventing diffusion of the filling conductive film. The barrier conductive film may include, for example, but is not limited to, at least one of titanium (Ti), tantalum (Ta), tungsten (W), nickel (Ni), cobalt (Co), platinum (Pt), alloys thereof, and nitrides thereof. The filling conductive film may include, for example, but is not limited to, at least one of aluminum (Al), copper (Cu), tungsten (W), molybdenum (Mo), cobalt (Co), ruthenium (Ru), and alloys thereof.

In some example embodiments, a first lower contact DC1 and a second lower contact DC2 may be further formed. The first lower contact DC1 may electrically connect the back wiring structure BS and the first epitaxial pattern 160, and the second lower contact DC2 may electrically connect the back wiring structure BS and the second epitaxial pattern 260. An externally supplied power supply voltage (e.g., source voltage $V_{SS}$ or drain voltage $V_{DD}$) may be provided to the first epitaxial pattern 160 through the back wiring structure BS and the first lower contact DC1, and may be provided to the second epitaxial pattern 260 through the back wiring structure BS and the second lower contact DC2.

For example, the first lower contact DC1 may extend in the third direction Z1 and penetrate the substrate 100 and a back insulating film 102. The first lower contact DC1 may electrically connect a power rail BR of the back wiring structure BS and the first epitaxial pattern 160. As an example, as shown in FIG. 7, the first lower contact DC1 may penetrate the substrate 100 and the first epitaxial pattern 160, and may be connected to the lower surface of the first silicide pattern 190. As another example, the first lower contact DC1 may penetrate the substrate 100 and the first epitaxial pattern 160 and fill the first silicide trench 190*t*, as shown in FIG. 8.

Also, for example, the second lower contact DC2 may extend in the sixth direction Z2 and penetrate the substrate 100 and the back insulating film 102. The second lower contact DC2 may electrically connect the power rail BR of the back wiring structure BS and the second epitaxial pattern 260. As an example, as shown in FIG. 7, the second lower contact DC2 may penetrate the substrate 100 and the second epitaxial pattern 260, and may be connected to the second silicide pattern 290. As another example, as shown in FIG. 8, the second lower contact DC2 may penetrate the substrate 100 and the second epitaxial pattern 260 and fill the second silicide trench 290*t*.

In some example embodiments, a first contact spacer 550 that extends along the side surface of the first lower contact DC1 may be formed. The first contact spacer 550 may electrically separate the first lower contact DC1 and the substrate 100. In some example embodiments, a second contact spacer 560 that extends along the side surface of the second lower contact DC2 may be formed. The second contact spacer 560 may electrically separate the second lower contact DC2 and the substrate 100. The first contact spacer 550 and the second contact spacer 560 may each include, but is not limited to, at least one of an insulating material, for example, silicon oxide, silicon nitride, silicon oxynitride and combinations thereof.

In some example embodiments, the first lower contact DC1 may include a third barrier metal film 554 and a third metal film 556 that are sequentially stacked on the first silicide pattern 190. In some example embodiments, the second lower contact DC2 may include a fourth barrier metal film 564 and a fourth metal film 566 that are sequentially stacked on the second silicide pattern 290.

The third barrier metal film 554 and the fourth barrier metal film 564 may each include, for example, but is not limited to, a conductive metal nitride such as titanium nitride, tantalum nitride or tungsten nitride. As an example, the third barrier metal film 554 and the fourth barrier metal film 564 may each include titanium nitride (TiN).

A third metal film 556 and a fourth metal film 566 may each include, for example, but is not limited to, metallic materials such as cobalt (Co), titanium (Ti), tantalum (Ta), ruthenium (Ru), tungsten (W) or cobalt tungsten phosphorous (CoWP). As an example, the third metal film 556 and the fourth metal film 566 may each include cobalt (Co).

Figure 9:
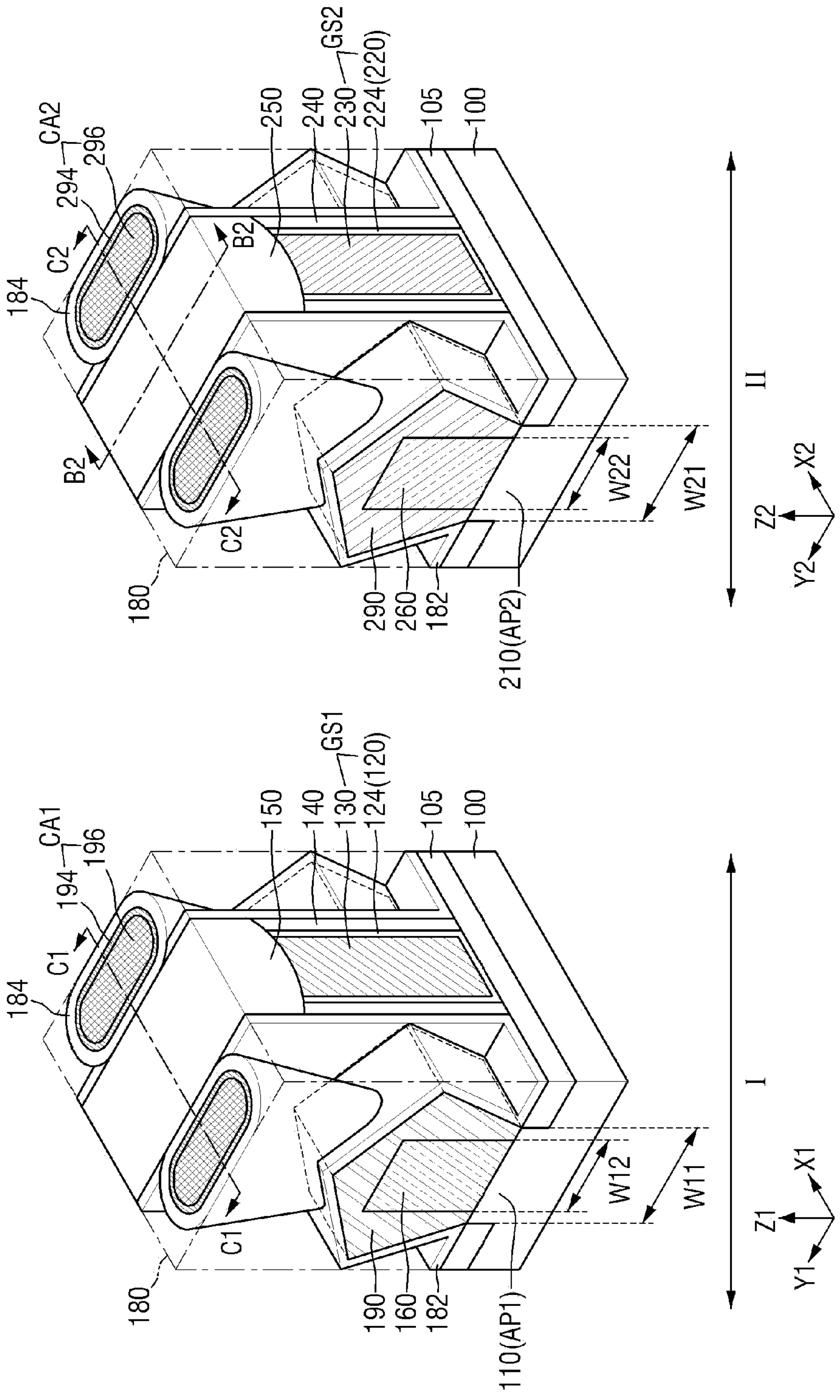
FIG. 9 is a perspective view for explaining a semiconductor device according to an example embodiment.
Figure 10:
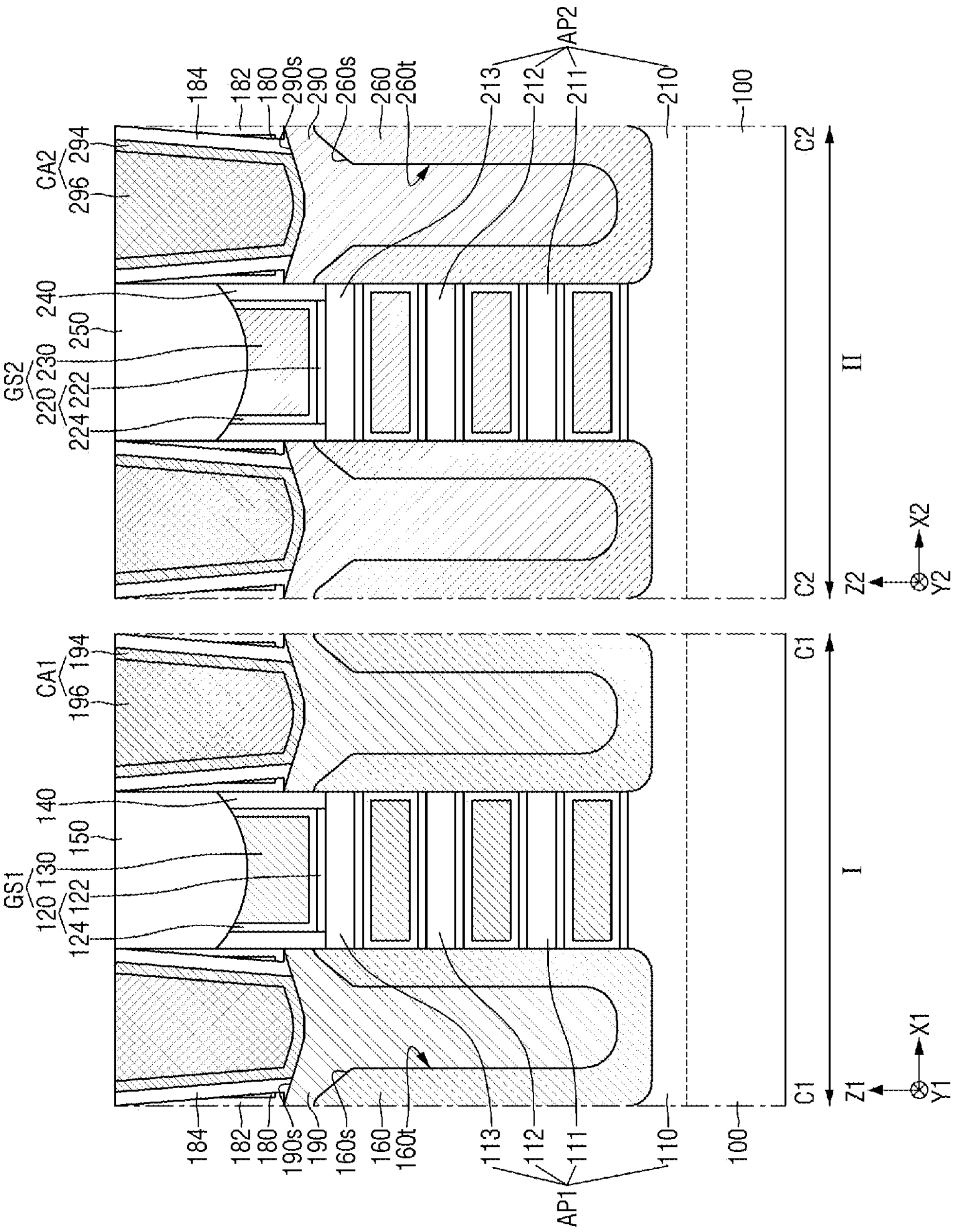
FIG. 10 is a cross-sectional view taken along C1-C1 and C2-C2 of FIG. 9.

FIG. 9 is a perspective view for explaining a semiconductor device according to an example embodiment. FIG. 10 is a cross-sectional view taken along C1-C1 and C2-C2 of FIG. 9. For convenience of explanation, repeated parts of contents explained above using FIGS. 1 to 8 will be briefly explained or omitted.

Referring to FIGS. 9 and 10, in the semiconductor device according to an example embodiments, sizes (width and height) of the first epitaxial pattern 160 are smaller than those of the first active pattern AP1, or sizes (width and height) of the second epitaxial pattern 260 are smaller than those of the second active pattern AP2.

For example, the width (W12 of FIG. 9) of the first epitaxial pattern 160 in the second direction Y1 may be smaller than the width (W11 of FIG. 9) of the first active pattern AP1. In some example embodiments, the height of the uppermost part of the first epitaxial pattern 160 may be lower than the upper surface of the uppermost bridge pattern (e.g., the third bridge pattern 113). In some example embodiments, the first sloped surface 160*s* may extend from a position higher than the upper surface of the uppermost bridge pattern (e.g., the third bridge pattern 113).

Further, for example, the width (W22 of FIG. 9) of the second epitaxial pattern 260 in the fifth direction Y2 may be smaller than the width (W21 of FIG. 9) of the second active pattern AP2. In some example embodiments, the height of the uppermost part of the second epitaxial pattern 260 may be lower than the upper surface of the uppermost bridge pattern (e.g., the sixth bridge pattern 213). In some example embodiments, the second sloped surface 260*s* may extend from a position higher than the upper surface of the uppermost bridge pattern (e.g., the sixth bridge pattern 213).

Although both the size of the first epitaxial pattern 160 and the size of the second epitaxial pattern 260 are only shown as being smaller than those of the first active pattern AP1 and the second active pattern AP2, this is merely an example. As another example, only the size of the first epitaxial pattern 160 may be smaller than that of the first active pattern AP1, or only the size of the second epitaxial pattern 260 may be smaller than that of the second active pattern AP2.

Figure 11:
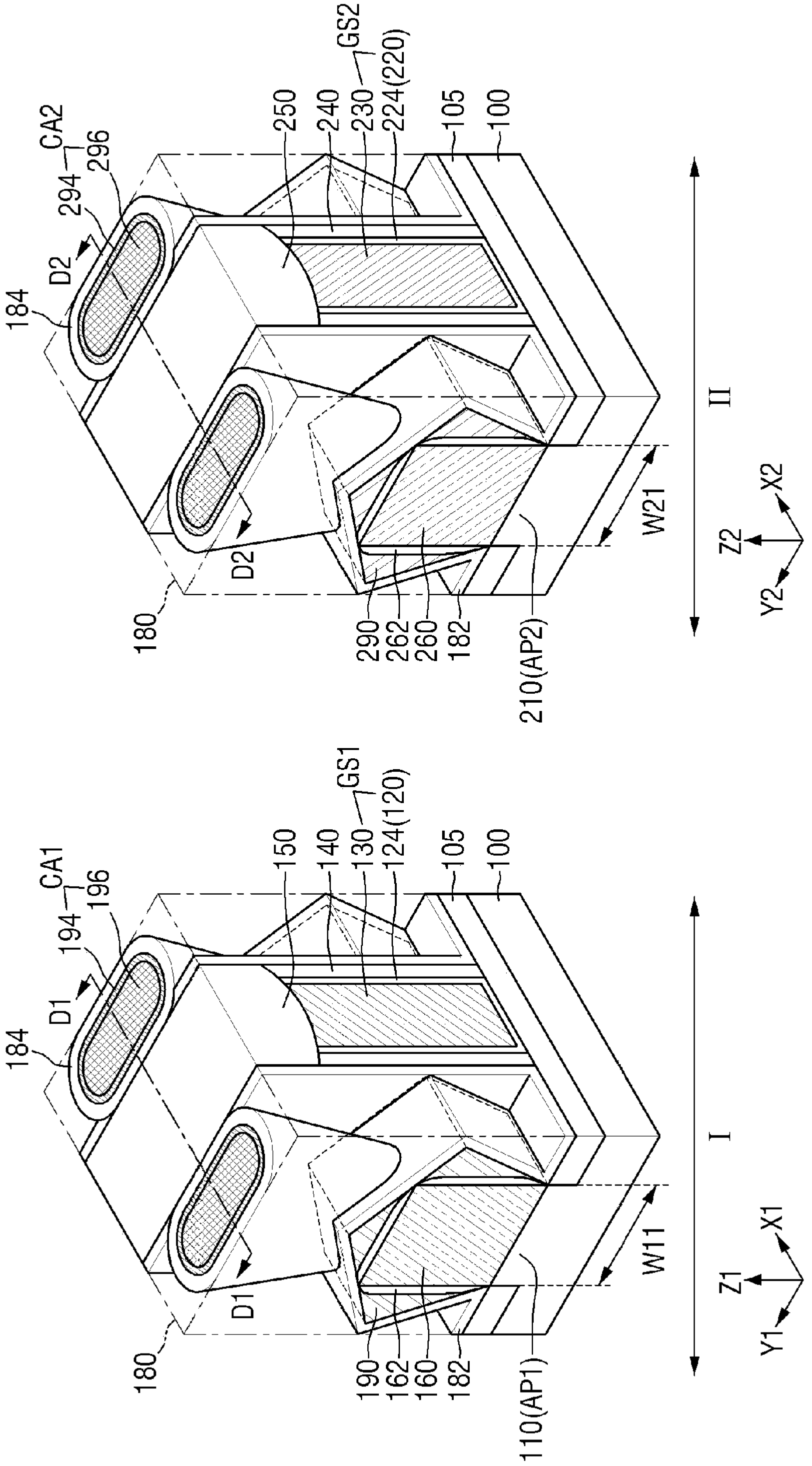
FIG. 11 is a perspective view for explaining a semiconductor device according to an example embodiment.
Figure 12:
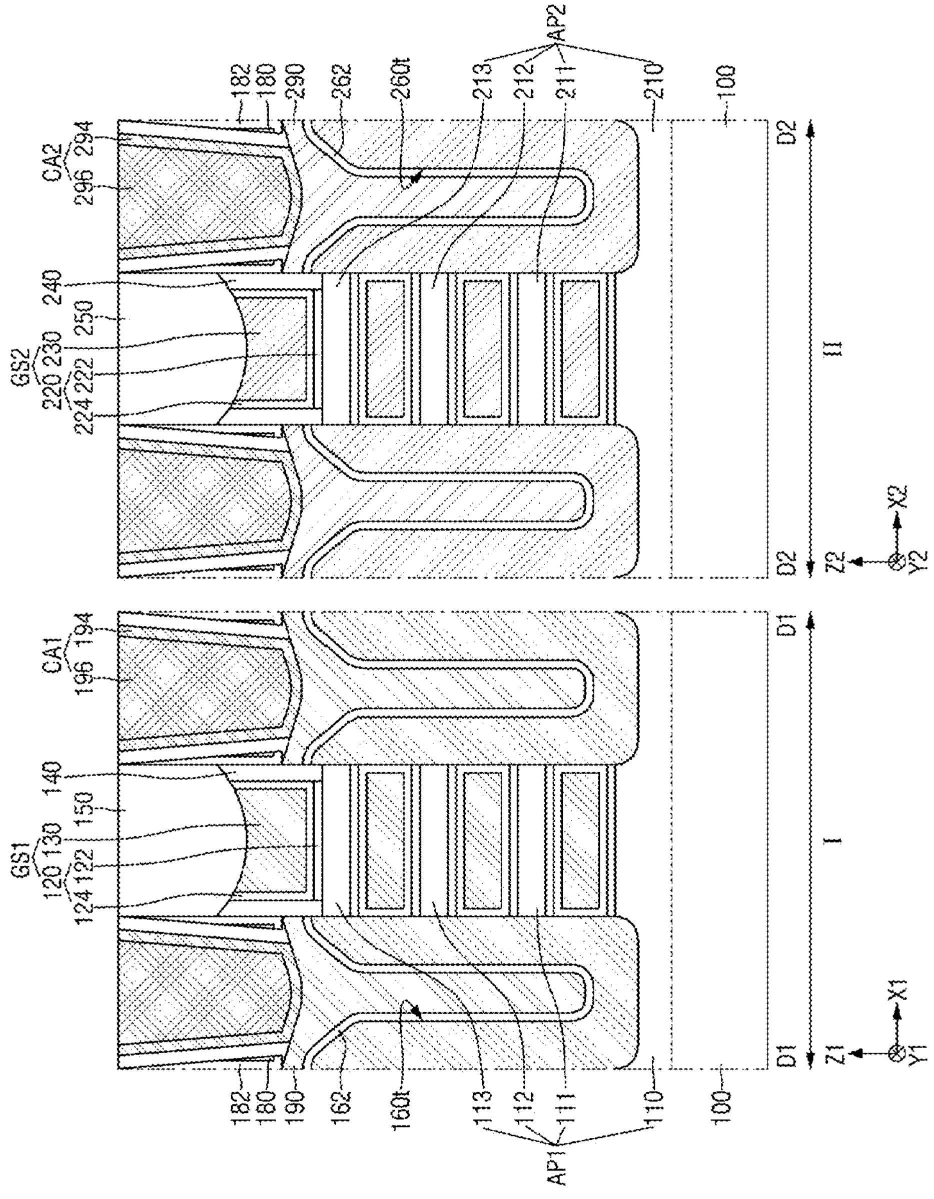
FIG. 12 is a cross-sectional view taken along D1-D1 and D2-D2 of FIG. 11.

FIG. 11 is a perspective view for explaining a semiconductor device according to an example embodiment. FIG. 12 is a cross-sectional view taken along D1-D1 and D2-D2 of FIG. 11. For convenience of explanation, repeated parts of contents explained above using FIGS. 1 to 8 will be briefly explained or omitted.

Referring to FIGS. 11 and 12, the semiconductor device according to an example embodiment further includes a first blocking film 162 or a second blocking film 262.

The first blocking film 162 may be interposed between the first epitaxial pattern 160 and the first silicide pattern 190. The first blocking film 162 may surround the outer circumferential surface of the first epitaxial pattern 160. The first silicide pattern 190 may surround the outer circumferential surface of the first blocking film 162. For example, as shown in FIG. 11, the first blocking film 162 may cover the side surface and upper surface of the first epitaxial pattern 160, and the first silicide pattern 190 may cover the side surface and upper surface of the first blocking film 162. In some example embodiments, the first blocking film 162 may include an epitaxial layer grown from first epitaxial pattern 160 by an epitaxial growth method. The thickness of the first blocking film 162 may be, for example, but is not limited to, about 1 nm to about 5 nm.

The second blocking film 262 may be interposed between the second epitaxial pattern 260 and the second silicide pattern 290. The second blocking film 262 may surround the outer circumferential surface of the second epitaxial pattern 260. The second silicide pattern 290 may surround the outer circumferential surface of the second blocking film 262. For example, as shown in FIG. 11, the second blocking film 262 may cover the side surface and upper surface of the second epitaxial pattern 260, and the second silicide pattern 290 may cover the side surface and upper surface of the second blocking film 262. In some example embodiments, the second blocking film 262 may include an epitaxial layer grown from the second epitaxial pattern 260 by an epitaxial growth method. The thickness of the second blocking film 262 may be, for example, but is not limited to, about 1 nm to about 5 nm.

In some example embodiments, the first blocking film 162 and the second blocking film 262 may each include silicon (Si). In some example embodiments, the first blocking film 162 may further include the first impurity. For example, the first blocking film 162 may include a silicon film doped with the first impurity (e.g., boron (B), indium (In), gallium (Ga) and/or aluminum (Al)). In some example embodiments, the second blocking film 262 may further include the second impurity. For example, the second blocking film 262 may include a silicon film doped with the second impurity (e.g., phosphorus (P), arsenic (As) and/or antimony (Sb)).

Although a case in which both the first blocking film 162 and the second blocking film 262 are formed is only shown, this is merely an example, and one of the first blocking film 162 and the second blocking film 262 may be omitted.

Figure 13:
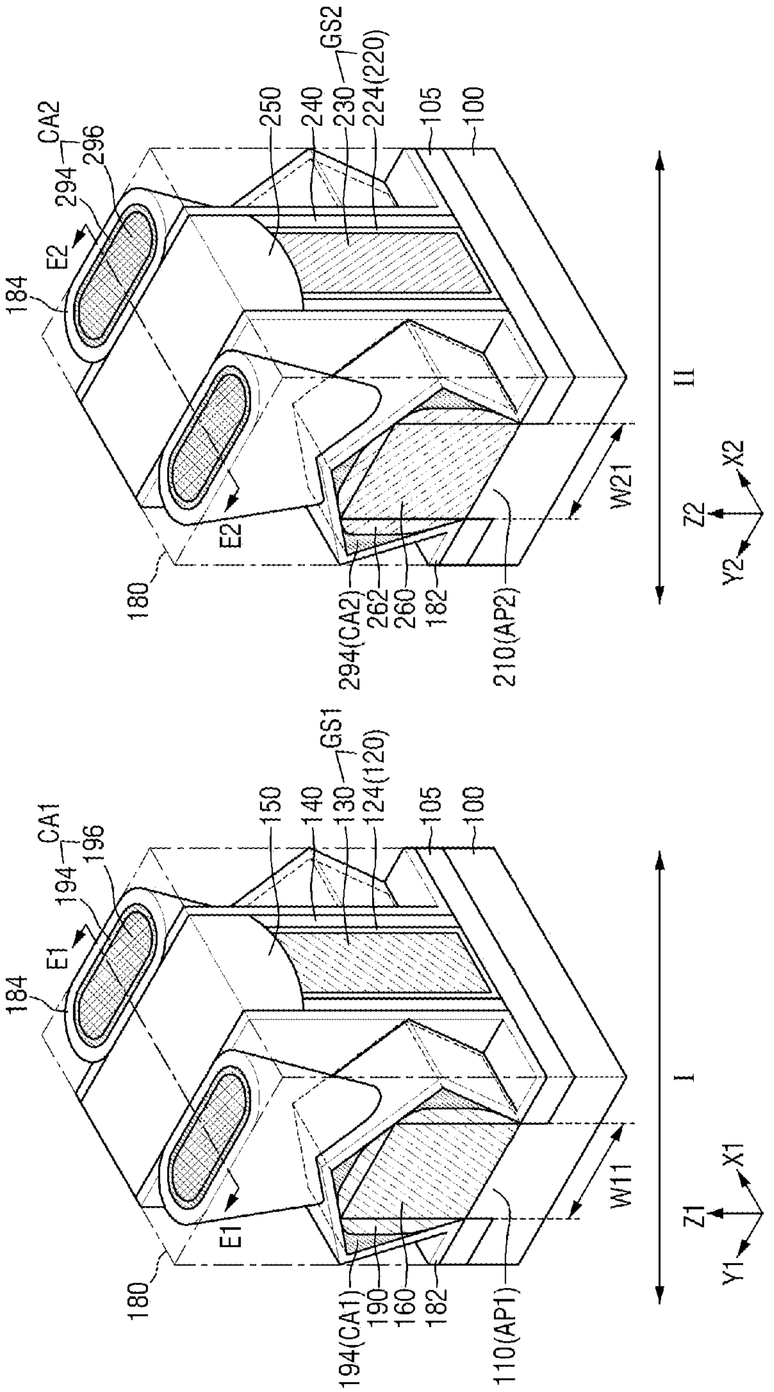
FIG. 13 is a perspective view for explaining a semiconductor device according to an example embodiment.
Figure 14:
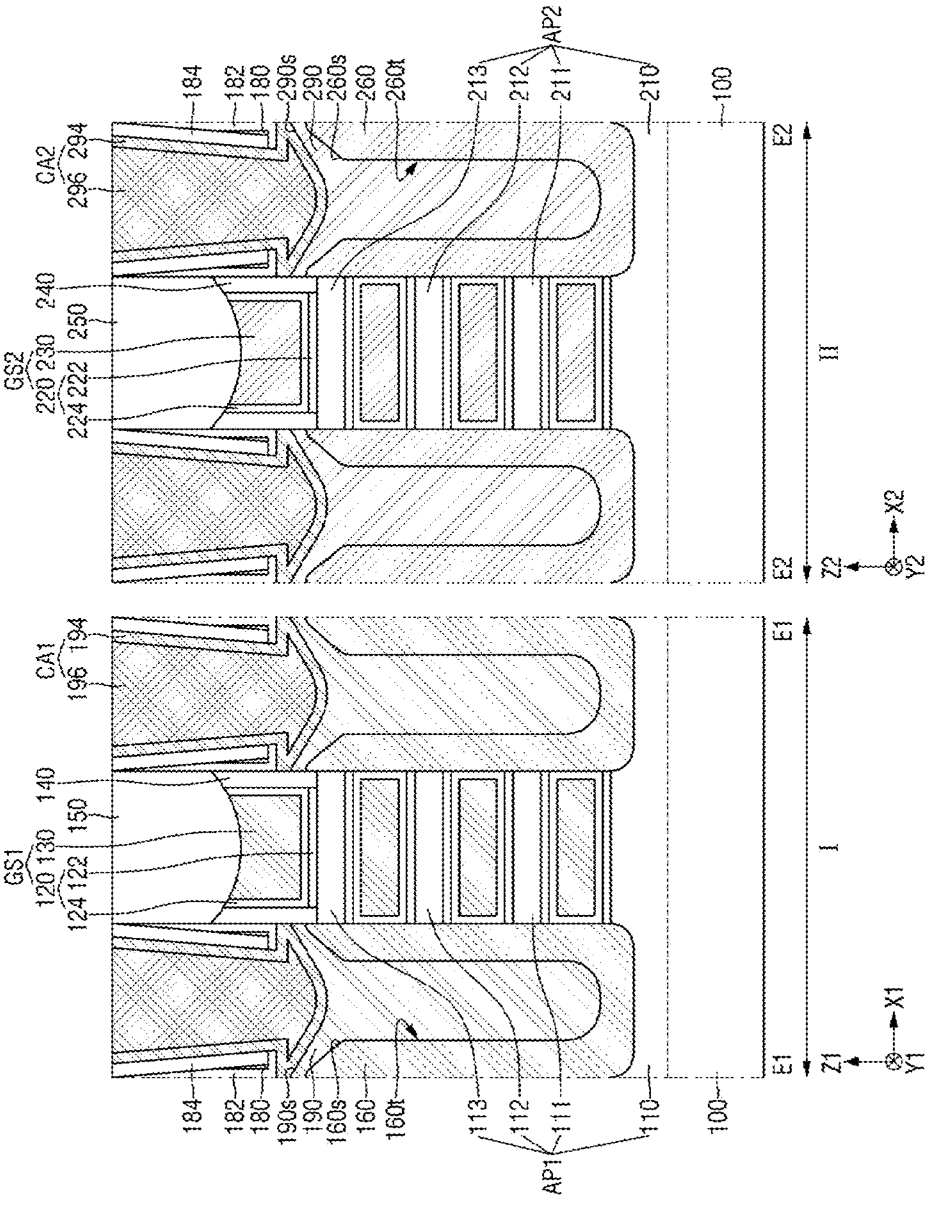
FIG. 14 is a cross-sectional view taken along E1-E1 and E2-E2 of FIG. 13.

FIG. 13 is a perspective view for explaining a semiconductor device according to an example embodiment. FIG. 14 is a cross-sectional view taken along E1-E1 and E2-E2 of FIG. 13. For convenience of explanation, repeated parts of contents explained above using FIGS. 1 to 8 will be briefly explained or omitted.

Referring to FIGS. 13 and 14, in the semiconductor device according to an example embodiment, a part of the first source/drain contact CA1 is interposed between the first silicide pattern 190 and the first liner film 182, and/or a part of the second source/drain contact CA2 is interposed between the second silicide pattern 290 and the first liner film 182.

For example, the lower part of the first source/drain contact CA1 may cover a part of the side surface and/or the upper surface of the first silicide pattern 190. The first liner film 182 may conformally extend along the surface of the first silicide pattern 190 and the lower part of the first source/drain contact CA1.

Further, the lower part of the second source/drain contact CA2 may cover a part of the side surface and/or the upper surface of the second silicide pattern 290. The first liner film 182 may conformally extend along the surface of the second silicide pattern 290 and the surface of the lower part of the second source/drain contact CA2.

Although a case in which the first source/drain contact CA1 is interposed between the first silicide pattern 190 and the first liner film 182, and the second source/drain contact CA2 is interposed between the second silicide pattern 290 and the first liner film 182 is only shown, this is merely an example. As another example, the first source/drain contact CA1 may not be interposed between the first silicide pattern 190 and the first liner film 182, or the second source/drain contact CA2 may not be interposed between the second silicide pattern 290 and the first liner film 182.

A method for fabricating a semiconductor device according to an example embodiment will be described below with reference to FIGS. 1 to 36.

FIGS. 15 to 36 are intermediate step diagrams for explaining a method for fabricating the semiconductor device according to an example embodiment. For convenience of explanation, repeated parts of contents explained above using FIGS. 1 to 14 will be briefly explained or omitted.

Figure 15:
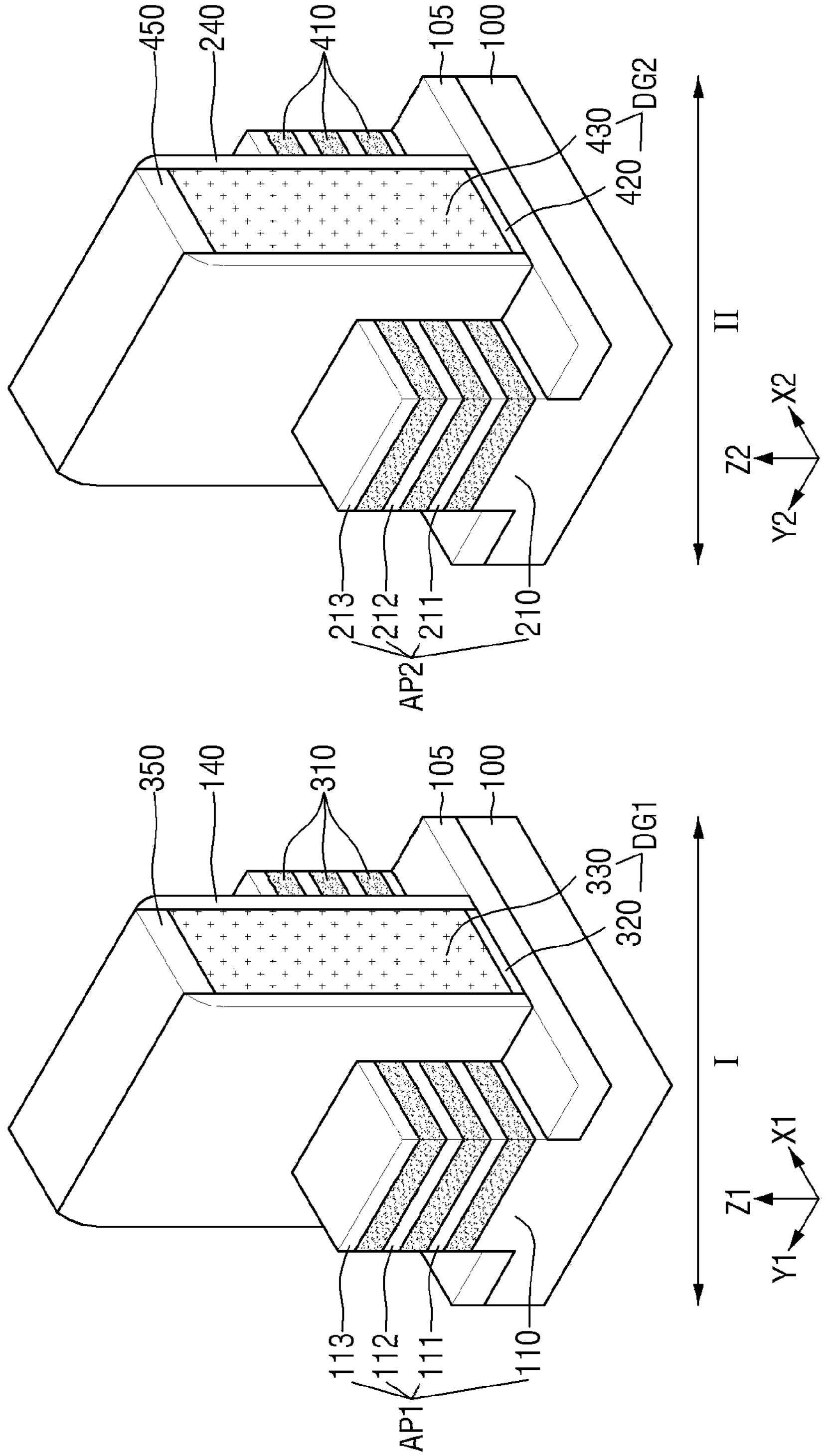
FIGS. 15 to 36 are intermediate step diagrams for explaining the method for fabricating the semiconductor device according to an example embodiment.

Referring to FIG. 15, the first active pattern AP1, the first sacrificial pattern 310, the first dummy gate structure DG1, and the first gate spacer 140 are formed on the first region I of the substrate 100, and the second active pattern AP2, the second sacrificial pattern 410, the second dummy gate structure DG2 and the second gate spacer 240 are formed on the region II of the substrate 100.

For example, a first material film and a second material film alternately stacked on the first region I and the second region II of the substrate 100 may be formed. Subsequently, a patterning process of patterning the first material film and the second material film may be performed.

The first material film patterned in the first region I may form the first sacrificial pattern 310, and the second material film patterned in the first region I may form first to third bridge patterns 111 to 113 which are alternately disposed with the first sacrificial pattern 310. Further, the first material film patterned in the second region II may form the second sacrificial pattern 410, and the second material film patterned in the second region II may form fourth to sixth bridge patterns 211 to 213 which are alternately stacked with the second sacrificial pattern 410.

The sacrificial patterns 310 and 410 may have etch selectivity with respect to the bridge patterns 111 to 113 and 211 to 213. As an example, the bridge patterns 111 to 113 and 211 to 213 may each include silicon (Si), and the sacrificial patterns 310 and 410 may each include silicon germanium (SiGe).

In some example embodiments, a part of the substrate 100 may be etched to form the first fin pattern 110 and the second fin pattern 210 in the process of patterning the first material film and the second material film. The field insulating film 105 may then be formed on the substrate 100. The field insulating film 105 may cover at least a part of the side surface of the first fin pattern 110 and at least a part of the side surface of the second fin pattern 210.

Subsequently, the first dummy gate structure DG1 may be formed on the first active pattern AP1 and the first sacrificial pattern 310, and the second dummy gate structure DG2 may be formed on the second active pattern AP2 and the second sacrificial pattern 410.

The first dummy gate structure DG1 and the second dummy gate structure DG2 may extend along the upper side of the substrate 100 and the upper surface of the field insulating film 105, respectively. The first dummy gate structure DG1 may intersect the first active pattern AP1. For example, the first dummy gate structure DG1 may extend in the second direction Y1. The second dummy gate structure DG2 may intersect the second active pattern AP2. For example, the second dummy gate structure DG2 may extend in the fifth direction Y2.

In some example embodiments, the first dummy gate structure DG1 may include a first dummy gate dielectric film 320 and a first dummy gate electrode 330, and the second dummy gate structure DG2 may include a second dummy gate dielectric film 420 and a second dummy gate electrode 430. For example, a dielectric film and an electrode film that are sequentially stacked on the substrate 100 and the field insulating film 105 may be formed. Subsequently, a first mask pattern 350 extending in the second direction Y1 may be formed on the electrode film on the first region I. Also, a second mask pattern 450 extending in the fifth direction Y2 may be formed on the electrode film on the second region II. Subsequently, a patterning process of patterning the dielectric film and the electrode film using the first mask pattern 350 and the second mask pattern 450 as etching masks may be performed. The dielectric film patterned in the first region I may form the first dummy gate insulating film 320, and the electrode film patterned in the first region I may form the first dummy gate electrode 330. Further, the dielectric film patterned in the second region II may form the second dummy gate insulating film 420, and the electrode film patterned in the second region II may form the second dummy gate electrode 430.

The first dummy gate structure DG1 and the second dummy gate structure DG2 may have etch selectivity different from those of the bridge patterns 111 to 113 and 211 to 213 and the sacrificial patterns 310 and 410. As an example, the first dummy gate electrode 330 and the second dummy gate electrode 430 may each include polysilicon (poly Si).

Subsequently, the first gate spacer 140 and the second gate spacer 240 may be formed. The first gate spacer 140 may be formed on the substrate 100 and the field insulating film 105. The first gate spacer 140 may extend along the side faces of the first dummy gate structure DG1. The second gate spacer 240 may be formed on the substrate 100 and the field insulating film 105. The second gate spacer 240 may extend along the side surface of the second dummy gate structure DG2.

Figure 16:
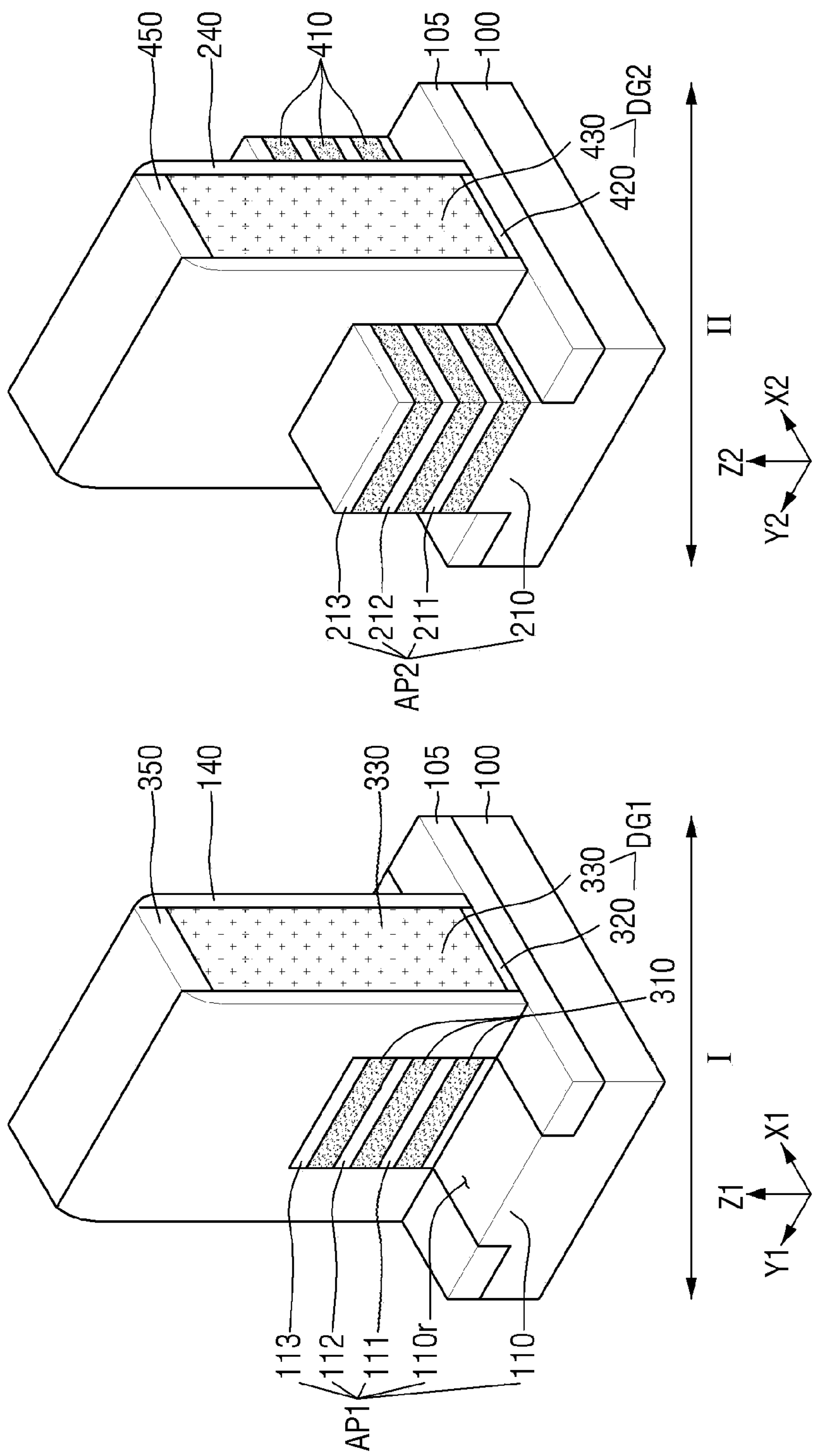

Referring to FIG. 16, a first recess process on the first active pattern AP1 and the first sacrificial pattern 310 is performed.

As the first recess process is performed, a part of the first to third bridge patterns 111 to 113 and a part of the first sacrificial pattern 310 disposed outside the first dummy gate structure DG1 may be removed to form a first recess 110*r*. In some example embodiments, the upper part of the first fin pattern 110 may be removed in the process of forming the first recess 110*r*.

In some example embodiments, a recess process on the first sacrificial pattern 310 may be additionally performed after the first recess 110*r* is formed. Subsequently, an insulating film which fills the recessed first sacrificial pattern 310 may be formed. Accordingly, the internal spacer (145 of FIG. 5) may be formed on the first region I.

Figure 17:
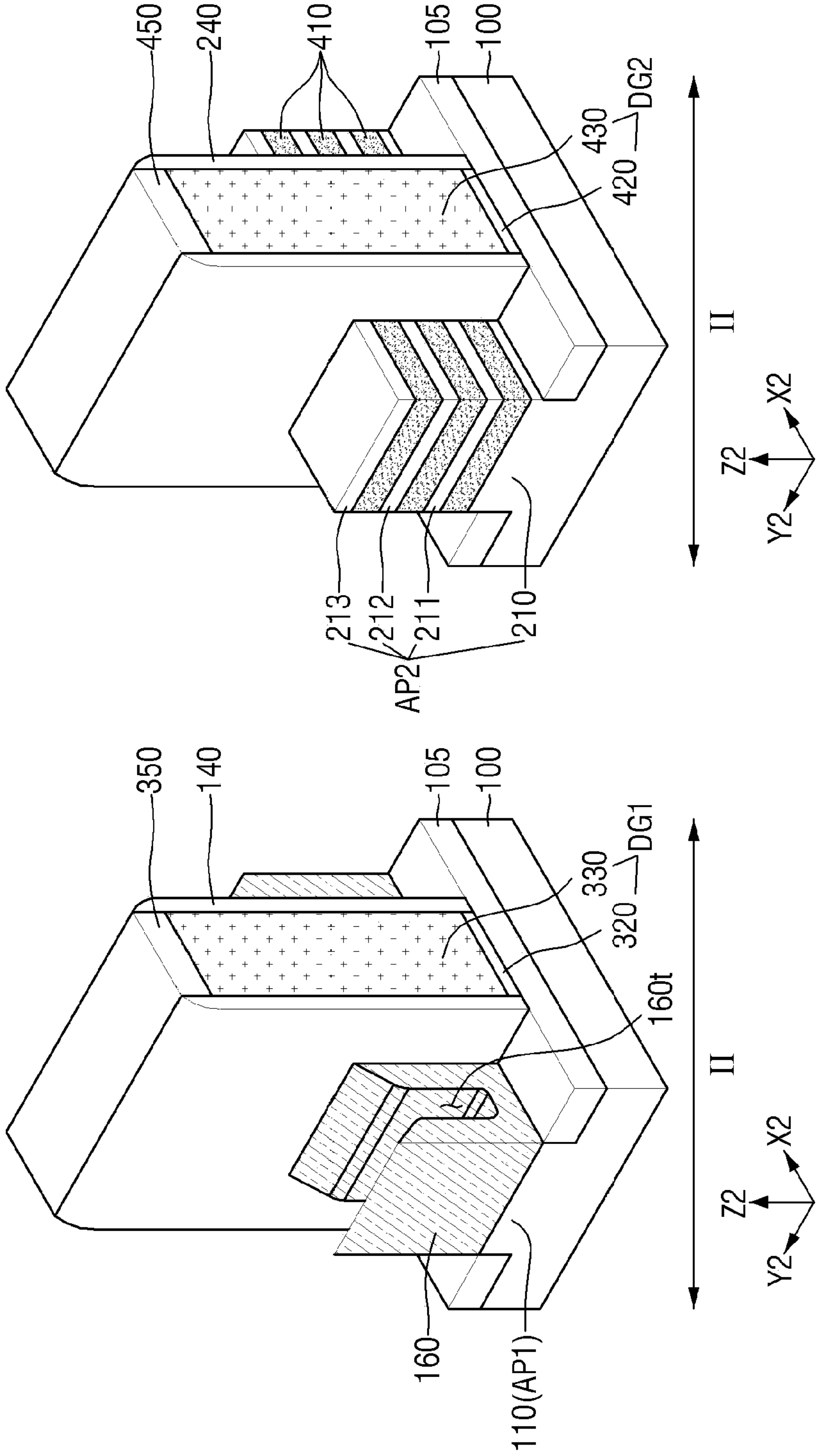

Referring to FIGS. 16 and 17, the first epitaxial pattern 160 is formed in the first recess 110*r*.

The first epitaxial pattern 160 may partially fill the first recess 110*r*. The first epitaxial pattern 160 may be formed by an epitaxial growth method that uses the first active pattern AP1 as a seed layer. Accordingly, the first epitaxial pattern 160 connected to the first active pattern AP1 may be formed.

The first epitaxial pattern 160 may include a first epitaxial trench 160*t*. For example, the thickness of the first epitaxial pattern 160 may be formed so as not to completely fill the first recess 110*r*. Accordingly, the first epitaxial pattern 160 having a 'U' shape may be formed in a cross-section that intersects the second direction Y1.

Figure 18:
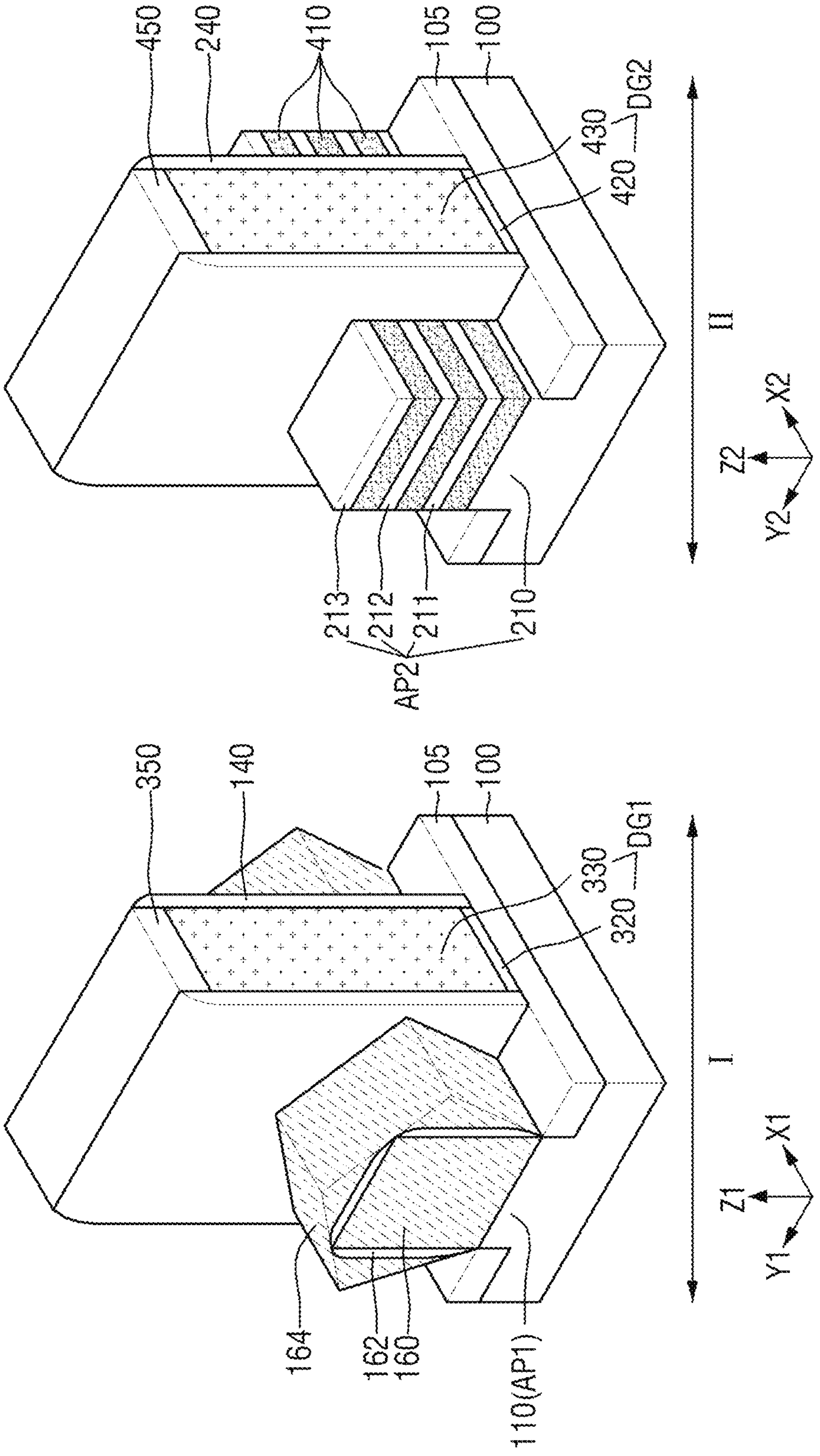

Referring to FIG. 18, a first blocking film 162 and a first sacrificial epitaxial pattern 164 are formed on the first epitaxial pattern 160.

The first blocking film 162 may surround the outer circumferential surface of the first epitaxial pattern 160. The first blocking film 162 may be formed by an epitaxial growth method that uses the first epitaxial pattern 160 as a seed layer.

The first sacrificial epitaxial pattern 164 may surround the outer circumferential surface of the first blocking film 162. The first sacrificial epitaxial pattern 164 may be formed by an epitaxial growth method that uses the first blocking film 162 as a seed layer. Although the first sacrificial epitaxial pattern 164 is shown to be a pentagonal shape in a cross-section that intersects the first direction X1, this is merely an example. It goes without saying that the cross-section of the first sacrificial epitaxial pattern 164 may vary depending on the epitaxial growth conditions.

The first sacrificial epitaxial pattern 164 may have an etch selectivity with respect to the first blocking film 162. As an example, the first blocking film 162 may include silicon (Si), and the first sacrificial epitaxial pattern 164 may include silicon germanium (SiGe).

Figure 19:
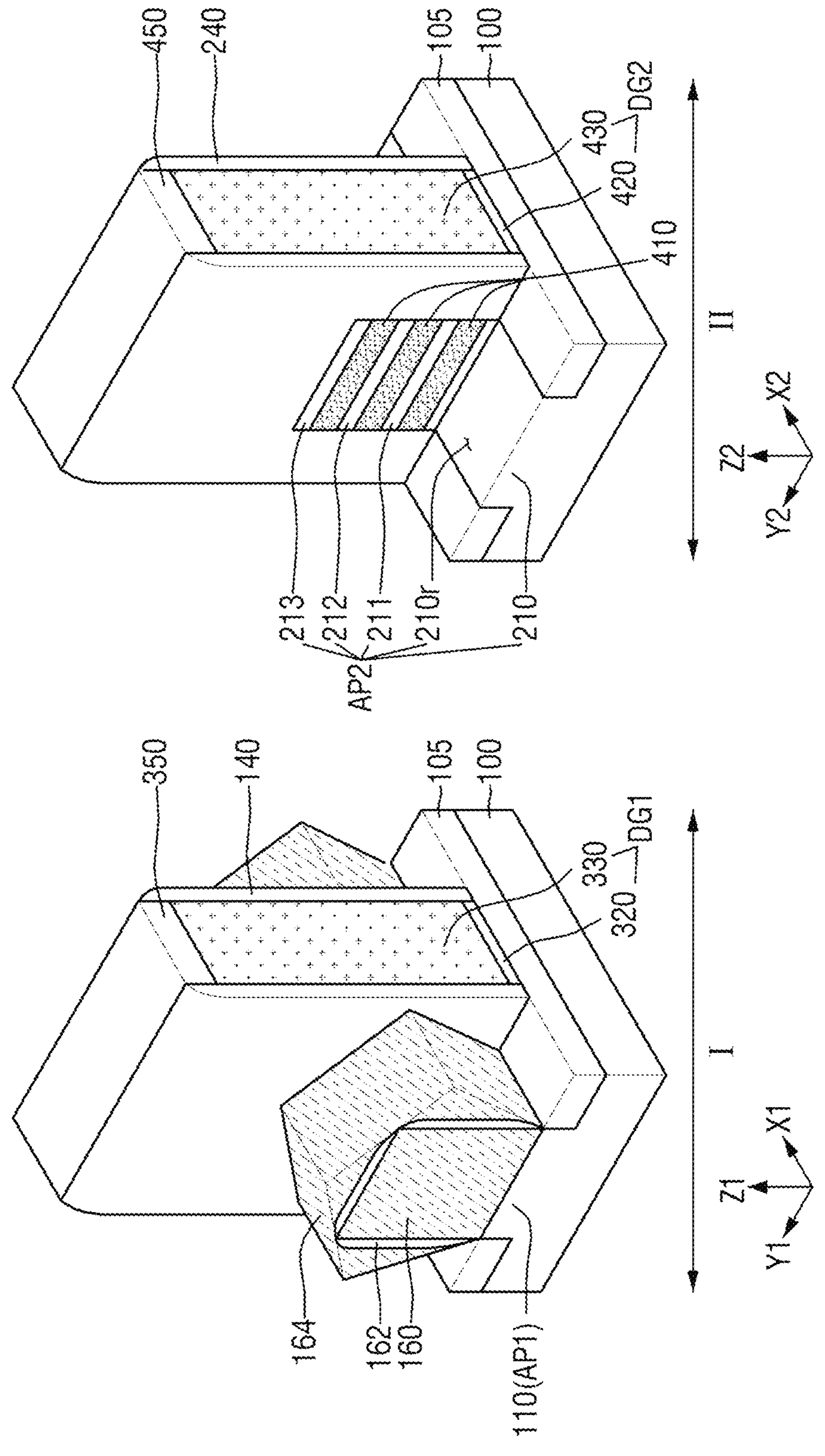

Referring to FIG. 19, a second recess process is performed on the second active pattern AP2 and the second sacrificial pattern 410.

As the second recess process is performed, a part of the fourth to sixth bridge patterns 211 to 213 and a part of the second sacrificial pattern 410 disposed outside the second dummy gate structure DG2 may be removed to form the second recess 210*r*. In some example embodiments, the upper part of the second fin pattern 210 may be removed in the process of forming the second recess 210*r*.

Figure 20:
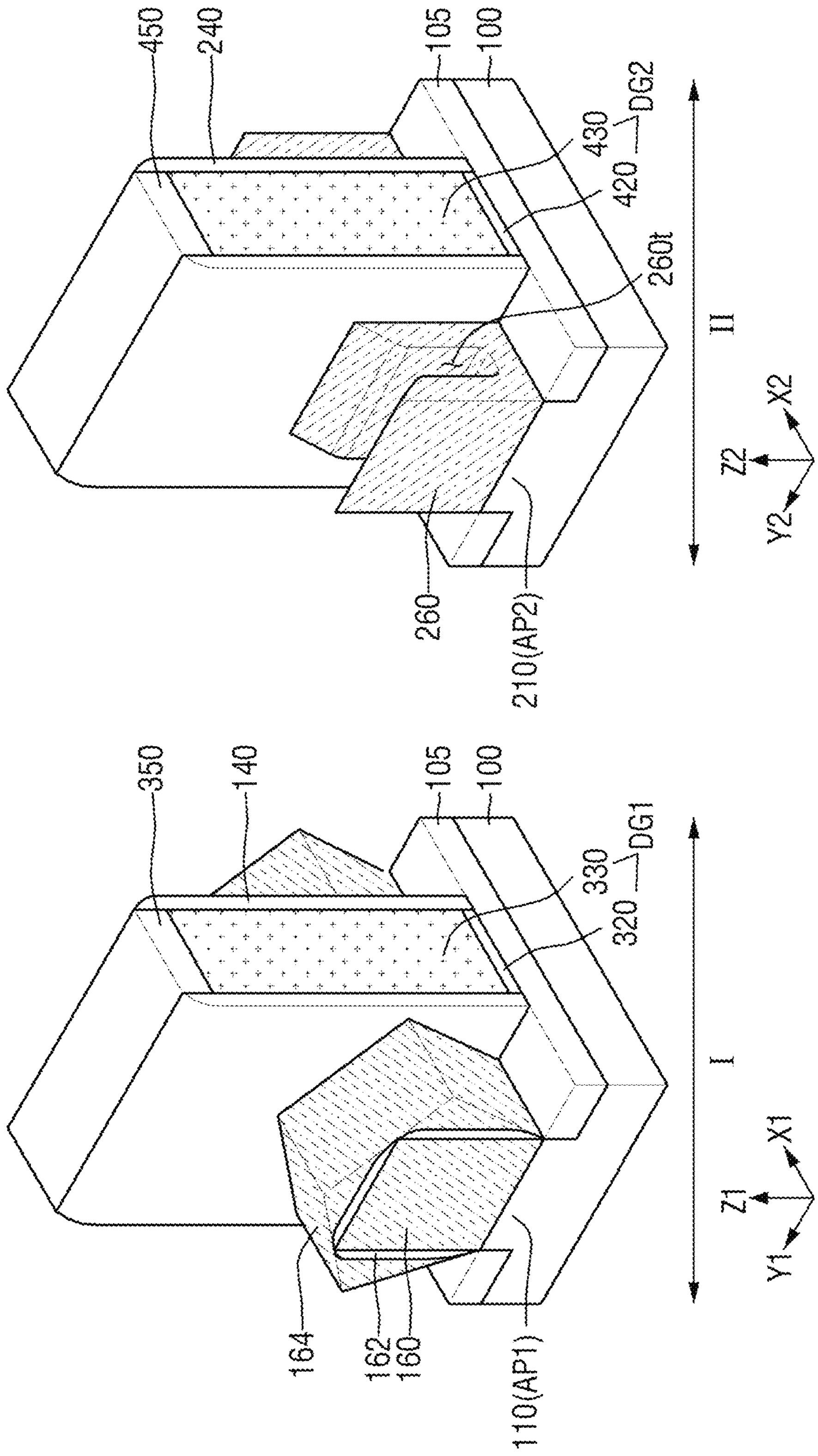

Referring to FIGS. 19 and 20, the second epitaxial pattern 260 is formed in the second recess 210*r*.

The second epitaxial pattern 260 may partially fill the second recess 210*r*. The second epitaxial pattern 260 may be formed by an epitaxial growth method that uses the second active pattern AP2 as a seed layer. Accordingly, the second epitaxial pattern 260 connected to the second active pattern AP2 may be formed.

The second epitaxial pattern 260 may include a second epitaxial trench 260*t*. For example, the thickness of the second epitaxial pattern 260 may be formed so as not to completely fill the second recess 210*r*. Accordingly, the second epitaxial pattern 260 having a 'U' shape may be formed in a cross-section that intersects the fifth direction Y2.

Figure 21:
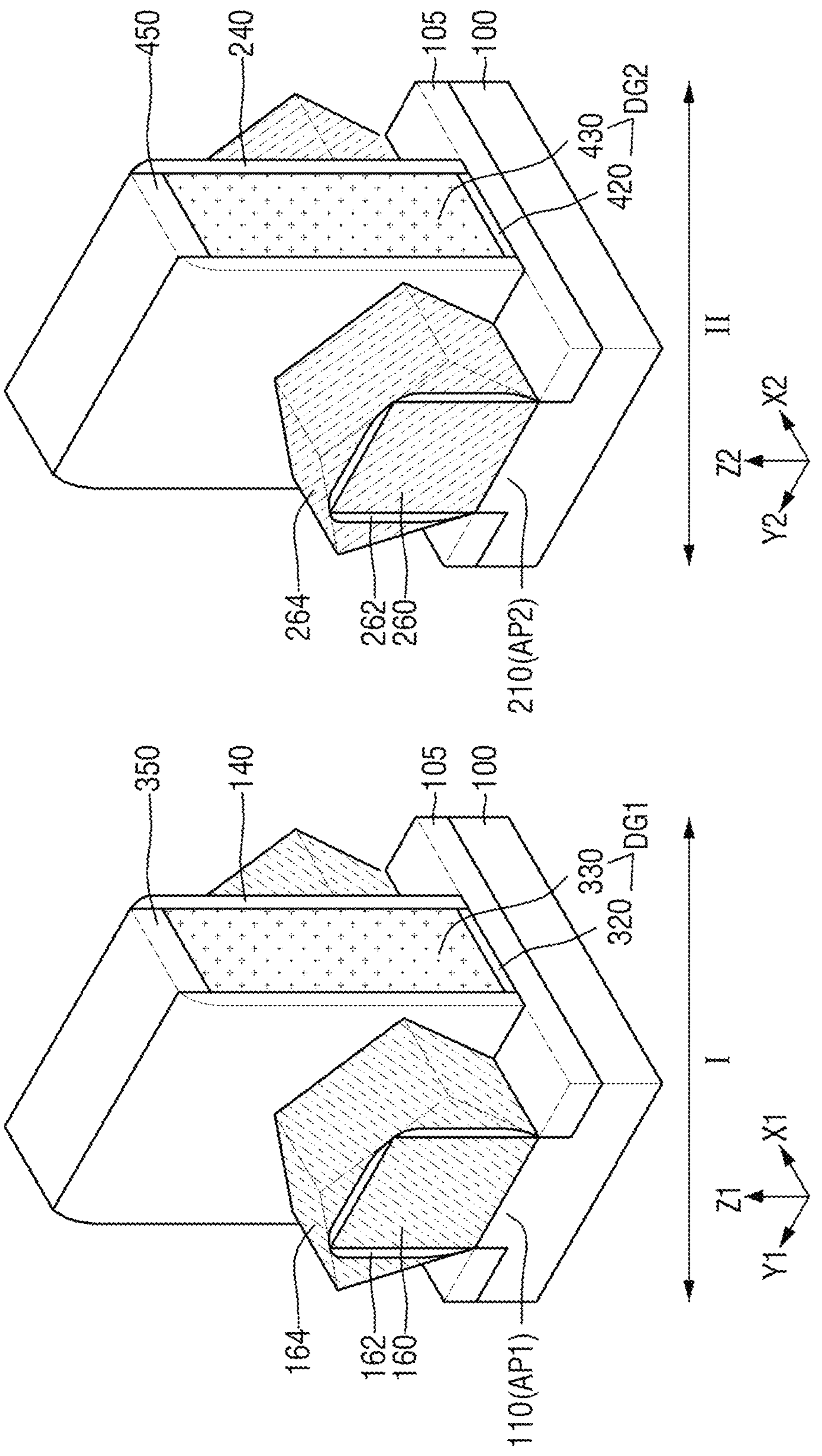

Referring to FIG. 21, a second blocking film 262 and a second sacrificial epitaxial pattern 264 are formed on the second epitaxial pattern 260.

The second blocking film 262 may surround the outer circumferential surface of the second epitaxial pattern 260. The second blocking film 262 may be formed by an epitaxial growth method that uses the second epitaxial pattern 260 as a seed layer.

The second sacrificial epitaxial pattern 264 may surround the outer circumferential surface of the second blocking film 262. The second sacrificial epitaxial pattern 264 may be formed by an epitaxial growth method that uses the second blocking film 262 as a seed layer. Although the second sacrificial epitaxial pattern 264 is shown to be a pentagonal shape in a cross-section that intersects the fourth direction X2, this is merely an example. It goes without saying that the cross-section of the second sacrificial epitaxial pattern 264 may vary depending on the epitaxial growth conditions.

The second sacrificial epitaxial pattern 264 may have an etch selectivity with respect to the second blocking film 262. For example, the second blocking film 262 may include silicon (Si), and the second sacrificial epitaxial pattern 264 may include silicon germanium (SiGe).

Figure 22:
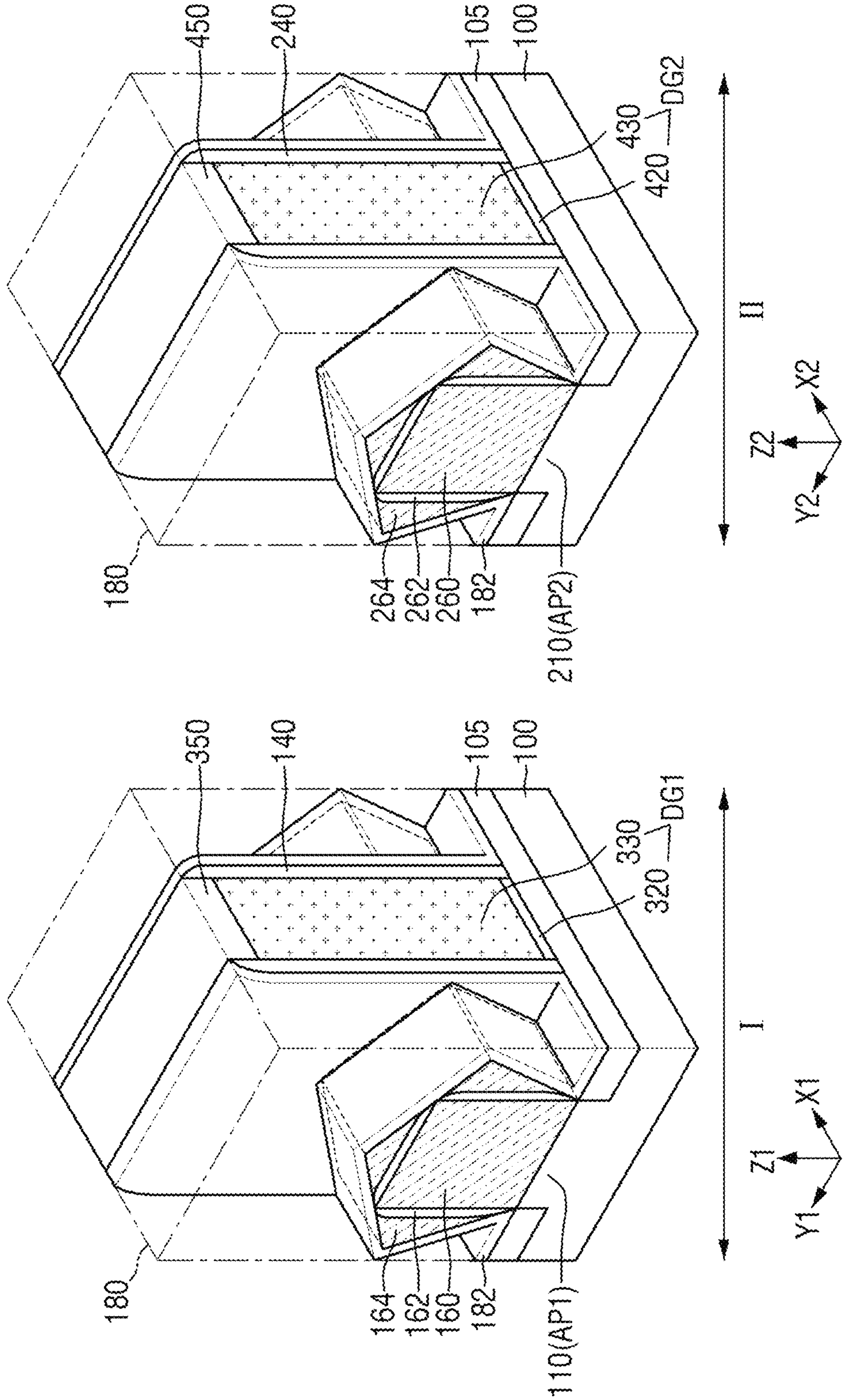

Referring to FIG. 22, the first liner film 182 and the interlayer insulating film 180 are formed.

The first liner film 182 may conformally extend along the profile of the surface of the first sacrificial epitaxial pattern 164 and the surface of the second sacrificial epitaxial pattern 264. The first liner film 182 may further extend along the upper surface of the field insulating film 105, the outer surface of the first gate spacer 140 and the outer surface of the second gate spacer 240. The interlayer insulating film 180 may be formed on the first liner film 182.

Figure 23:
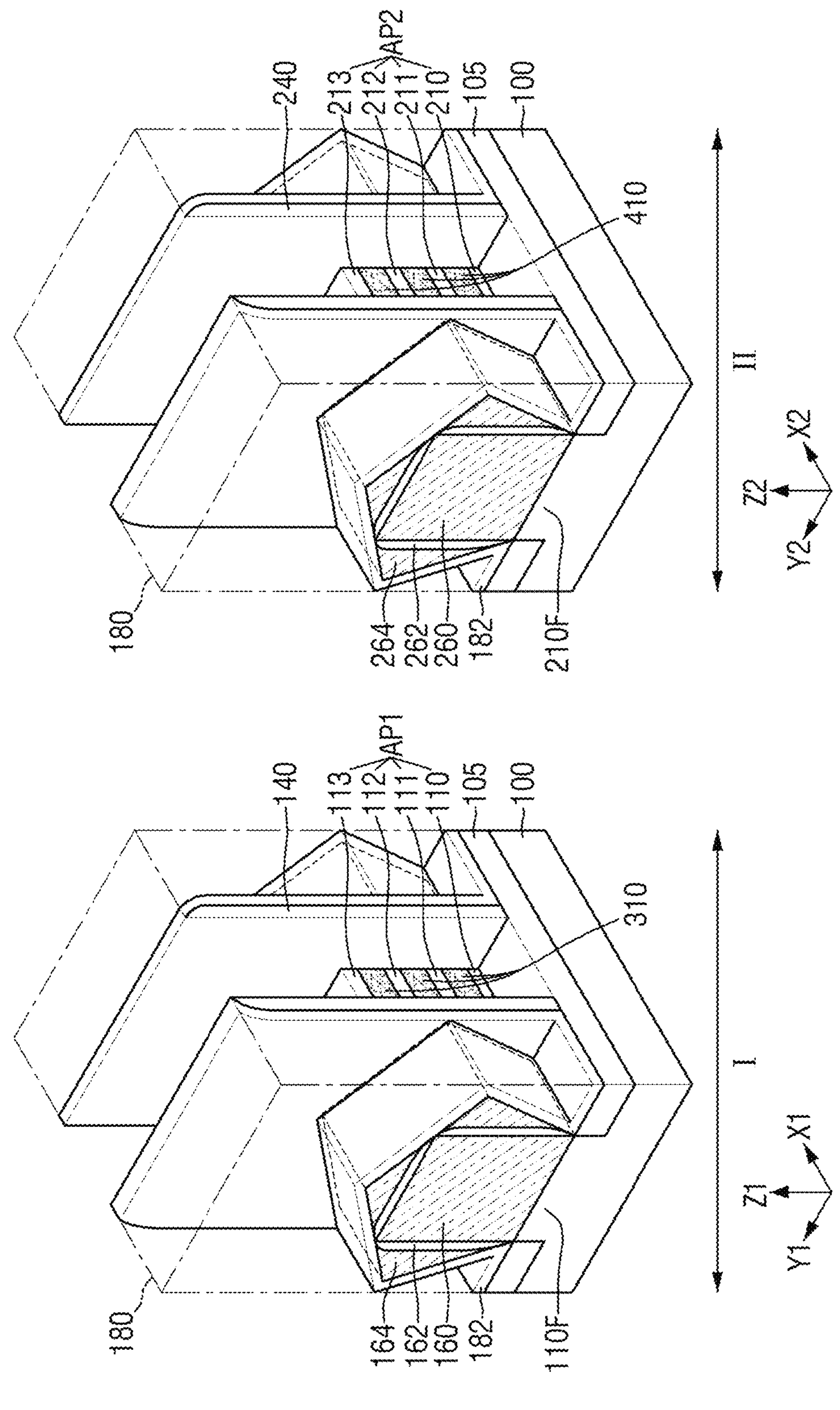

Referring to FIGS. 22 and 23, the first dummy gate structure DG1 and the second dummy gate structure DG2 are removed.

As mentioned above, because the first dummy gate structure DG1 and the second dummy gate structure DG2 have etch selectivity different from those of the bridge patterns 111 to 113 and 211 to 213 and the sacrificial patterns 310 and 410, the first dummy gate structure DG1 and the second dummy gate structure DG2 may be selectively removed. As the first dummy gate structure DG1 is removed, the first active pattern AP1 and the first sacrificial pattern 310 disposed inside the first gate spacer 140 may be exposed. Also, as the second dummy gate structure DG2 is removed, the second active pattern AP2 and the second sacrificial pattern 410 disposed inside the second gate spacer 240 may be exposed.

Figure 24:
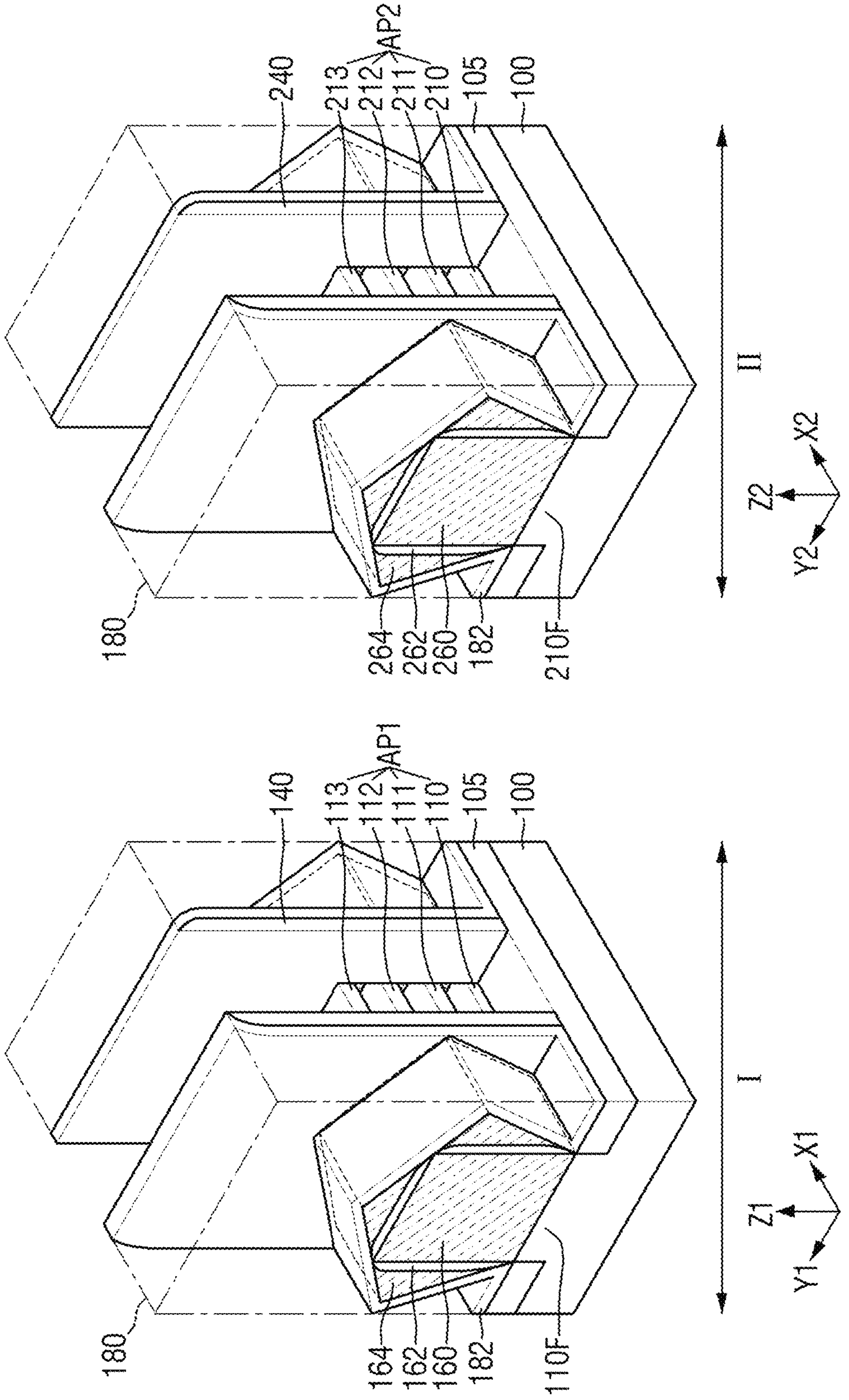

Referring to FIGS. 23 and 24, the first sacrificial pattern 310 and the second sacrificial pattern 410 are removed.

As mentioned above, since the bridge patterns 111 to 113 and 211 to 213 and the sacrificial patterns 310 and 410 may have etch selectivity different from each other, the first sacrificial pattern 310 and the second sacrificial pattern 410 may be selectively removed. As the first sacrificial pattern 310 and the second sacrificial pattern 410 are removed, the first to third bridge patterns 111 to 113 spaced apart from each other may be formed on the first region I of the substrate 100, and fourth to sixth bridge patterns 211 to 213 spaced apart from each other may be formed on the second region II.

Figure 25:
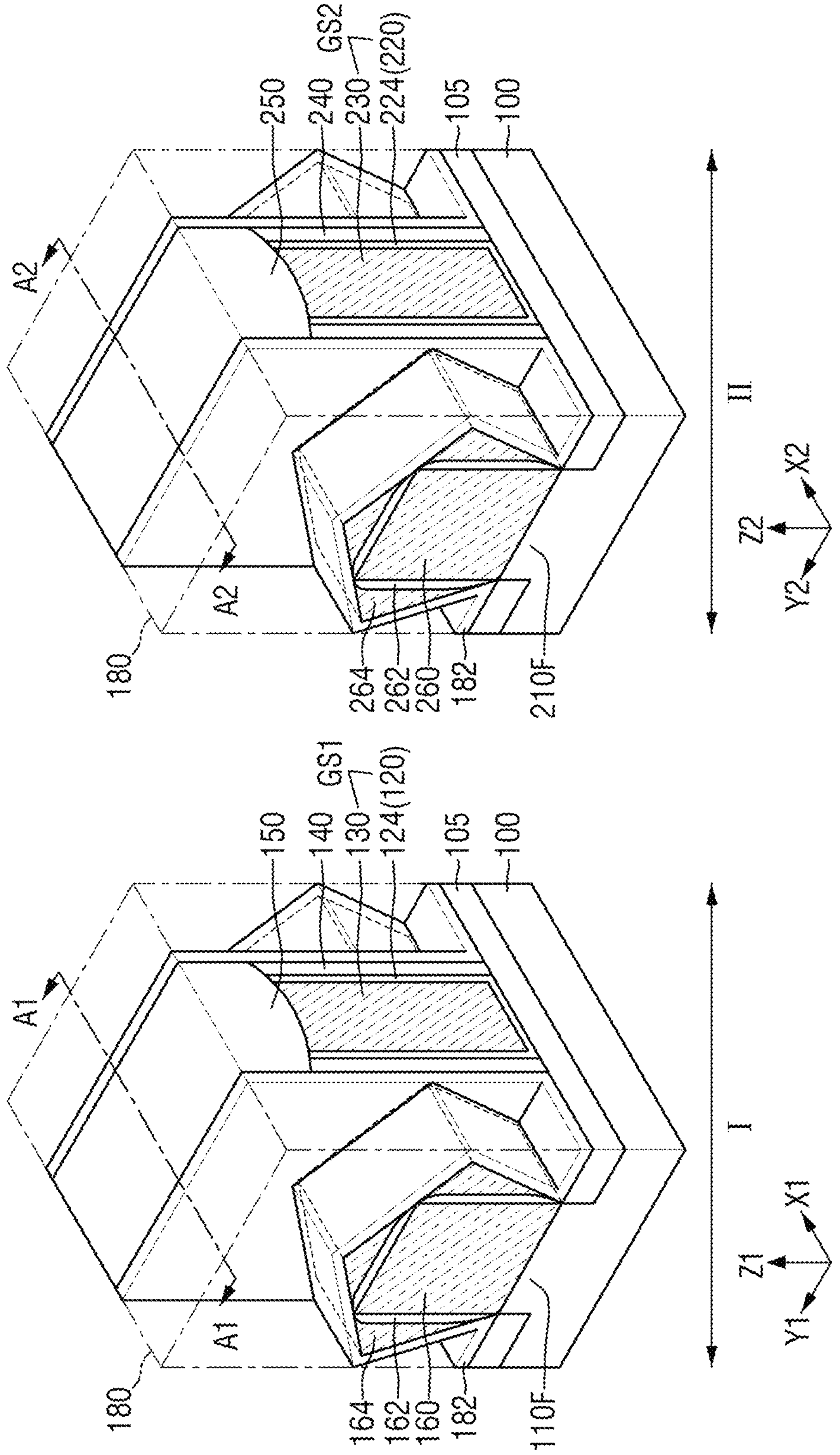
Figure 26:
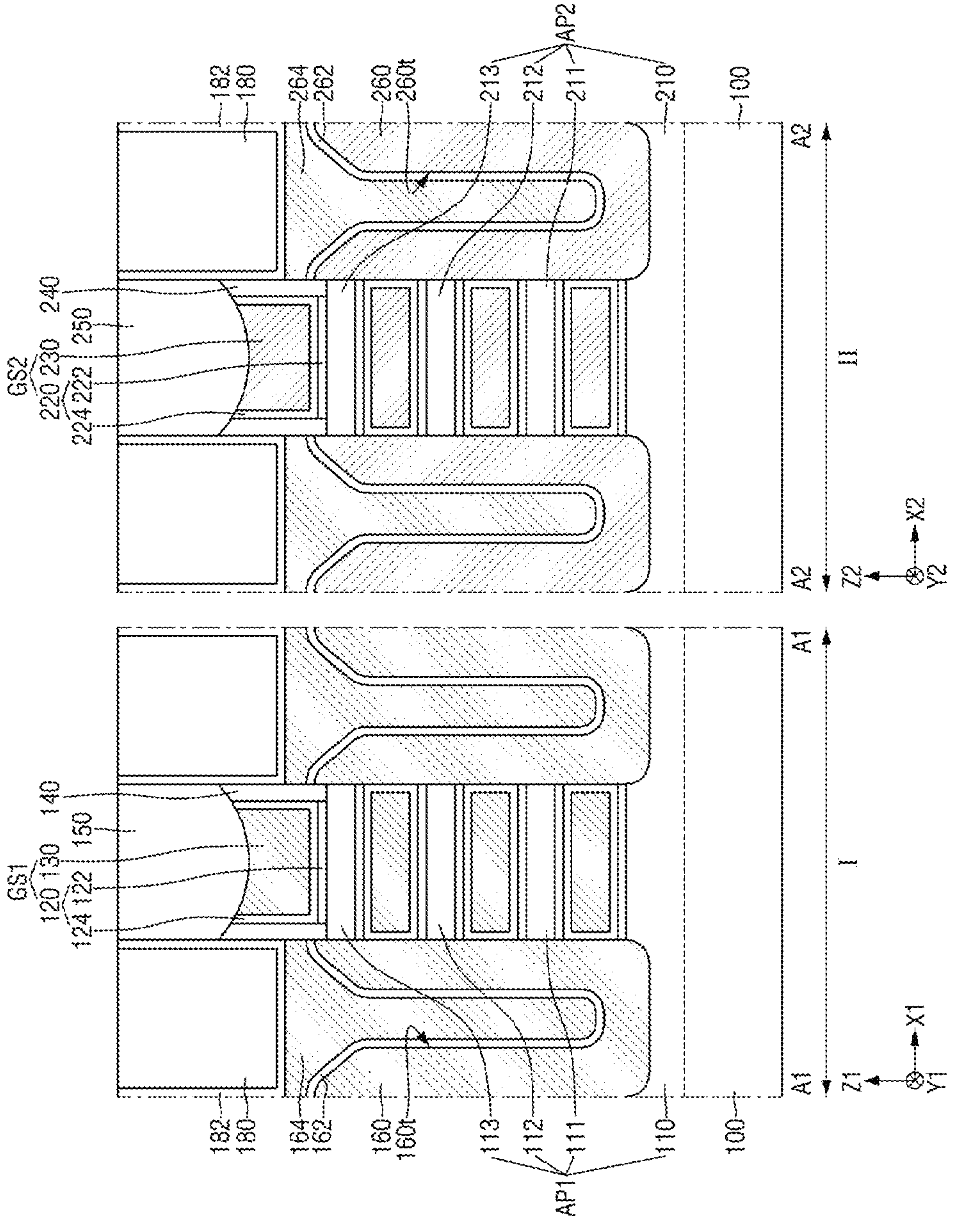

Referring to FIGS. 25 and 26, the first gate structure GS1 and the second gate structure GS2 are formed. For reference, FIG. 26 is a cross-sectional view taken along A1-A1 and A2-A2 of FIG. 25.

For example, the first gate dielectric film 120 and the first gate electrode 130 may be sequentially stacked on the first active pattern AP1, and the second gate dielectric film 220 and the second gate electrode 230 may be sequentially stacked on the second active pattern AP2. Subsequently, the first gate capping pattern 150 may be formed on the first gate electrode 130, and the second gate capping pattern 250 may be formed on the second gate electrode 230. In some example embodiments, the first gate capping pattern 150 and the second gate capping pattern 250 may be formed after an etch-back process on the first gate electrode 130 and the second gate electrode 230 is performed.

Figure 27:
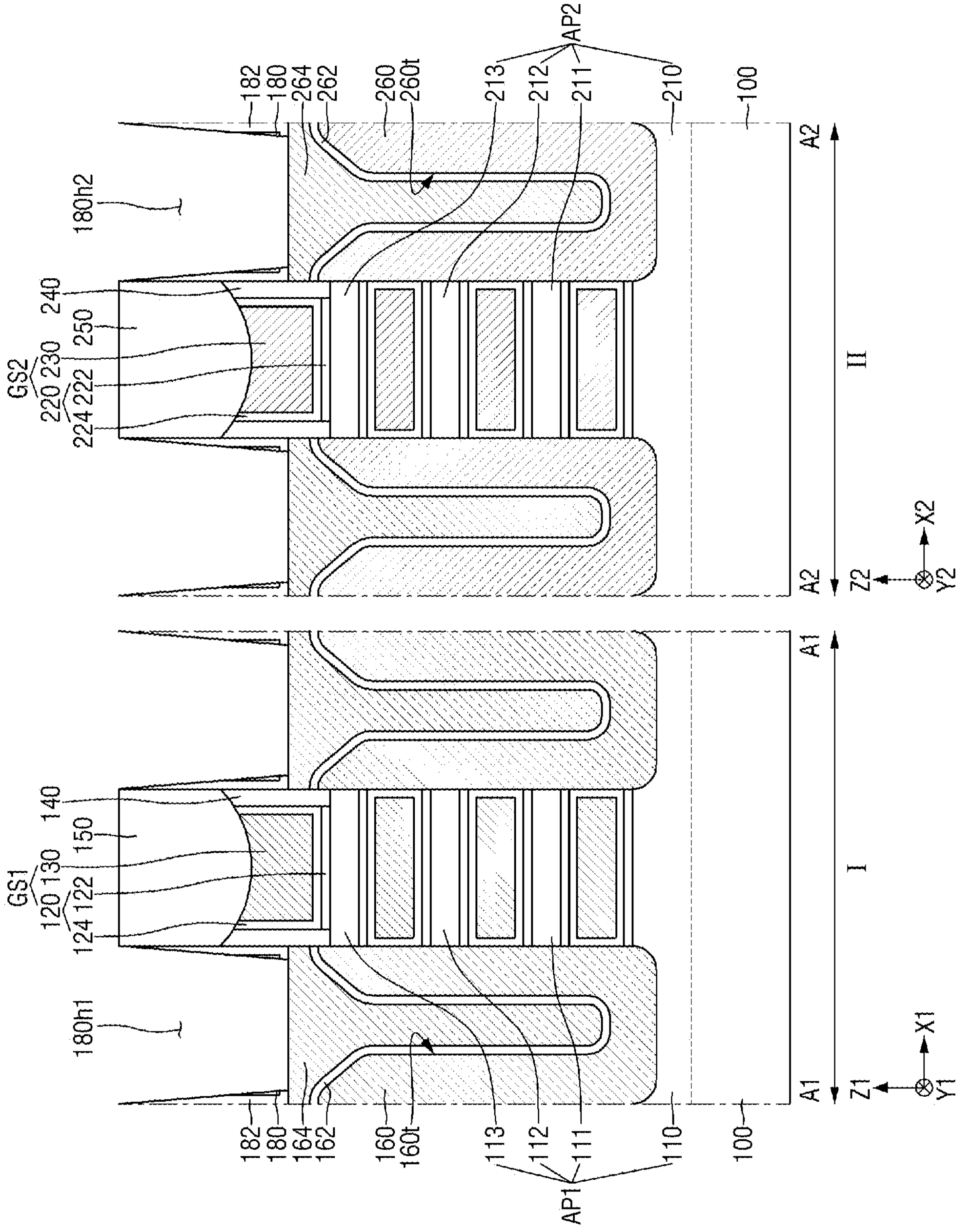

Referring to FIG. 27, a first contact hole 180*h*1 and a second contact hole 180*h*2 are formed inside the interlayer insulating film 180.

The first contact hole 180*h*1 may extend in the third direction Z1 and penetrate the interlayer insulating film 180. Also, the first contact hole 180*h*1 may penetrate the first liner film 182 and expose the first sacrificial epitaxial pattern 164. The second contact hole 180*h*2 may extend in the sixth direction Z2 and penetrate the interlayer insulating film 180. Also, the second contact hole 180*h*2 may penetrate the first liner film 182 and expose the second sacrificial epitaxial pattern 264.

Figure 28:
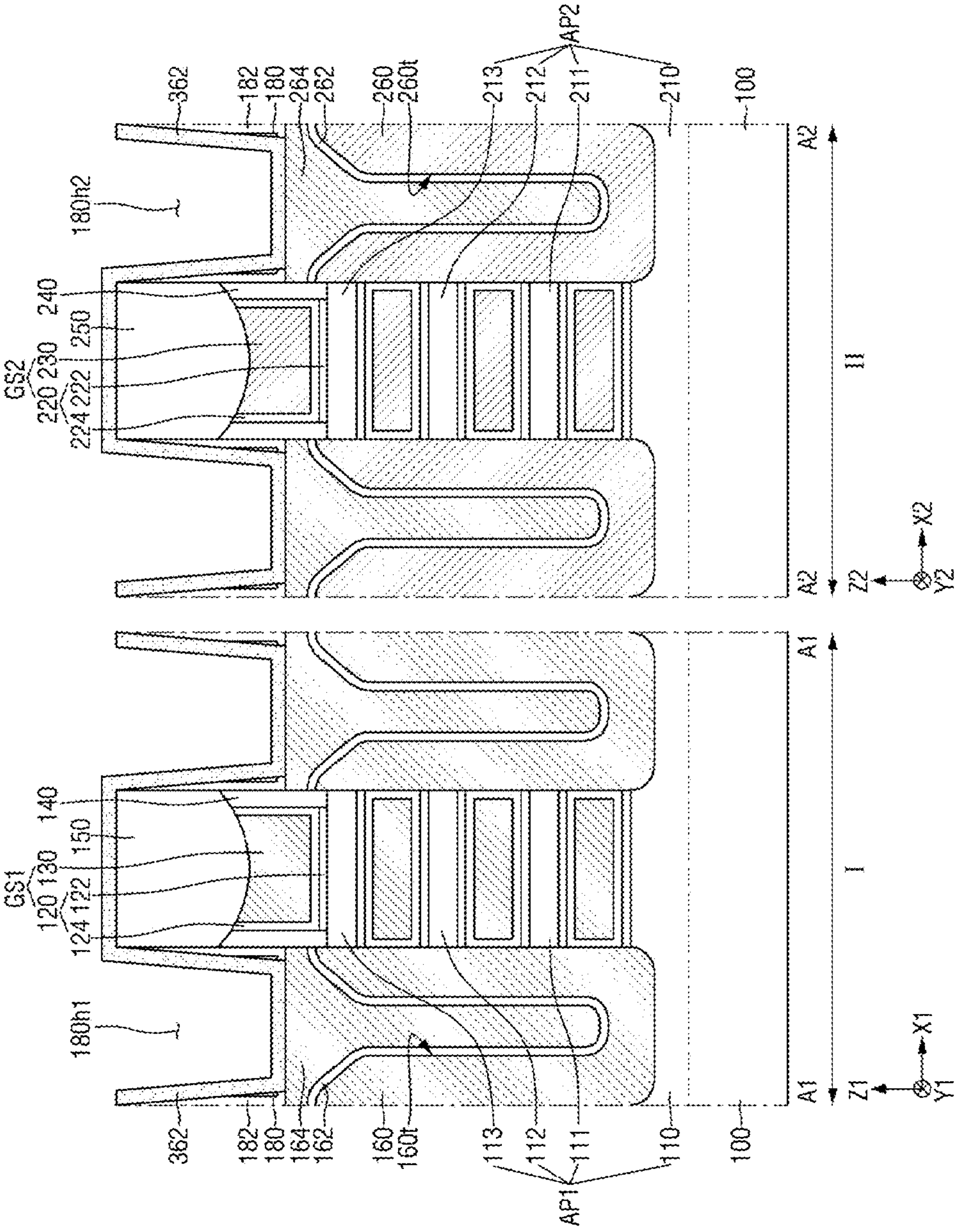

Referring to FIG. 28, a first sacrificial blocking film 362 is formed.

The first sacrificial blocking film 362 may cover the first sacrificial epitaxial pattern 164 and the second sacrificial epitaxial pattern 264. For example, the first sacrificial blocking film 362 may conformally extend along the profiles of the first contact hole **180*h*1 and the second contact hole 180*h*2. The first sacrificial blocking film 362** may include, for example, but is not limited to, silicon nitride.

Figure 29:
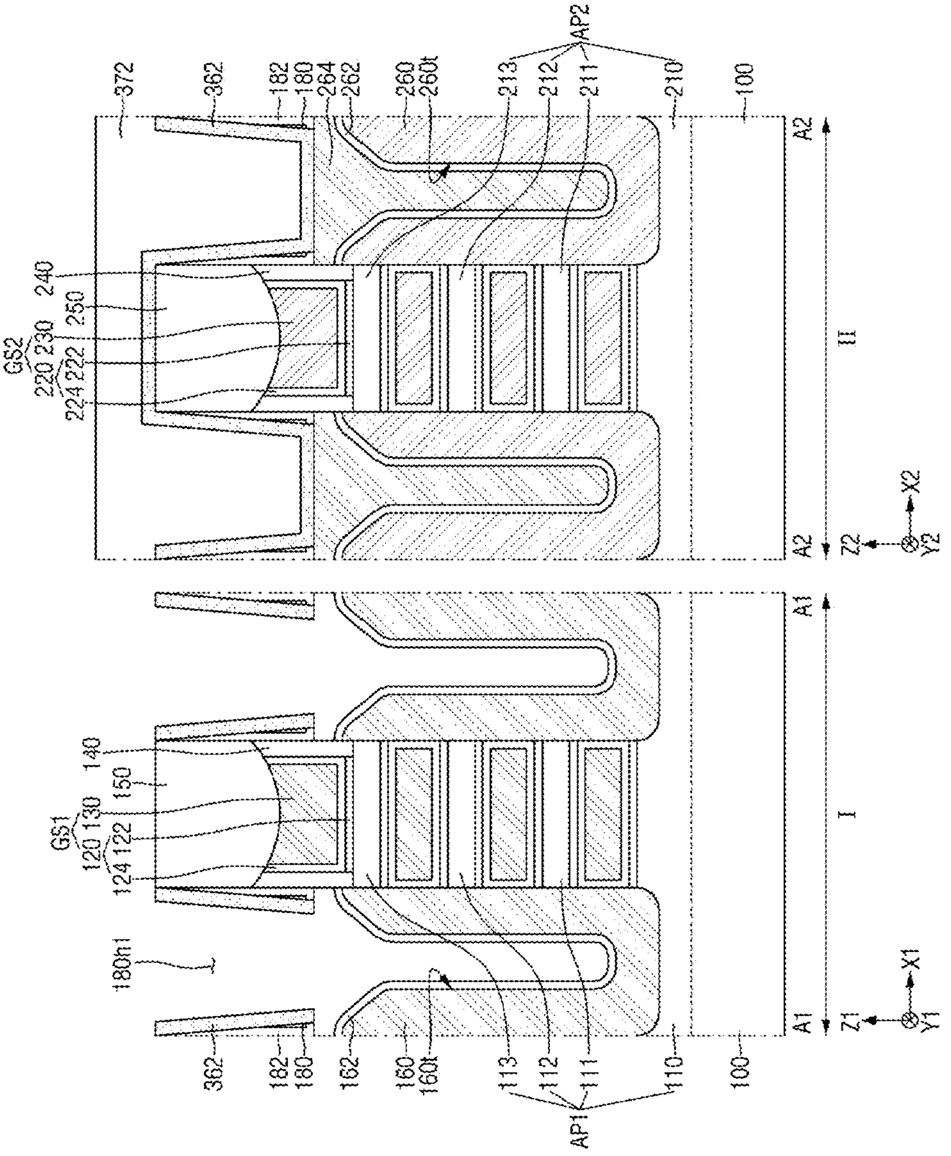

Referring to FIG. 29, the first sacrificial epitaxial pattern 164 is removed.

For example, a first mask film 372 which exposes the first sacrificial blocking film 362 on the first region I and covers the first sacrificial blocking film 362 on the second region II may be formed. That is, the first mask film 372 may open the first region I. The first mask film 372 may include, for example, but is not limited to, a spin-on hard mask (SON).

Subsequently, an etching process of penetrating the first sacrificial blocking film 362 on the first region I and removing the first sacrificial epitaxial pattern 164 may be performed. As mentioned above, since the first sacrificial epitaxial pattern 164 may have an etch selectivity with respect to the first blocking film 162, the first sacrificial epitaxial pattern 164 may be selectively removed. The etching process may include, for example, but is not limited to, a dry etching process or a wet etching process.

Figure 30:
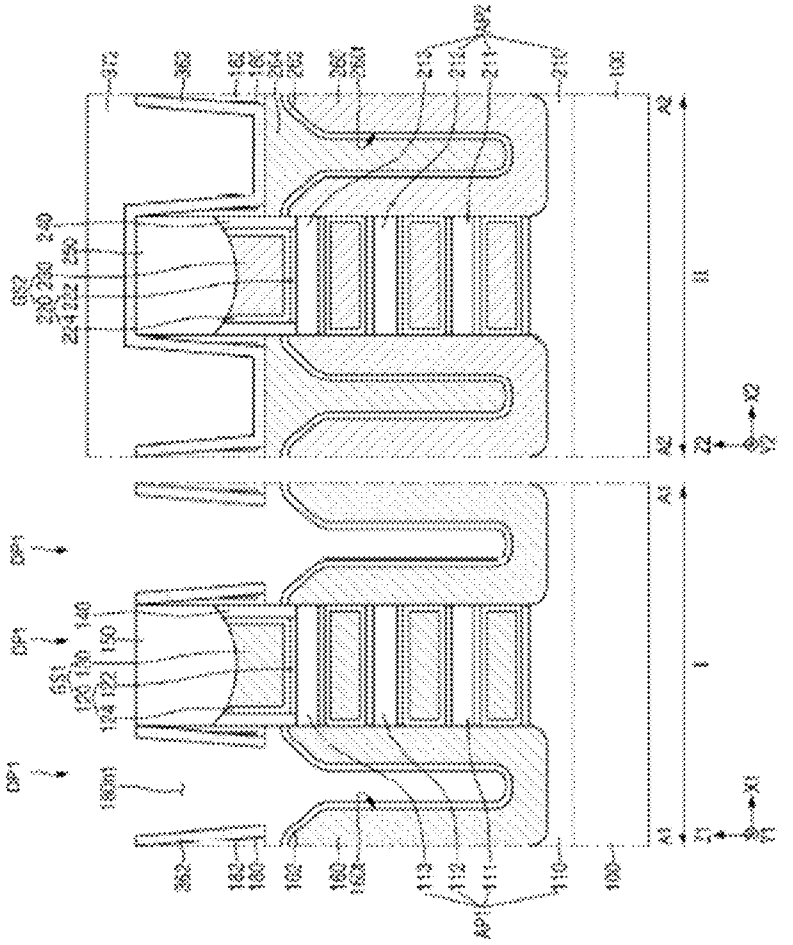

Referring to FIG. 30, a first doping process DP1 is performed on the first epitaxial pattern 160 and/or the first blocking film 162.

The first doping process DP1 may dope the first impurity (e.g., boron (B), indium (In), gallium (Ga) and/or aluminum (Al)) into the first epitaxial pattern 160 and/or the first blocking film 162. The first doping process DP1 may include, for example, but is not limited to, plasma doping (PLAD). As the first doping process DP1 is performed on the upper surface of the first blocking film 162, the concentration of the first impurity of the first epitaxial pattern 160 may decrease, as it goes away from the first blocking film 162.

Figure 31:
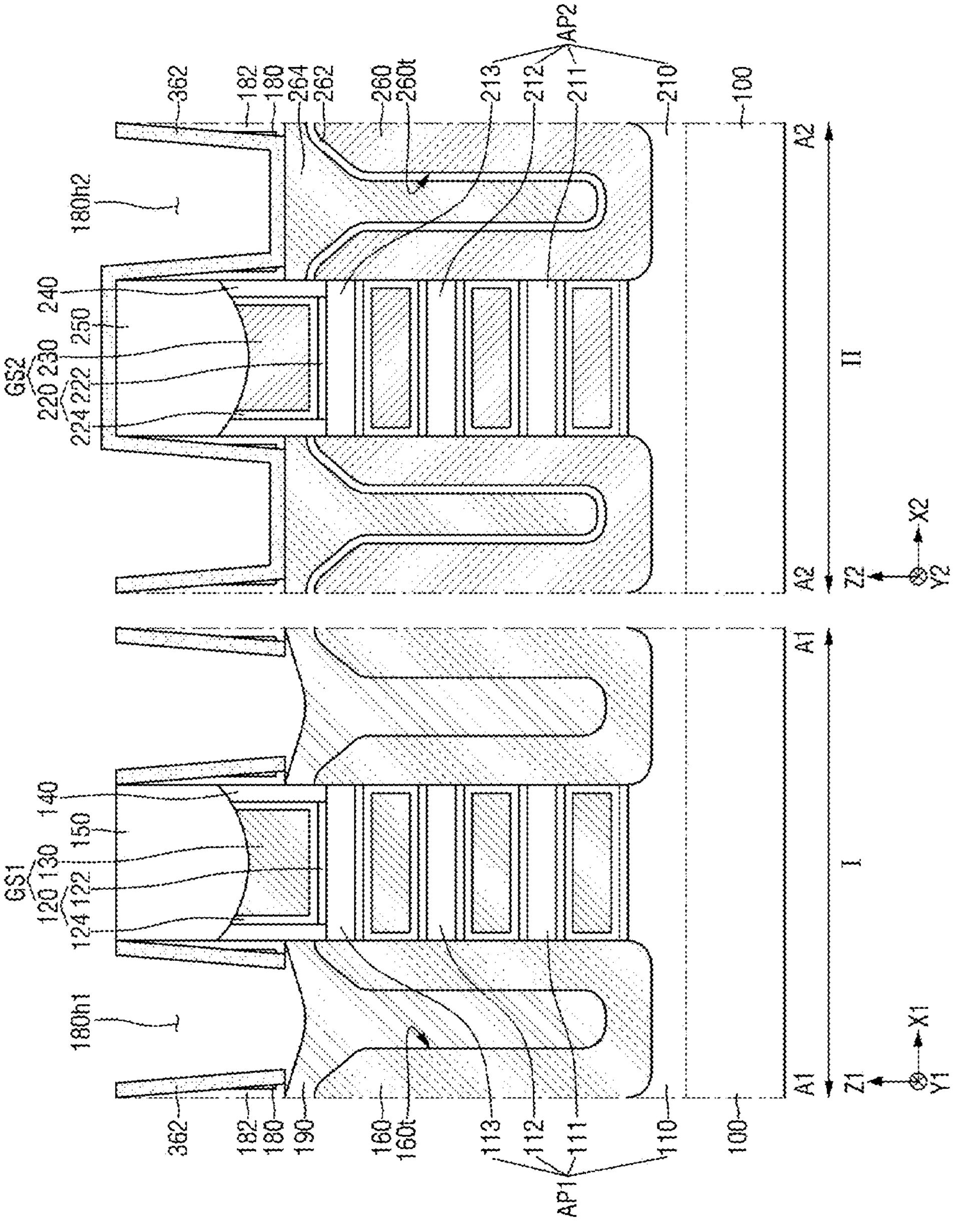

Referring to FIG. 31, the first silicide pattern 190 is formed on the first epitaxial pattern 160.

For example, the first mask film 372 may be removed. Next, the first silicide pattern 190 that fills at least a part of the region in which the first sacrificial epitaxial pattern 164 is removed may be formed. Since the second sacrificial epitaxial pattern 264 is protected by the first sacrificial blocking film 362, the first silicide pattern 190 may be selectively formed on the first blocking film 162. The first silicide pattern 190 may fill at least a part of the first epitaxial trench **160*t*. In some example embodiments, the first silicide pattern 190 may completely fill the first epitaxial trench 160*t* of the first epitaxial pattern 160**.

The first silicide pattern 190 may be formed through various silicide processes.

In some example embodiments, a metal film may be formed on the first blocking film 162, and elements included in the metal film may react with the first blocking film 162 and/or the first epitaxial pattern 160 to form the first silicide pattern 190. Although FIG. 31 only shows that the first blocking film 162 is converted into silicidation as a whole and the first epitaxial pattern 160 is not converted into silicidation, this is merely an example. As another example, not only the first blocking film 162 but also the upper part of the first epitaxial pattern 160 may be converted into silicidation. In such a case, the size of the first epitaxial pattern 160 may be made smaller than the size of the first active pattern AP1, as explained above in the description of FIGS. 9 and 10. As another example, only a part of the first blocking film 162 may be converted into silicidation. In such a case, the first blocking film 162 may be interposed between the first epitaxial pattern 160 and the first silicide pattern 190, as explained above in the description of FIGS. 11 and 12.

In some example embodiments, the first silicide pattern 190 may be formed by a chemical vapor deposition that uses metal elements. In some example embodiments, the first silicide pattern 190 may be formed on the first blocking film 162. Accordingly, the first blocking film 162 may be interposed between the first epitaxial pattern 160 and the first silicide pattern 190, as explained above in the description of FIGS. 11 and 12.

Figure 32:
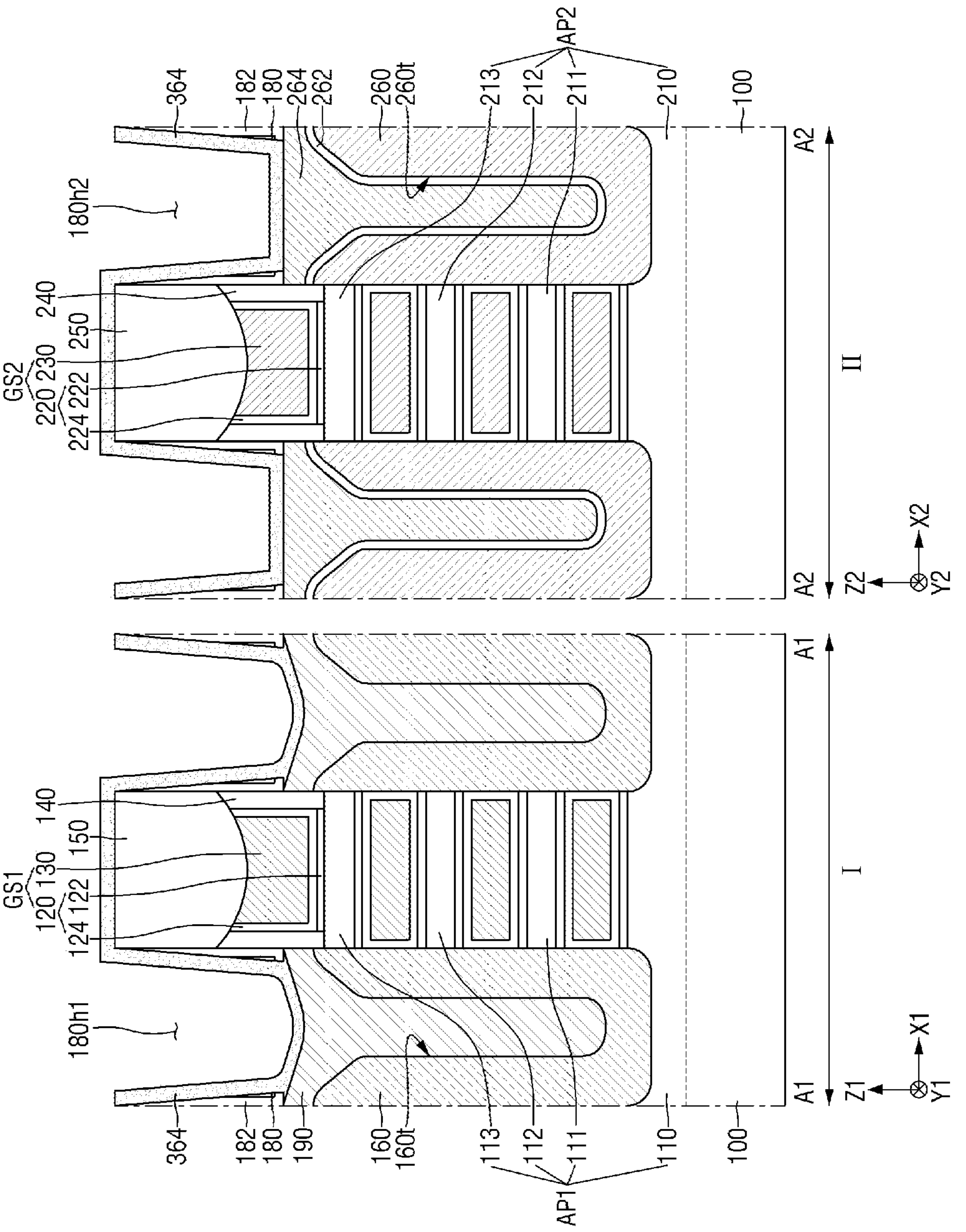

Referring to FIG. 32, the first sacrificial blocking film 362 is removed, and the second sacrificial blocking film 364 is formed.

The second sacrificial blocking film 364 may cover the first silicide pattern 190. For example, the second sacrificial blocking film 364 may conformally extend along the profile of the upper surface of the first silicide pattern 190. The second sacrificial blocking film 364 may include, for example, but is not limited to, silicon nitride.

Figure 33:
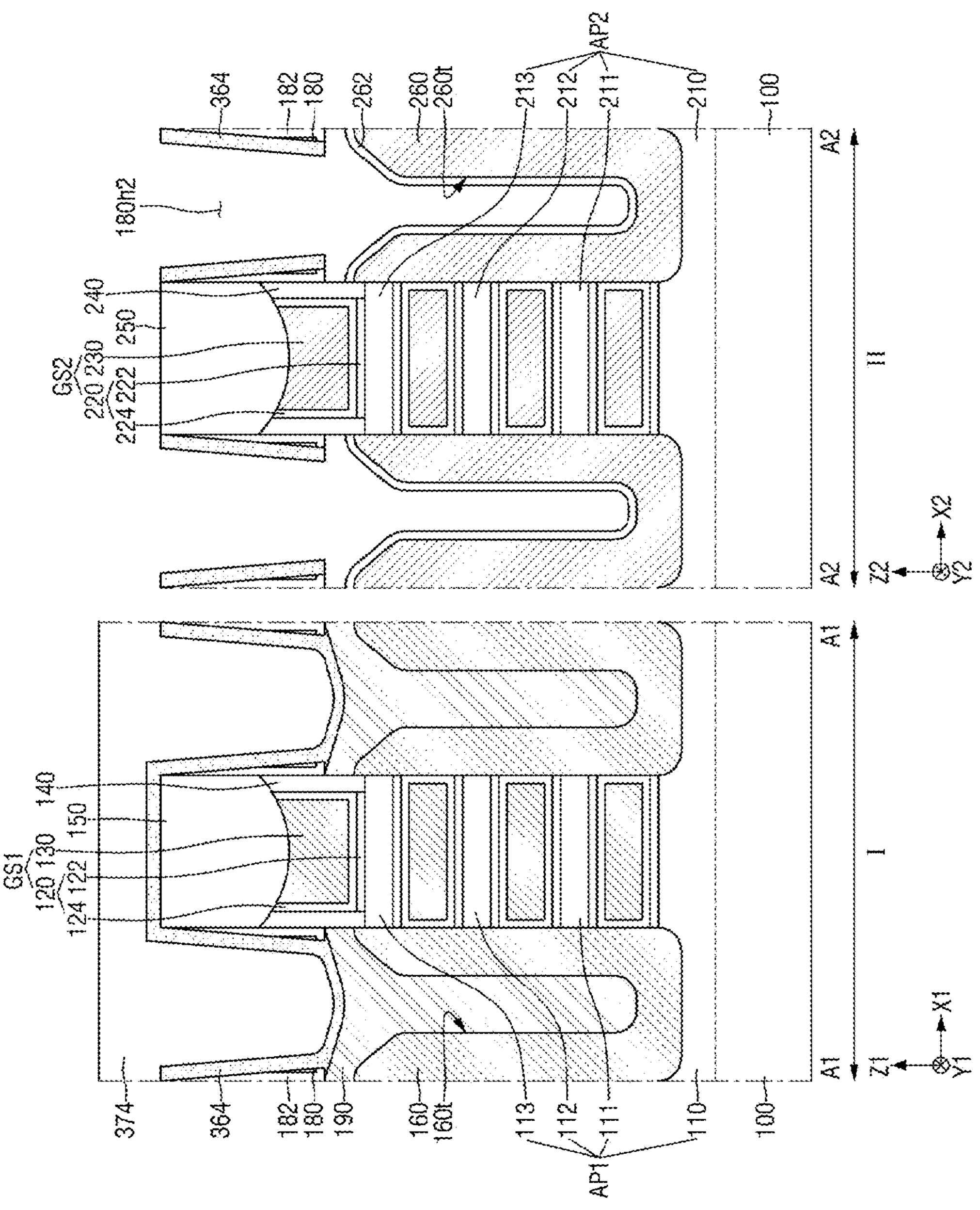

Referring to FIG. 33, the second sacrificial epitaxial pattern 264 is removed.

For example, a second mask film 374 that exposes the second sacrificial blocking film 364 on the second region II and covers the second sacrificial blocking film 364 on the first region I may be formed. That is, the second mask film 374 may open the second region II. The second mask film 374 may include, for example, but is not limited to, a spin-on hard mask (SON).

Subsequently, an etching process of penetrating the second sacrificial blocking film 364 on the second region II and removing the second sacrificial epitaxial pattern 264 may be performed. As explained above, since the second sacrificial epitaxial pattern 264 may have an etch selectivity with respect to the second blocking film 262, the second sacrificial epitaxial pattern 264 may be selectively removed. The etching process may include, for example, but is not limited to, a dry etching process or a wet etching process.

Figure 34:
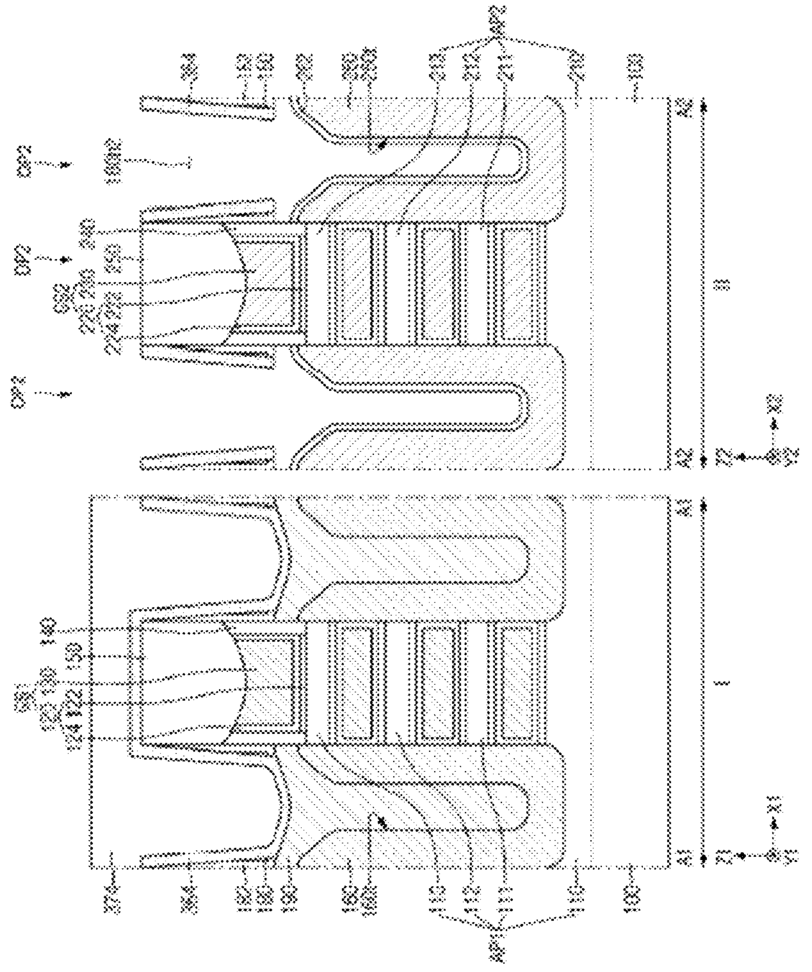

Referring to FIG. 34, a second doping process DP2 is performed on the second epitaxial pattern 260 and/or the second blocking film 262.

The second doping process DP2 may dope the second impurity (e.g., phosphorus (P), arsenic (As) and/or antimony (Sb)) into the second epitaxial pattern 260 and/or the second blocking film 262. The second doping process DP2 may include, for example, but is not limited to, plasma doping (PLAD). As the second doping process DP2 is performed on the upper surface of the second blocking film 262, the concentration of the second impurity of the second epitaxial pattern 260 may decrease, as it goes away from the second blocking film 262.

Figure 35:
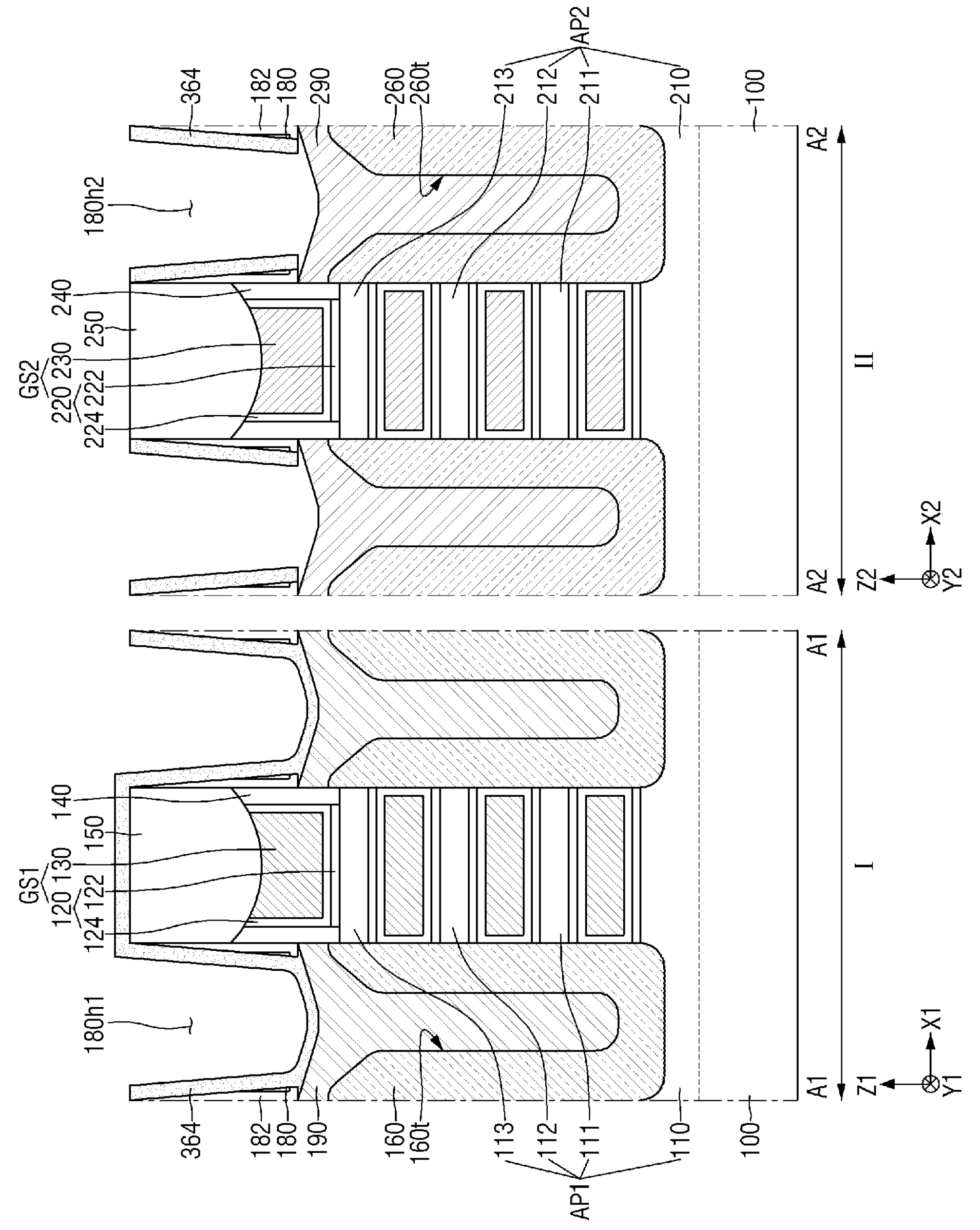

Referring to FIG. 35, the second silicide pattern 290 is formed on the second epitaxial pattern 260.

For example, the second mask film 374 may be removed. Next, the second silicide pattern 290 that fills at least a part of the region in which the second sacrificial epitaxial pattern 264 is removed may be formed. Since the first silicide pattern 190 is protected by the second sacrificial blocking film 364, the second silicide pattern 290 may be selectively formed on the second blocking film 262. The second silicide pattern 290 may fill at least a part of the second epitaxial trench **260*t*. In some example embodiments, the second silicide pattern 290 may completely fill the second epitaxial trench 260*t* of the second epitaxial pattern 260**.

The second silicide pattern 290 may be formed through various silicide processes.

In some example embodiments, a metal film may be formed on the second blocking film 262, and elements included in the metal film may react with the second blocking film 262 and/or the second epitaxial pattern 260 to form the second silicide pattern 290. Although FIG. 35 only shows that the second blocking film 262 is converted into silicidation as a whole and the second epitaxial pattern 260 is not converted into silicidation, this is merely an example. As another example, not only the second blocking film 262 but also the upper part of the second epitaxial pattern 260 may be converted into silicidation. In this case, the size of the second epitaxial pattern 260 may be made smaller than the size of the second active pattern AP2, as explained above in the description of FIGS. 9 and 10. As yet another example, only a part of the second block film 262 may be converted into silicidation. In this case, the second blocking film 262 may be interposed between the second epitaxial pattern 260 and the second silicide pattern 290, as explained above in the description of FIGS. 11 and 12.

In some example embodiments, the second silicide pattern 290 may be formed by a chemical vapor deposition method that uses metal elements. In some example embodiments, the second silicide pattern 290 may be formed on the second blocking film 262. Accordingly, the second blocking film 262 may be interposed between the second epitaxial pattern 260 and the second silicide pattern 290, as explained above in the description of FIGS. 11 and 12.

Figure 36:
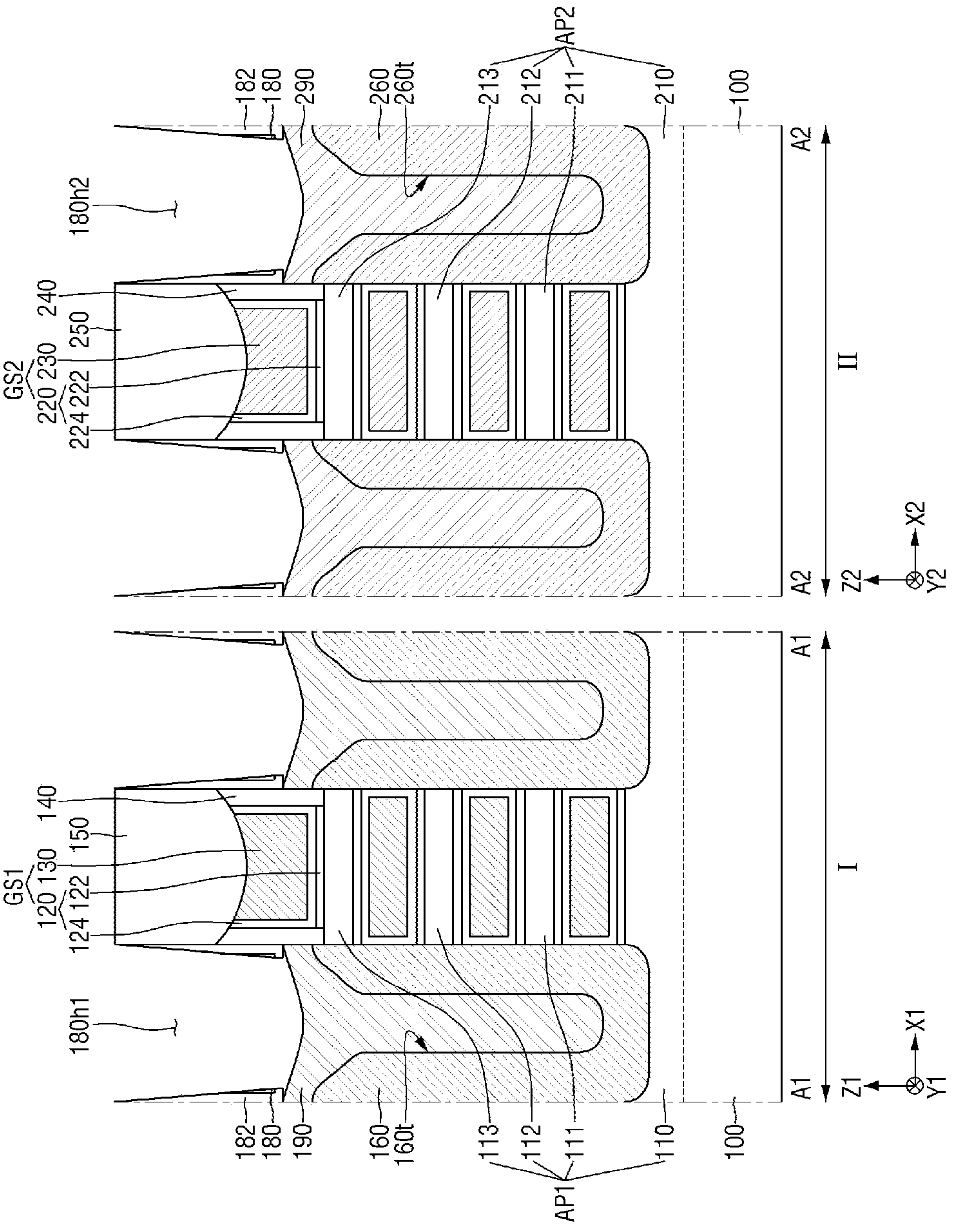

Referring to FIG. 36, the second sacrificial blocking film 364 is removed.

As the second sacrificial blocking film 364 is removed, the first silicide pattern 190 may be exposed by the first contact hole 180*h*1. Also, as the second sacrificial blocking film 364 is removed, the second silicide pattern 290 may be exposed by the second contact hole 180*h*2.

Next, referring to FIGS. 1 and 2, the first source/drain contact CA1 is formed in the first contact hole 180*h*1, and the second source/drain contact CA2 is formed in the second contact hole 180*h*2. Accordingly, the first source/drain contact CA1 connected to the first silicide pattern 190 and the second source/drain contact CA2 connected to the second silicide pattern 290 may be formed.

In some example embodiments, the first silicide pattern 190 may not completely fill the region in which the first sacrificial epitaxial pattern 164 is removed. In such a case, a part of the first source/drain contact CA1 may be interposed between the first silicide pattern 190 and the first liner film 182, as explained above in the description of FIGS. 13 and 14.

In some example embodiments, the second silicide pattern 290 may not completely fill the region in which the second sacrificial epitaxial pattern 264 is removed. In such a case, a part of the second source/drain contact CA2 may be interposed between the second silicide pattern 290 and the first liner film 182, as explained above in the description of FIGS. 13 and 14.

In concluding the detailed description, those skilled in the art will appreciate that many variations and modifications may be made to the disclosed example embodiments without substantially departing from the principles of the present inventive concept. Therefore, the disclosed example embodiments of the inventive concepts are used in a generic and descriptive sense only and not for purposes of limitation.

What is claimed is:

1. A semiconductor device comprising:

a substrate including a first region and a second region;

a plurality of first bridge patterns sequentially stacked on the first region and spaced apart from each other, the plurality of first bridge patterns extending in a first direction;

a first gate structure extending in a second direction intersecting the first direction, the plurality of first bridge patterns penetrating through the first gate structure;

a first epitaxial pattern connected to the plurality of first bridge patterns and on a side surface of the first gate structure, the first epitaxial pattern including a first impurity having a first conductivity type, the first epitaxial pattern comprising a first epitaxial trench, the first epitaxial trench overlapping the plurality of first bridge patterns in the first direction;

a first silicide pattern on the first epitaxial pattern and overlapping the plurality of first bridge patterns in the first direction, the first silicide pattern completely filling the first epitaxial trench;

a plurality of second bridge patterns sequentially stacked on the second region, and spaced apart from each other, the plurality of second bridge patterns extending in a third direction;

a second gate structure extending in a fourth direction intersecting the third direction, the plurality of second bridge patterns penetrating through the second gate structure;

a second epitaxial pattern connected to the plurality of second bridge patterns and on a side surface of the second gate structure, the second epitaxial pattern including a second impurity having a second conductivity type different from the first conductivity type, the second epitaxial pattern comprising a second epitaxial trench, the second epitaxial trench overlapping the plurality of second bridge patterns in the third direction; and a second silicide pattern on the second epitaxial pattern and overlapping the plurality of second bridge patterns in the third direction, the second silicide pattern completely filling the second epitaxial trench, wherein the first silicide pattern and the second silicide pattern have stress properties different from each other.

2. The semiconductor device of claim 1, wherein the first conductivity type is a p-type, the second conductivity type is an n-type, and the second silicide pattern has greater tensile stress properties than the first silicide pattern.

3. The semiconductor device of claim 1, wherein the first silicide pattern has compressive stress properties, and the second silicide pattern has tensile stress properties.

4. The semiconductor device of claim 1, wherein the first epitaxial trench extends in the second direction, and the second epitaxial trench extends in the fourth direction.

5. The semiconductor device of claim 1, wherein the first silicide pattern covers an upper surface of the first epitaxial pattern, and the second silicide pattern covers an upper surface of the second epitaxial pattern.

6. The semiconductor device of claim 1, further comprising:

a blocking film interposed in at least one of between the first epitaxial pattern and the first silicide pattern and between the second epitaxial pattern and the second silicide pattern.

7. The semiconductor device of claim 6, wherein the blocking film comprises silicon (Si).

8. The semiconductor device of claim 1, further comprising:

a first source/drain contact on the first silicide pattern and connected to an upper surface of the first silicide pattern; and a second source/drain contact on the second silicide pattern and connected to an upper surface of the second silicide pattern.

9. The semiconductor device of claim 1, wherein a concentration of the first impurity decreases as a distance from the first silicide pattern increases, and a concentration of the second impurity decreases as a distance from the second silicide pattern increases.

10. A semiconductor device comprising:

a substrate including a first region and a second region;

a plurality of first bridge patterns sequentially stacked on the first region and spaced apart from each other, the plurality of first bridge patterns extending in a first direction;

a first gate structure extending in a second direction intersecting the first direction, the plurality of first bridge patterns penetrating through the first gate structure;

a first epitaxial pattern connected to the plurality of first bridge patterns and on a side surface of the first gate structure, the first epitaxial pattern including a first impurity having a first conductivity type;

a first silicide pattern surrounding the first epitaxial pattern;

a plurality of second bridge patterns sequentially stacked on the second region and spaced apart from each other, the plurality of second bridge patterns extending in a third direction;

a second gate structure extending in a fourth direction intersecting the third direction, the plurality of second bridge patterns penetrating through the second gate structure;

a second epitaxial pattern connected to the plurality of second bridge patterns and on a side surface of the second gate structure, the second epitaxial pattern including a second impurity having a second conductivity type different from the first conductivity type; and a second silicide pattern surrounding the second epitaxial pattern, wherein the first epitaxial pattern includes a first epitaxial trench overlapping the plurality of first bridge patterns in the first direction, the first silicide pattern completely fills the first epitaxial trench, the second epitaxial pattern includes a second epitaxial trench overlapping the plurality of second bridge patterns in the third direction, the second silicide pattern completely fills the second epitaxial trench, and the first silicide pattern and the second silicide pattern have stress properties different from each other.

11. The semiconductor device of claim 10, wherein the first conductivity type is a p-type, the second conductivity type is an n-type, and the second silicide pattern has greater tensile stress properties than the first silicide pattern.

12. The semiconductor device of claim 10, wherein the first epitaxial trench extends in the second direction, and the second epitaxial trench extends in the fourth direction.

13. The semiconductor device of claim 10, further comprising:

a first source/drain contact on the first silicide pattern and connected to an upper surface of the first silicide pattern; and a second source/drain contact on the second silicide pattern and connected to an upper surface of the second silicide pattern.

14. The semiconductor device of claim 10, wherein a concentration of the first impurity decreases as a distance from the first silicide pattern increases, and a concentration of the second impurity decreases as a distance from the second silicide pattern increases.

15. A semiconductor device comprising:

a substrate including a p-type field effect transistor (PFET) region and an n-type field effect transistor (NFET) region;

a plurality of first bridge patterns sequentially stacked on the PFET region and spaced apart from each other, the plurality of first bridge patterns extending in a first direction;

a first gate structure extending in a second direction intersecting the first direction, the plurality of first bridge patterns penetrating the first gate structure;

a first epitaxial pattern connected to the plurality of first bridge patterns and on a side surface of the first gate structure, the first epitaxial pattern including a p-type impurity, the first epitaxial pattern comprising a first epitaxial trench, the first epitaxial trench overlapping the plurality of first bridge patterns in the first direction;

a first silicide pattern on the first epitaxial pattern and overlapping the plurality of first bridge patterns in the first direction, the first silicide pattern completely filling the first epitaxial trench;

a plurality of second bridge patterns sequentially stacked on the NFET region and spaced apart from each other, the plurality of second bridge patterns extending in a third direction;

a second gate structure extending in a fourth direction intersecting the third direction, the plurality of second bridge patterns penetrating the second gate structure;

a second epitaxial pattern connected to the plurality of second bridge patterns and on a side surface of the second gate structure, the second epitaxial pattern including an n-type impurity, the second epitaxial pattern comprising a second epitaxial trench, the second epitaxial trench overlapping the plurality of second bridge patterns in the third direction; and a second silicide pattern on the second epitaxial pattern and overlapping the plurality of second bridge patterns in the third direction, the second silicide pattern completely filling the second epitaxial trench wherein the second silicide pattern has greater tensile stress properties than the first silicide pattern, a concentration of the p-type impurity of the first epitaxial pattern decreases as a distance from the first silicide pattern increases, and a concentration of the n-type impurity of the second epitaxial pattern decreases as a distance from the second silicide pattern increases.

16. The semiconductor device of claim 15, wherein the first epitaxial pattern comprises a silicon germanium (SiGe) pattern, and the second epitaxial pattern comprises a silicon (Si) pattern.

17. The semiconductor device of claim 15, wherein the p-type impurity comprises at least one of boron (B), indium (In), gallium (Ga), and aluminum (Al), and the n-type impurity comprises at least one of phosphorus (P), arsenic (As), and antimony (Sb).

18. The semiconductor device of claim 15, wherein the first silicide pattern comprises at least one of nickel silicide (NiSi) and molybdenum silicide ($MoSi_2$), and the second silicide pattern comprises at least one of titanium silicide ($TiSi_2$) and cobalt silicide ($CoSi_2$).

19. The semiconductor device of claim 15, wherein the substrate comprises a first side and a second side opposite to the first side, the first side including the plurality of first bridge patterns and the plurality of second bridge patterns thereon, and the semiconductor device further comprises a through contact penetrating the substrate and electrically connected to the first epitaxial pattern or the second epitaxial pattern, and a back wiring structure electrically connected to the through contact, on the second side.

* * * * *